United States Patent
Nakanotani et al.

(10) Patent No.: US 9,343,690 B2
(45) Date of Patent: May 17, 2016

(54) METHOD FOR PRODUCING ORGANIC ELECTROLUMINESCENCE ELEMENT, AND ORGANIC ELECTROLUMINESCENCE ELEMENT

(71) Applicants: Hajime Nakanotani, Kanagawa (JP); Satoshi Yamamoto, Kanagawa (JP); Daisuke Goto, Fukuoka (JP); Satoshi Miyagawa, Kanagawa (JP); Takuji Kato, Kanagawa (JP); Masataka Mohri, Fukuoka (JP)

(72) Inventors: Hajime Nakanotani, Kanagawa (JP); Satoshi Yamamoto, Kanagawa (JP); Daisuke Goto, Fukuoka (JP); Satoshi Miyagawa, Kanagawa (JP); Takuji Kato, Kanagawa (JP); Masataka Mohri, Fukuoka (JP)

(73) Assignee: Ricoh Company, Ltd., Tokyo (JP)

( * ) Notice: Subject to any disclaimer, the term of this patent is extended or adjusted under 35 U.S.C. 154(b) by 722 days.

(21) Appl. No.: 13/681,772

(22) Filed: Nov. 20, 2012

(65) Prior Publication Data
US 2013/0134360 A1 May 30, 2013

(30) Foreign Application Priority Data

Nov. 28, 2011 (JP) .................................. 2011-258574
Sep. 4, 2012 (JP) .................................. 2012-194151

(51) Int. Cl.
*H01L 51/56* (2006.01)
*H01L 51/50* (2006.01)
*H01L 51/00* (2006.01)

(52) U.S. Cl.
CPC ........ *H01L 51/5012* (2013.01); *H01L 51/0026* (2013.01); *H01L 51/5016* (2013.01);
(Continued)

(58) Field of Classification Search
USPC ........................................................ 428/690
See application file for complete search history.

(56) References Cited

U.S. PATENT DOCUMENTS

| 7,816,674 B2 | 10/2010 | Kato et al. |
| 2009/0174311 A1* | 7/2009 | Patel .................. H01L 51/0003 313/504 |
| 2009/0230386 A1 | 9/2009 | Yamamoto et al. |
| 2010/0219405 A1 | 9/2010 | Sagisaka et al. |

(Continued)

FOREIGN PATENT DOCUMENTS

| JP | 2000-068057 | 3/2000 |
| JP | 3900724 | 1/2007 |

(Continued)

OTHER PUBLICATIONS

Yuichiro Kawamura et al. "100% phosphorescence quantum efficiency of Ir (III) complexes in organic semiconductor films" Applied Physics Letters. 86, 071104 (2005), pp. 1-3.

(Continued)

*Primary Examiner* — Vu A Nguyen
(74) *Attorney, Agent, or Firm* — Oblon, McClelland, Maier & Neustadt, L.L.P.

(57) ABSTRACT

A method for producing a luminescent organic film, the method including: coating a solution containing a π-electron conjugated compound precursor A-(B)m and at least one kind of a luminescent dye, where the π-electron conjugated compound precursor A-(B)m contains a leaving substituent; and applying external stimulus to the π-electron conjugated compound precursor A-(B)m to eliminate the leaving substituent thereof, so that the π-electron conjugated compound precursor A-(B)m is converted to a π-electron conjugated compound A-(C)m and an eliminated compound X—Y as in the following reaction formula (I):

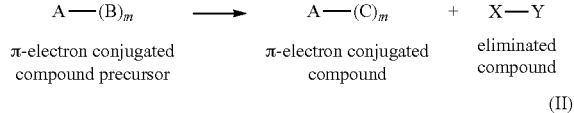

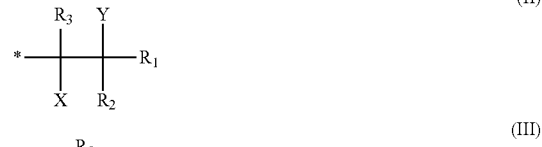

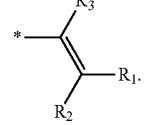

6 Claims, 8 Drawing Sheets

(52) U.S. Cl.
CPC ............ *H01L51/56* (2013.01); *H01L 51/0059* (2013.01); *H01L 51/0072* (2013.01); *H01L 51/0074* (2013.01); *H01L 51/0085* (2013.01)

(56) References Cited

U.S. PATENT DOCUMENTS

| | | |
|---|---|---|
| 2011/0040107 A1 | 2/2011 | Goto et al. |
| 2012/0119195 A1 | 5/2012 | Sagisaka et al. |
| 2012/0153271 A1 | 6/2012 | Goto et al. |

FOREIGN PATENT DOCUMENTS

| | | | |
|---|---|---|---|
| JP | 2007-305783 | 11/2007 | |
| JP | 2009-084555 | 4/2009 | |
| JP | 2009-215547 | 9/2009 | |
| JP | 2010-034484 | 2/2010 | |
| JP | 2010-077054 | 4/2010 | |
| JP | WO 2011030918 A1 * | 3/2011 | ............ C07C 1/213 |
| JP | 2011-071501 | 4/2011 | |
| WO | WO 2011/030918 A1 | 3/2011 | |

OTHER PUBLICATIONS

Combined Office Action and Search Report issued Jan. 26, 2015 in Chinese Patent Application No. 201210497036.6 (with English language translation).

* cited by examiner

METHOD FOR PRODUCING ORGANIC ELECTROLUMINESCENCE ELEMENT, AND ORGANIC ELECTROLUMINESCENCE ELEMENT

BACKGROUND OF THE INVENTION

1. Field of the Invention

The present invention relates to a method for producing an organic electroluminescence element and a luminescent organic thin film obtained thereby, which are useful especially in, for example, organic semiconductor materials and organic electronic devices such as organic EL elements.

2. Description of the Related Art

By virtue of their various optical and electrical characteristics, organic semiconductor materials have recently attracted large attention as optoelectronics materials, and research and development thereon have actively been conducted. Among them, organic electroluminescence (hereinafter referred to as "organic EL") elements, which are luminescent devices using luminescent organic semiconductors, utilize a phenomenon that when an electrical field is applied to an organic material, injected holes and electrons recombine with each other on an organic molecule to generate excitons, so that their radiative deactivation results in light emission. Such organic EL elements are expected to have applications such as display devices such as TV and mobile terminals and light sources for lighting.

Thus, various attempts have been made on develop techniques of making organic EL elements drive at low voltages and increasing organic EL elements in luminescent efficiency.

One exemplary organic EL element contains: a transparent electrode of, for example, indium-tin oxide (hereinafter referred to as "ITO"); a metal electrode of, for example, aluminum; and a plurality of organic thin layers between the electrodes.

The organic thin layers contain a luminescent material (a luminescent layer) and the luminescent material receives voltage via the transparent electrode and the metal electrode. When voltage is applied to between the transparent electrode and the metal electrode, holes are injected from the transparent electrode and electrons are injected from the metal electrode in accordance with the direction of the electrical field applied, and the electrons and holes recombine with each other in the luminescent material to thereby emit light.

The theoretical luminescent efficiency of organic EL elements is a product of light extraction efficiency, carrier recombination efficiency, exciton generation efficiency and luminescence quantum yield. In order to produce an organic EL element having such a high luminescent efficiency that is practically usable, it is an important technical object to increase the luminescence quantum yield of an organic luminescent dye used for the luminescent layer. Organic luminescent dyes show considerable degradation in luminescence quantum yield at high concentrations, which is called concentration quenching. This is because excitation energy is moved between closely existing molecules or light is absorbed by themselves (see Appl. Phys. Lett. 86, 071104 (2005)).

Thus, the luminescent layer of organic EL elements is generally in a solid state where an organic luminescent dye (guest) is dispersed at a low concentration in an optically inactive medium (hereinafter referred to as "host"). Here, host materials generally used are materials having an energy gap greater than that of the organic luminescent dye. Also, in the case of phosphorescent materials, hosts having levels higher than the lowest triplet level of the guest molecule are generally used in terms of efficiency.

The luminescent organic thin film may be produced by the following two methods, for example.

(1) Thin film of a vapor deposition/dispersion type: an organic luminescent dye serving as a guest material is dispersed in a host material of a low-molecular-weight material to form a luminescent organic thin film. The luminescent organic thin film is formed by, for example, the vacuum vapor deposition method (see Japanese Patent Application Laid-Open (JP-A) Nos. 2000-068057 and 2010-034484).

(2) Thin film of a polymer dispersion type: an organic luminescent dye serving as a guest material is dispersed in a host material of a polymeric material to form a luminescent organic thin film. The luminescent organic thin film is formed by, for example, the coating method (see JP-A No. 2007-305783).

Any of these methods still have problems. First, the formation of the thin film of a vapor deposition/dispersion type requires a high-level technique of strictly controlling the vapor deposition rates of the guest and host molecules in order to properly control the concentration of the guest molecule doped. Moreover, in order to obtain white light as a light source for lighting, it is necessary to simultaneously vapor-deposit a plurality of organic luminescent dyes showing red, green and blue for doping, which requires strictly controlling the vapor deposition rates of the plurality of guest molecules as well as the vapor deposition rate of the host molecule. This method is quite difficult to perform and it is hard to say that its practicability and productivity are high. In addition, the development cost and time required for increasing the practicability and productivity thereof become considerable and thus this method cannot meet a requirement that an organic semiconductor material is formed into a thin film through a simple process such as coating or printing.

Meanwhile, the formation of the thin film of a polymer dispersion type uses the coating method and does not require strictly controlling the vapor deposition rates of the guest and host materials, which can simplify the production process. Also, wet film-forming processes such as the polymer dispersing method have the following advantages: it does not require the vacuum process; it can easily form a film having a larger area; and it is easy to mix a plurality of materials having various functions in a single layer (coating liquid).

At present, such wet film-forming processes, however, have difficulty in laminating layers and form elements poorer in drive stability than those formed by the vacuum vapor deposition method, and most of the wet film-forming processes are not at a practically usable level. The layer lamination by the wet film-forming processes is performed by forming the first layer using an aqueous solvent and a polymer insoluble to an organic solvent and forming the second layer thereon using an organic solvent. However, it is difficult to laminate three or more layers. Furthermore, the thin film of a polymer dispersion type brings about phase separation between the polymeric materials and the low-molecular-weight materials due to, for example, heating treatments, making it difficult to attain uniform dispersing. Also, the thin film of a polymer dispersion type is lower in luminescent efficiency than elements formed using low-molecular-weight materials. Needless to say, satisfying "uniformity" and "high luminescence quantum yield" at the same time is necessary for EL elements.

SUMMARY OF THE INVENTION

The present invention aims to solve the above existing problems and achieve the following object. That is, the present invention aims to provide a luminescent organic film production method which can form through a solution process a uniform luminescent organic film having excellent semiconductor properties and high luminescence quantum yield.

The present inventors conducted extensive studies to achieve the above object and as a result have found that the above existing problems can be solved by a luminescent organic film obtained with a production method including at least eliminating and converting shown by the following reaction formula (I). The present invention has been completed on the basis of this finding.

The present invention is based on the above finding obtained by the present inventors. Means for solving the above problems are as follows.

That is, a method of the present invention for producing a luminescent organic film includes:

coating a solution containing a π-electron conjugated compound precursor A-(B)m and at least one kind of a luminescent dye, where the π-electron conjugated compound precursor A-(B)m contains a leaving substituent; and applying external stimulus to the π-electron conjugated compound precursor A-(B)m to eliminate the leaving substituent thereof, so that the π-electron conjugated compound precursor A-(B)m is converted to a π-electron conjugated compound A-(C)m and an eliminated compound X—Y as in the following reaction formula (I);

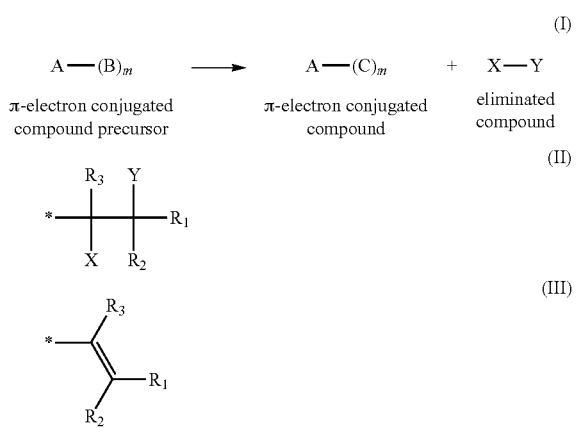

where in the reaction formula (I), A is a π-electron conjugated substituent, B is a solvent-soluble substituent containing at least a structure represented by General Formula (II), m is a natural number, C is a partial structure containing at least a structure represented by General Formula (III), the solvent-soluble substituent B in the π-electron conjugated compound precursor A-(B)m is linked via a covalent bond with an atom on the π-electron conjugated substituent A or ring-fused with a carbon atom on the π-electron conjugated substituent A, and when m is 2 or more, the solvent-soluble substituents B which are 2 or more may be identical or different and may be linked together to form a ring; and in the General Formulas (II) and (III), one of X and Y is a hydrogen atom and the other is the leaving substituent, $R_1$, $R_2$ and $R_3$, which may be identical or different, are each a hydrogen atom or a substituent and may form a ring together or may form a ring via a covalent bond with the π-electron conjugated substituent A, and when m is 2 or more, the solvent-soluble substituents B which are 2 or more may be identical or different and may be linked together to form a ring.

The present invention can provide a luminescent organic film production method which can form through a solution process a uniform luminescent organic film having excellent semiconductor properties and high luminescence quantum yield. This method can solve the above existing problems and achieve the above object.

DETAILED DESCRIPTION OF THE INVENTION

Figure 1A:
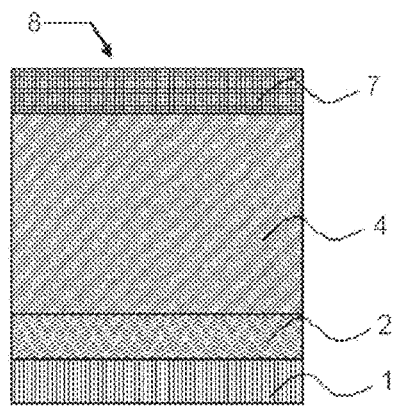
FIGS. 1A to 1E are schematic views of preferable exemplary embodiments of an organic EL element of the present invention.

Hereinafter, the present invention will be described by way of embodiments, which should not be construed as limiting the present invention thereto. When working the present invention, any modifications can be made without departing from the scope of the present invention.
(Method for Producing a Luminescent Organic Film)

A method of the present invention for producing a luminescent organic film includes at least a coating step and an eliminating and converting step; and, if necessary, further includes other steps.

The coating step is a step of coating a solution.

The above solution contains at least a π electron conjugated compound precursor A-(B)m and at least one kind of a luminescent dye, where the π electron conjugated compound precursor A-(B)m contains a leaving substituent; and, if necessary, further contains other ingredients.

The eliminating and converting step is a step of applying external stimulus to the π-electron conjugated compound precursor A-(B)m to eliminate the leaving substituent thereof, so that the π-electron conjugated compound precursor A-(B)m is converted to a π-electron conjugated compound A-(C)m and an eliminated compound X—Y as shown in the following reaction formula (I);

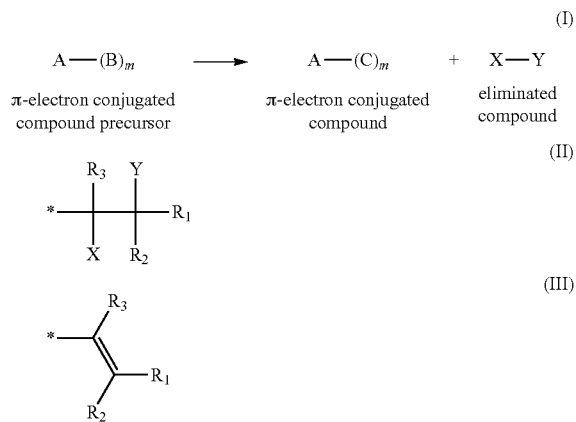

where in the reaction formula (I), A is a π-electron conjugated substituent, B is a solvent-soluble substituent containing at least a structure represented by General Formula (II), m is a natural number, C is a partial structure containing at least a structure represented by General Formula (III), the solvent-soluble substituent B in the π-electron conjugated compound precursor A-(B)m is linked via a covalent bond with an atom on the π-electron conjugated substituent A or ring-fused with a carbon atom on the π-electron conjugated substituent A, and when m is 2 or more, the solvent-soluble substituents B which are 2 or more may be identical or different and may be linked together to form a ring; and in the General Formulas (II) and (III), one of X and Y is a hydrogen atom and the other is the leaving substituent, $R_1$, $R_2$ and $R_3$, which may be identical or different, are each a hydrogen atom or a substituent and may form a ring together or may form a ring via a covalent bond with the π-electron conjugated substituent A, and when m is 2 or more, the leaving substituents of the solvent-soluble substituents B which are 2 or more may be identical or different and may be linked together to form a ring.

—π-Electron Conjugated Compound Precursor and π-Electron Conjugated Compound—

The above π-electron conjugated compound is obtained by applying external stimulus to a specific π electron conjugated compound containing a solvent-soluble substituent to eliminate a specific substituent from the specific π electron conjugated compound.

The above π-electron conjugated compound precursor is represented by General Formula A-(B)m.

In the above General Formula A-(B)m, A is a π-electron conjugated substituent, B is a solvent-soluble substituent containing a structure represented by the above General Formula (II) as at least a partial structure thereof, m is a natural number, the solvent-soluble substituent B in the π-electron conjugated compound precursor A-(B)m is linked via a covalent bond with an atom on the π-electron conjugated substituent A or ring-fused with a carbon atom on the π-electron conjugated substituent A, and when m is 2 or more, the solvent-soluble substituents B which are 2 or more may be identical or different and may be linked together to form a ring.

When external stimulus are applied to the π-electron conjugated compound precursor, the solvent-soluble substituent B releases the specific leaving substituent and the hydrogen atom (X and Y) in the form of an eliminated compound X—Y and is converted to a partial structure C where part of the solvent-soluble substituent B is reduced to be olefin, to thereby give a π-electron conjugated compound represented by the above General Formula A-(C)m in the above reaction formula (I).

In the above General Formula A-(C)m, A is π-electron conjugated substituent, C is a partial structure containing at least a structure represented by the above General Formula (III), m is a natural number, the partial structures C in the π-electron conjugated compound precursor A-(C)m each are linked via a covalent bond with an atom on the π-electron conjugated substituent A or ring-fused with a carbon atom on the π-electron conjugated substituent A, and when m is 2 or more, the partial structures C which are 2 or more may be identical or different and may be linked together to form a ring.

In more detail, the above π-electron conjugated compound precursor has a structure where m of the solvent-soluble substituent B(s) is(are) bound to the π-electron conjugated substituent A, and each of the solvent-soluble substituent B(s) have a pair (X, Y) of the leaving substituent and the hydrogen atom which are responsible for its solvent solubility.

In other words, the reaction formula (I) can be expressed by the following reaction formula (I-2). Here, the solvent-soluble substituent $B_n$ and the corresponding partial structure C are represented by the following General Formula (II-4) and (III), respectively.

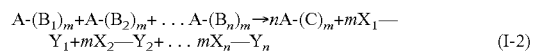

In the above reaction formula (I-2), $B_1$, $B_2$, $B_3$, ... $B_n$ are different solvent-soluble substituents. That is, $A\text{-}(B_1)_m$, $A\text{-}(B_2)_m$, ... $A\text{-}(B_n)_m$ are different π-electron conjugated compound precursors having different leaving substituents $X_1—Y_1$, $X_2—Y_2$, ... $X_n—Y_n$.

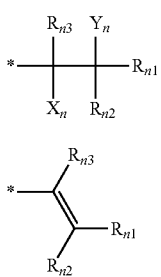

(II-4)

(III)

In the above reaction formula (I-2), A is a π-electron conjugated substituent, $B_n$ is a solvent-soluble substituent containing a structure represented by the above General Formula (II-4) as at least a partial structure thereof, m is a natural number and is preferably an integer of 2 or more (i.e., the number of the —C($R_{n3}$)X—C($R_{n2}$)Y—$R_{n1}$ structures in the solvent-soluble substituent $B_n$ is 2 or more), C is a structure containing a structure represented by the above General Formula (III) as at least a partial structure thereof, and $R_{n1}$ to $R_{n3}$, which may be identical or different, are each a hydrogen atom or a substituent and may form a ring together.

The solvent-soluble substituent $B_n$ in the above reaction formula (I-2) is linked via a covalent bond with an atom on the π-electron conjugated substituent A or ring-fused with a carbon atom on the π-electron conjugated substituent A.

The above reaction formula (I-2) and the above General Formula (III), one of $X_n$ and $Y_n$ is a hydrogen atom and the other is a leaving substituent.

—π-Electron Conjugated Substituent A—

The π-electron conjugated substituent A is not particularly limited, so long as it has a π-electron conjugated plane, and may be appropriately selected depending on the intended purpose. The π-electron conjugated substituent A is preferably a substituent derived from at least one selected from the group consisting of: (i) compounds each containing an aromatic hydrocarbon ring or an aromatic heterocyclic ring or both thereof, and compounds where two or more of these compounds are ring-fused together (i.e., fused polycyclic aromatic hydrocarbon ring compounds and fused polycyclic aromatic heterocyclic ring compounds); and (ii) compounds where two or more of the compounds listed in (i) above are linked together via a covalent bond. Furthermore, π electrons contained in the aromatic hydrocarbon ring or aromatic heterocyclic ring are preferably delocalized throughout the ring-fused or linked structure by the interaction as a result of ring-fusion or covalently bonding.

Examples of the aromatic hydrocarbon ring include a benzene ring.

Examples of the aromatic heterocyclic ring include a thiophene ring, a pyridine ring, a pyrazine ring, a pyrimidine ring, a triazine ring, a pyrrole ring, a pyrazole ring, an imidazole ring, a triazole ring, an oxazole ring, a thiazole ring, a furan ring, a selenophene ring and a silole ring.

The number of the rings of the aromatic hydrocarbon ring compounds or aromatic heterocyclic ring compounds where the rings are fused or linked together via a covalent bond is preferably two or more. Examples of the aromatic hydrocarbon ring compounds or aromatic heterocyclic ring compounds where the rings are fused or linked together via a covalent bond include: fused polycyclic compounds such as naphthalene, anthracene, tetracene, chrycene and pyrene, pentacene, thienothiophene, thienodithiophene, triphenylene, hexabenzocoronene, benzothiophene, benzodithiophene, [1]benzothieno[3,2-b][1]benzothiophene (BTBT), dinaphto[2,3-b:2',3'-f][3,2-b]thienothiophene (DNTT) and benzodithienothiophene (TTPTT); oligomers of aromatic hydrocarbon ring compounds and aromatic heterocyclic ring compounds such as biphenyl, terphenyl, quaterphenyl, bithiophene, terthiophene and quaterthiophene; phthalocyanines; and porphyrins.

—Solvent-Soluble Substituent B and Partial Structure C—

The solvent-soluble substituent B is not particularly limited and may be appropriately selected depending on the intended purpose so long as it is a solvent-soluble substituent containing at least a structure represented by General Formula (II).

The partial structure C is not particularly limited and may be appropriately selected depending on the intended purpose so long as it is a partial structure containing at least a structure represented by General Formula (III).

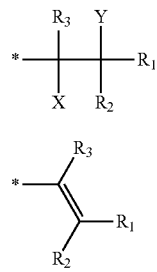

(II)

(III)

In the General Formulas (II) and (III), one of X and Y is a hydrogen atom and the other is the above leaving substituent, $R_1$, $R_2$ and $R_3$, which may be identical or different, are each a hydrogen atom or a substituent and may form a ring together or may form a ring via a covalent bond with the π-electron conjugated substituent A, and when m is 2 or more, the solvent-soluble substituents B which are 2 or more may be identical or different and may be linked together to form a ring.

—Substituent—

$R_1$, $R_2$ and $R_3$ in the above General Formulas (II) and (III) may be identical or different and are each a hydrogen atom or a substituent.

The substituent is not particularly limited and may be appropriately selected depending on the intended purpose so long as it is not a leaving group. Examples thereof include alkyl groups, alkenyl groups, alkynyl groups, aryl groups, heteroaryl groups and an amino group.

The alkyl groups are linear, branched or cyclic, substituted or unsubstituted alkyl groups. Examples of the linear or branched alkyl groups include a methyl group, an ethyl group, a n-propyl group, an i-propyl group, a t-butyl group, a s-butyl group, a n-butyl group, an i-butyl group, a pentyl group, a hexyl group, a heptyl group, an octyl group, a nonyl group, a decyl group, an undecyl group, a dodecyl group, a tridecyl group, a tetradecyl group, a pentadecane group, a hexadecyl group, a heptadecyl group, an octadecyl group, a 3,7-dimethyloctyl group, a 2-ethylhexyl group, a trifluoromethyl group, a trifluorooctyl group, a trifluorododecyl group, a trifluorooctadecyl group and a 2-cyanoethyl group. Examples of the cyclic alkyl groups (i.e., cycloalkyl groups) include a cyclopentyl group, a cyclobutyl group, a cyclohexyl group and a pentafluorocyclohexyl group. The alkyl groups referred to in the substituents described below refer to the above-described alkyl groups.

The alkenyl groups are linear, branched or cyclic, substituted or unsubstituted alkenyl groups. Examples of the linear or branched alkenyl groups include groups obtained by changing one or more carbon-carbon single bonds to double bonds in the above-exemplified alkyl groups having two or more carbon atoms, such as an ethenyl group (a vinyl group), a propenyl group (an allyl group), a 1-butenyl group, a 2-butenyl group, a 2-methyl-2-butenyl group, a 1-pentenyl group, a 2-pentenyl group, a 3-pentenyl group, a 1-hexenyl group, a 2-hexenyl group, a 3-hexenyl group, a 1-heptenyl group, a 2-heptenyl group, a 3-heptenyl group, a 4-heptenyl group, a 1-octenyl group, a 2-octenyl group, a 3-octenyl group, a 4-octenyl group and a 1,1,1-trifluoro-2-butenyl group. Examples of the cyclic alkenyl groups (i.e., cycloalkenyl groups) include groups obtained by changing one or more carbon-carbon single bonds to double bonds in the above-exemplified cycloalkyl groups having three or more carbon atoms, such as a 1-cycloallyl group, a 1-cyclobutenyl group, a 1-cyclopentenyl group, a 2-cyclopentenyl group, a 3-cyclopentenyl group, a 1-cyclohexenyl group, a 2-cyclohexenyl group, a 3-cyclohexenyl group, a 1-cycloheptenyl group, a 2-cycloheptenyl group, a 3-cycloheptenyl group, a 4-cycloheptenyl group and a 3-fluoro-1-cyclohexenyl group. When the alkenyl group has stereoisomers such as a trans (E) form and cis (Z) form, both the stereoisomers may be used, or a mixture containing them at any ratio may be used also.

The alkynyl groups are linear, branched or cyclic, substituted or unsubstituted alkynyl groups. Examples thereof include groups obtained by changing one or more carbon-carbon single bonds to triple bonds in the above-exemplified alkyl groups having two or more carbon atoms, such as an ethynyl group, a proparygyl group, a trimethylsilylethynyl group and a triisopropylsilylethynyl group.

Examples of the aryl groups include a phenyl group, an o-tolyl group, a m-tolyl group, a p-tolyl group, a p-chlorophenyl group, a p-fluorophenyl group, a p-trifluorophenyl group and a naphthyl group.

The heteroaryl groups are preferably 5- or 6-membered substituted or unsubstituted, aromatic or non-aromatic heteroaryl groups, such as a 2-furyl group, a 2-thienyl group, a 3-thienyl group, a 2-thienothienyl group, a 2-benzothienyl group and a 2-pyrimidyl group.

Examples of the amino group include an amino group (—NH$_2$), substituted or unsubstituted alkylamino groups (e.g., a methylamino group and a dimethylamino group), substituted or unsubstituted anilino groups (e.g., an anilino group and an N-methyl-anilino group), a diphenylamino group, acylamino groups (e.g., a formylamino group, substituted or unsubstituted alkylcarbonylamino groups (e.g., an acetylamino group, a pivaloylamino group and a lauroylamino group), substituted or unsubstituted arylcarbonylamino groups (e.g., a benzoylamino group and a 3,4,5-tri-n-octyloxyphenylcarbonylamino group)) and aminocarbonylamino groups (e.g., carbon-substituted or unsubstituted aminocarbonylamino groups (e.g., a carbamoylamino group, an N,N-dimethylaminocarbonylamino group, an N,N-diethylaminocarbonylamino group and a morpholinocarbonylamino group)).

—Leaving Substituent—

The leaving substituent is not particularly limited and may be appropriately selected depending on the intended purpose. Examples thereof include substituted or unsubstituted acyloxy groups, substituted or unsubstituted alkoxy groups, substituted or unsubstituted cycloalkyl groups, substituted or unsubstituted aryl groups, substituted or unsubstituted aralkyl groups and halogen atoms.

When m is 2 or more, the leaving substituents of the solvent-soluble substituents B which are 2 or more may be identical or different and may form a ring together.

The above ring is, for example, a ring structure containing the acyloxy group or a ring structure containing the alkoxy group.

Examples of the substituted or unsubstituted acyloxy group include: a formyloxy group; and acyloxy groups derived from carboxylic acids such as linear or cyclic aliphatic carboxylic acids optionally containing a halogen atom and aromatic carboxylic acids optionally containing a halogen atom. Specific examples thereof group include a formyloxy group, an acetoxy group, a propionyloxy group, a butylyloxy group, an isobutylyloxy group, a pivaloyloxy group, a pentanoyloxy group, a hexanoyloxy group, a lauroyloxy group, a stearoyloxy group, a trifluoroacetyloxy group, a 3,3,3-trifluoropropionyloxy group, a pentafluoropropionyloxy group, a cyclopropanoyloxy group, a cyclobutanoyloxy group, a cyclohexanoyloxy group, a benzoyloxy group, a p-methoxyphenylcarbonyloxy group and a pentafluorobenzoyloxy group.

Examples of the unsubstituted alkoxy groups include a methoxy group, an ethoxy group, a propyl group, an isopropoxy group, a butoxy group, an isobutoxy group, a t-butoxy group, a pentyloxy group, a hexyloxy group, a heptyloxy group and an octyloxy group.

Examples of the substituted alkoxy groups include a fluoromethyl group, a chloromethyl group, a dichloromethyl group, a bromomethyl group, a 2-fluoroethyl group, a 2,2,2-trifluoroethyl group, a 2-chloroethyl group, a 2,2-dichloroethyl group, a 1-chloroethyl group, a 2-bromoethyl group, a 3-fluoroethyl group, a 3-chloropropyl group, a 2-chloropropyl group, a 3-bromopropyl group, a 4-chlorobutyl group, a 5-chloropentyl group and a 6-chlorohexyl group.

Examples of the cycloalkyl group include a cyclopentyl group, a cyclohexyl group, a cycloheptyl group and a cyclooctyl group.

Examples of the aryl group include a phenyl group, a 1-naphthyl group, a 2-naphthyl group, an anthryl group and a phenanthryl group.

Examples of the aralkyl group include a benzyl group, a phenethyl group and a benzhydryl group.

Examples of the halogen atoms include a fluorine atom, a chlorine atom, a bromine atom and an iodine atom.

In the above General Formulas (I) and (II), the acyloxy group which is one example of the leaving substituent preferably has a structure represented by the following General Formula (VII).

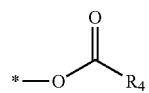

(VII)

In the General Formula (VII), R$_4$ is a hydrogen atom or a substituted or unsubstituted monovalent organic group.

The substituted or unsubstituted monovalent organic group is not particularly limited and may be appropriately selected depending on the intended purpose. Preferable examples thereof include substituted or unsubstituted alkyl groups, substituted or unsubstituted alkenyl groups, substituted or unsubstituted alkynyl groups, substituted or unsubstituted alkoxyl groups, substituted or unsubstituted thioalkyl groups, substituted or unsubstituted aryl groups, substituted or unsubstituted heteroaryl groups and a cyano group.

When m is 2 or more, the structure represented by the General Formula (VII) can have a structure having a cyclic acyloxy group represented by the following General Formula (VII-1). The structure represented by the General Formula (VII-1) forms a ring at the positions of the two leaving substituents.

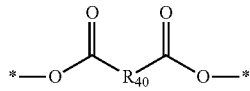

(VII-1)

In the General Formula (VII-1), $R_{40}$ is a divalent group derived from the above $R_4$s. The divalent group $R_{40}$ is preferably a divalent group derived from substituted or unsubstituted alkyl groups, substituted or unsubstituted alkenyl groups, substituted or unsubstituted alkynyl groups, substituted or unsubstituted alkoxy group, substituted or unsubstituted thioalkyl groups, substituted or unsubstituted aryl groups and/or substituted or unsubstituted heteroaryl groups. The divalent group $R_{40}$ is more preferably a divalent group derived from substituted or unsubstituted alkyl groups.

The leaving substituent preferably has a structure represented by the following General Formula (VIII).

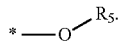

(VIII)

In the General Formula (VIII), $R_5$ is a substituted or unsubstituted monovalent organic group.

The substituted or unsubstituted monovalent organic group is not particularly limited and may be appropriately selected depending on the intended purpose. Preferable examples thereof include substituted or unsubstituted alkyl groups, substituted or unsubstituted alkenyl groups, substituted or unsubstituted alkynyl groups, substituted or unsubstituted aryl groups, and substituted or unsubstituted heteroaryl groups.

When m is 2 or more, the structure represented by the following General Formula (VIII-1) can have a structure having a cyclic alkoxy group represented by the General Formula (VIII-1). The structure represented by the General Formula (VIII-1) forms a ring at the positions of the two leaving substituents.

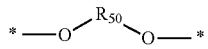

(VIII-1)

In the General Formula (VIII-1), $R_{50}$ is a divalent group derived from the above $R_5$s. The divalent group $R_{50}$ is preferably a divalent group derived from substituted or unsubstituted alkyl groups, substituted or unsubstituted alkenyl groups, substituted or unsubstituted alkynyl groups, substituted or unsubstituted aryl groups and/or substituted or unsubstituted heteroaryl groups. The divalent group $R_{50}$ is more preferably a divalent group derived from substituted or unsubstituted alkyl groups.

The substituents $R_4$, $R_{40}$, $R_5$ and $R_{50}$ are not particularly limited. From the viewpoints of solvent solubility and film formability, advantageously, the substituent selected reduces intermolecular interaction to a certain extent and enhances affinity to a solvent. Meanwhile, from the viewpoint of uniformity, when the volume is considerably changed before or after elimination of the substituent, there is a concern on problematic ununiformity in coating of an organic film through elimination reaction. Therefore, the substituent used is preferably smaller in size to the greatest extent possible while maintaining appropriate solubility.

The solvent-soluble substituents B form a ring in the above-described manner (1) where two or more solvent-soluble substituents B form a ring together via their leaving substituents (when m≥2). Besides, the solvent-soluble substituents B form a ring in a manner (2) where two or more solvent-soluble substituents B form a ring via their substituents (when m≥2) and in a manner (3) where each of one or more solvent-soluble substituents B form a ring via its substituents $R_1$ to $R_3$ (when m≥1).

Furthermore, the solvent-soluble substituents B form a ring in a manner (4) where each of one or more solvent-soluble substituents B form a ring via its substituents with the π-electron conjugated substituent A (when m≥1).

The structure of the ring formed is not particularly limited and may be appropriately selected depending on the intended purpose, but is preferably a structure having a cyclohexene structure as a partial structure. Preferably, the π-electron conjugated compound precursor A-(B)m is a precursor containing the solvent-soluble substituent B containing at least a structure represented by the following General Formula (II-1) or (II-2) or both thereof, and the π-electron conjugated compound A-(C)m is a compound containing the partial structure C containing at least a structure represented by the following General Formula (III-1), (III-2) or (III-3) or any combination thereof.

In the case of the above (2), the solvent-soluble substituent B preferably has at least a structure represented by the following General Formula (II-1). In the case of the above (3), the solvent-soluble substituent B preferably has at least a structure represented by the following General Formula (II-2).

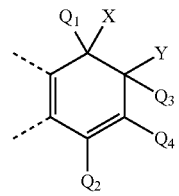

(II-1)

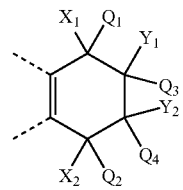

(II-2)

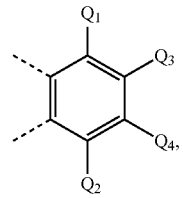

(III-1)

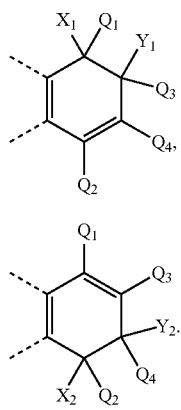

(III-2)

(III-3)

In General Formulas (II-1), (II-2), (III-1), (III-2) and (III-3), one of X and Y is a hydrogen atom and the other is a leaving substituent, one of $X_1$ and $Y_1$ is a hydrogen atom and the other is a leaving substituent, one of $X_2$ and $Y_2$ is a hydrogen atom and the other is a leaving substituent, the leaving substituent is a substituted or unsubstituted acyloxy group or a substituted or unsubstituted alkoxy group, and $Q_1$, $Q_2$, $Q_3$ and $Q_4$, which may be identical or different, are each a hydrogen atom or a substituent and may form a ring together or form a ring via a covalent bond with the π-electron conjugated substituent A.

The partial structure C corresponding to the solvent-soluble substituent B containing at least a structure represented by the above General Formula (II-1) is a partial structure C containing at least a structure represented by the above General Formula (III-1).

The partial structure C corresponding to the solvent-soluble substituent B containing at least a structure represented by the above General Formula (II-2) is a partial structure C containing at least a structure represented by the above General Formula (III-1), (III-2) or (III-3) or any combination thereof.

The structure represented by the General Formula (III-1) results from elimination of both the eliminated compounds $X_1$—$Y_1$ and $X_2$—$Y_2$ from the structure represented by the General Formula (II-2). The structure represented by the General Formula (III-2) results from elimination of the eliminated compound $X_2$—$Y_2$ from the structure represented by the General Formula (II-2). The structure represented by the General Formula (III-3) results from elimination of the eliminated compound $X_1$—$Y_1$ from the structure represented by the General Formula (II-2).

The leaving substituents in the General Formulas (II-1) and (II-2) each are a substituted or unsubstituted acyloxy group or a substituted or unsubstituted alkoxy group. Specific examples thereof include similar ones to specific examples of the substituted or unsubstituted acyloxy group and the substituted or unsubstituted alkoxy group listed above for the leaving substituent of the above General Formula (II).

In the General Formulas (II-1), (II-2), (III-1), (III-2) and (III-3), $Q_1$, $Q_2$, $Q_3$ and $Q_4$ may be identical or different and are each a hydrogen atom or a substituent.

Specific examples of the substituent include similar ones to specific examples of the substituents $R_1$, $R_2$ and $R_3$ in the above General Formulas (II) and (III).

When "m" in the General Formula (I) is 2 or more and the solvent-soluble substituents B which are 2 or more form a ring together via their substituents $R_1$, $R_2$ and $R_3$, the partial structure containing the solvent-soluble substituents B having the ring has the following structure, for example.

The π-electron conjugated compound precursor A-(B)m used in the present invention can be synthesized by the method described in JP-A No. 2011-21370. A compound corresponding to the above partial structure containing the solvent-soluble substituents B having the ring used in the present invention can be synthesized by the method described in JP-A No. 2011-213705. Specific synthesis methods therefor will be described in detail below in Examples.

TABLE 1

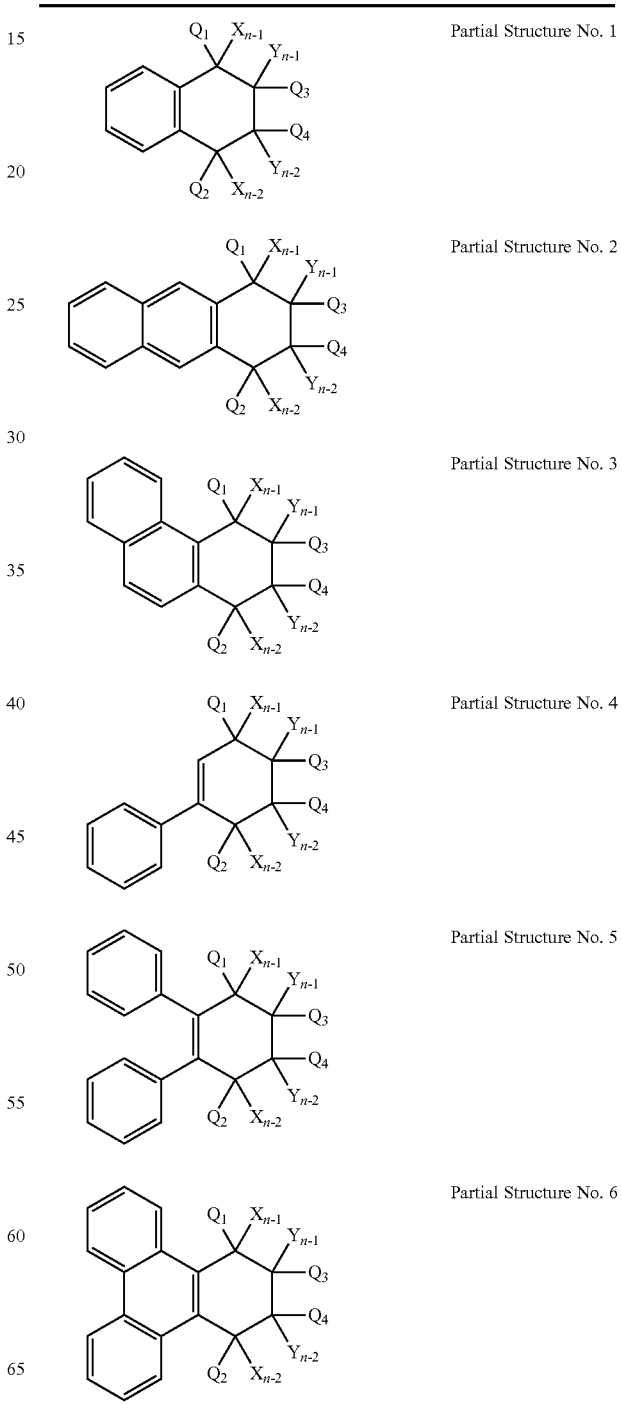

TABLE 1-continued

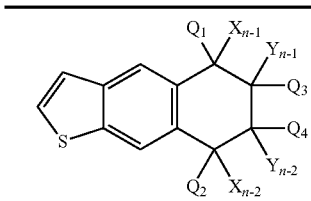

Partial Structure No. 7

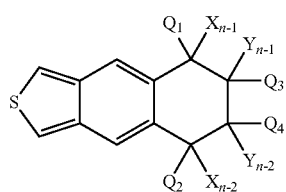

Partial Structure No. 8

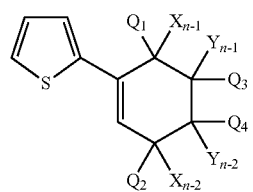

Partial Structure No. 9

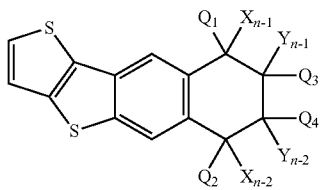

Partial Structure No. 10

TABLE 1-continued

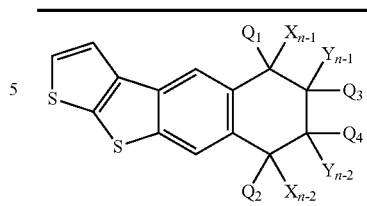

Partial Structure No. 11

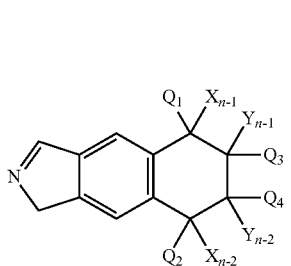

Partial Structure No. 12

These partial structures are ring-fused or linked via a covalent bond with the π-electron conjugated substituent A.

The following compounds (precursor compound Nos. 1 to 48) are exemplified as specific structures of the π-electron conjugated compound precursor A-(B)m formed by combining the above π-electron conjugated substituent A with the above solvent-soluble substituent B. However, the π-electron conjugated compound precursors in the present invention are not limited thereto. Also, there may be several stereoisomers of the solvent-soluble substituent B depending on the steric configuration of the acyloxy or alkoxy groups. The following compounds may be mixtures of such stereoisomers having different steric configurations.

TABLE 2-1

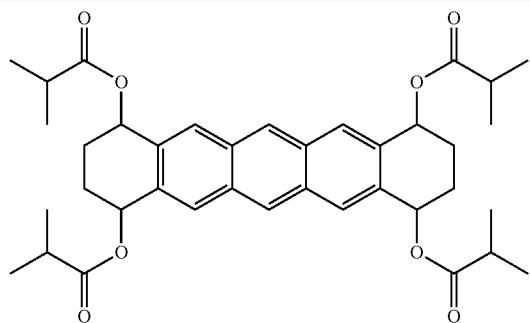 [SMILES: CC(C)C(=O)OC1CCC(OC(=O)C(C)C)c2cc3cc4cc5c(cc4cc3cc21)C(OC(=O)C(C)C)CCC5OC(=O)C(C)C]

Precursor compound No. 1

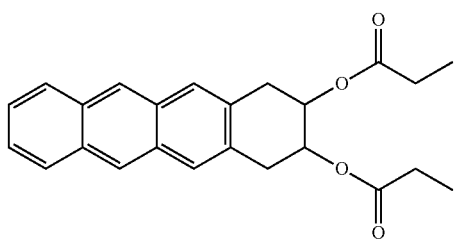 [SMILES: CCC(=O)OC1Cc2cc3cc4ccccc4cc3cc2CC1OC(=O)CC]

Precursor compound No. 2

TABLE 2-1-continued
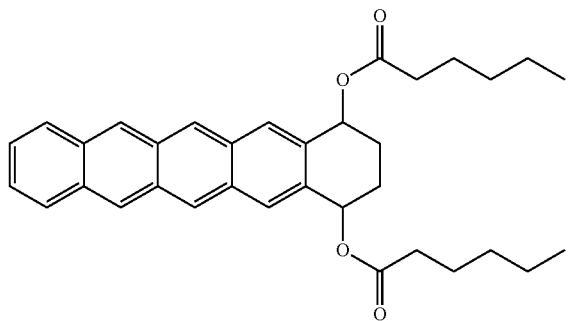 [SMILES: CCCCCC(=O)OC1CCC(OC(=O)CCCCC)c2cc3cc4cc5ccccc5cc4cc3cc21]
Precursor compound No. 3
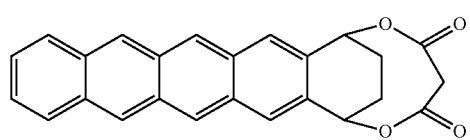 [SMILES: O=C1CC(=O)OC2CCC(O1)c1cc3cc4cc5ccccc5cc4cc3cc12]
Precursor compound No. 4
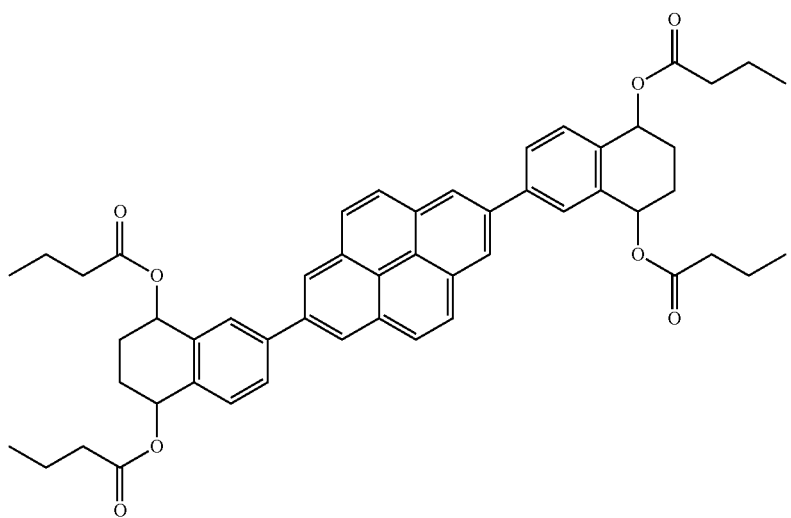 [SMILES: CCCC(=O)OC1CCC(OC(=O)CCC)c2cc(-c3cc4ccc5cc(-c6ccc7c(c6)C(OC(=O)CCC)CCC7OC(=O)CCC)cc6ccc(c3)c4c56)ccc21]
Precursor compound No. 5
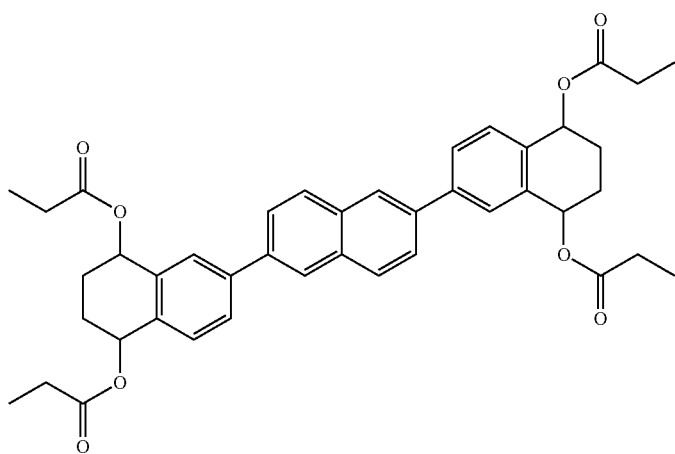 [SMILES: CCC(=O)OC1CCC(OC(=O)CC)c2cc(-c3ccc4cc(-c5ccc6c(c5)C(OC(=O)CC)CCC6OC(=O)CC)ccc4c3)ccc21]
Precursor compound No. 6

TABLE 2-1-continued
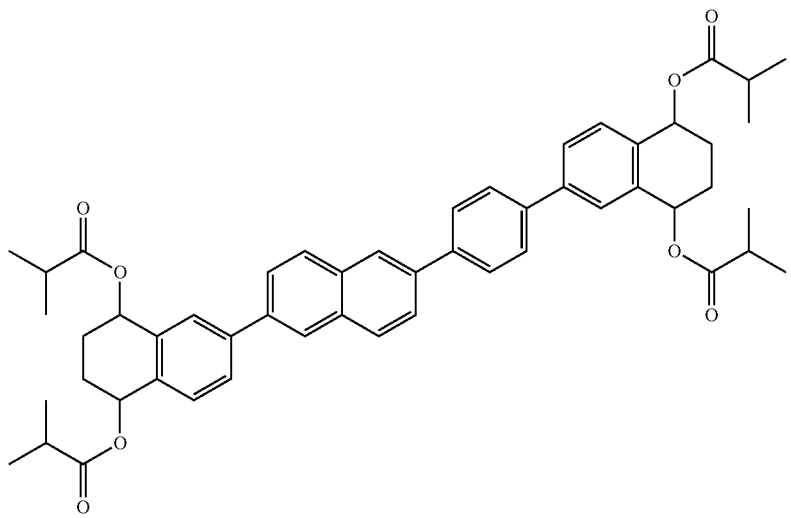 [SMILES: CC(C)C(=O)OC1CCC(OC(=O)C(C)C)c2cc(-c3ccc(-c4ccc5cc(-c6ccc7c(c6)C(OC(=O)C(C)C)CCC7OC(=O)C(C)C)ccc5c4)cc3)ccc21]
Precursor compound No. 7
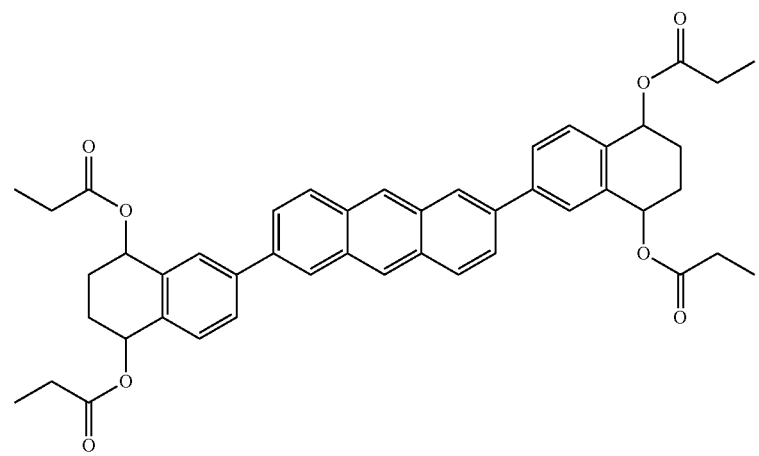 [SMILES: CCC(=O)OC1CCC(OC(=O)CC)c2cc(-c3ccc4cc5cc(-c6ccc7c(c6)C(OC(=O)CC)CCC7OC(=O)CC)ccc5cc4c3)ccc21]
Precursor compound No. 8
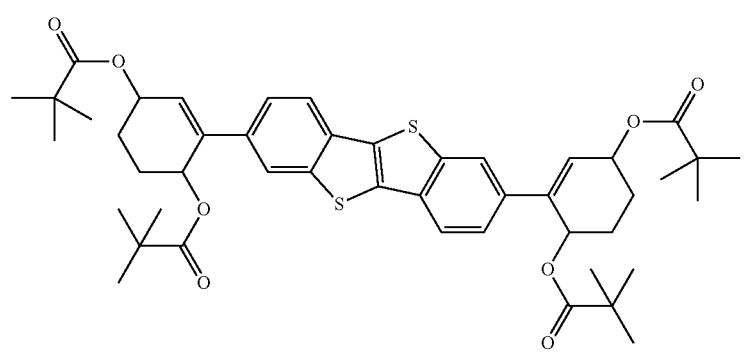 [SMILES: CC(C)(C)C(=O)OC1C=C(c2ccc3c(c2)sc2c4ccc(C5=CC(OC(=O)C(C)(C)C)CCC5OC(=O)C(C)(C)C)cc4sc32)C(OC(=O)C(C)(C)C)CC1]
Precursor compound No. 9
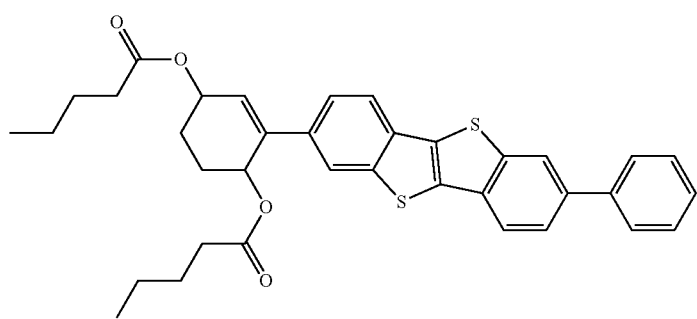 [SMILES: CCCCC(=O)OC1C=C(c2ccc3c(c2)sc2c4ccc(-c5ccccc5)cc4sc32)C(OC(=O)CCCC)CC1]
Precursor compound No. 10

TABLE 2-1-continued
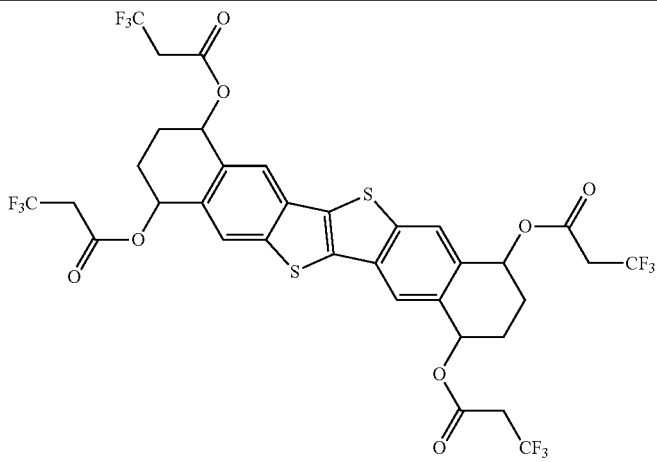
Precursor compound No. 11
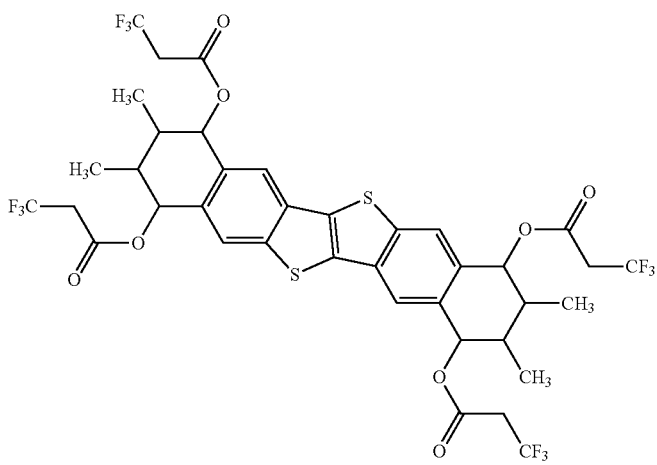 [SMILES: CC1C(OC(=O)CC(F)(F)F)c2cc3sc4c5cc6c(cc5sc4c3cc2C(OC(=O)CC(F)(F)F)C1C)C(OC(=O)CC(F)(F)F)C(C)C(C)C6OC(=O)CC(F)(F)F]
Precursor compound No. 12
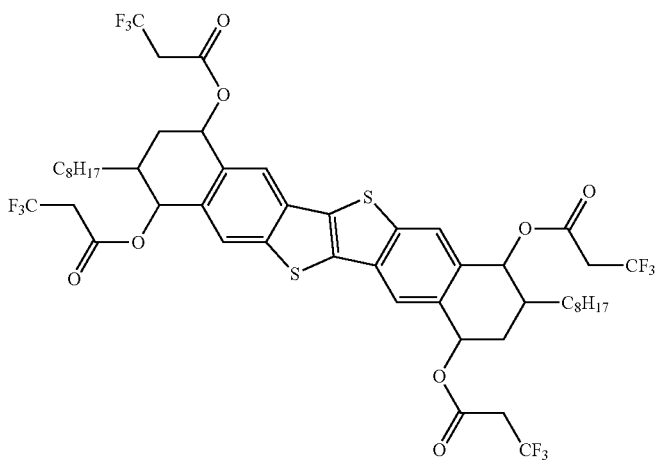
Precursor compound No. 13

TABLE 2-1-continued
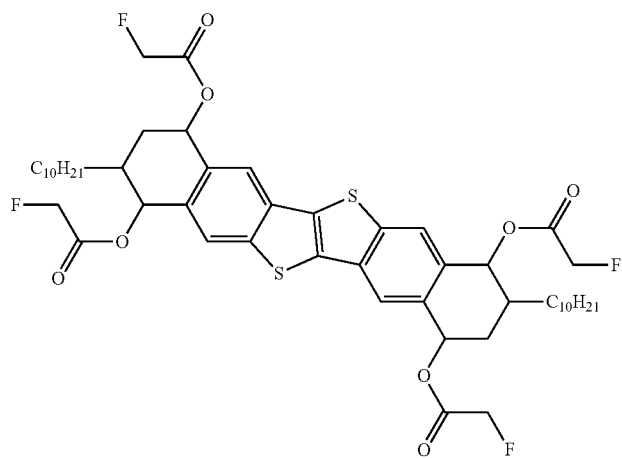
Precursor compound No. 14
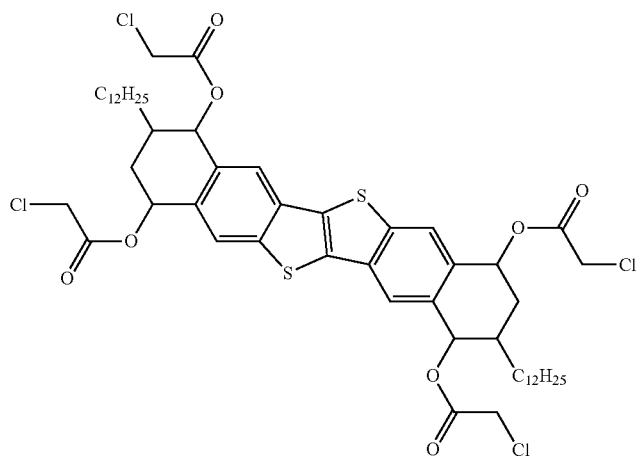
Precursor compound No. 15
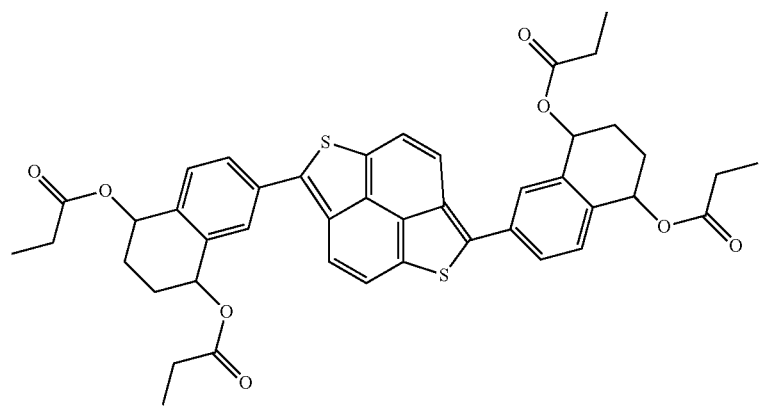 [SMILES: CCC(=O)OC1CCC(OC(=O)CC)c2cc(-c3sc4ccc5c(-c6ccc7c(c6)C(OC(=O)CC)CCC7OC(=O)CC)sc6ccc3c4c65)ccc21]
Precursor compound No. 16

TABLE 2-1-continued
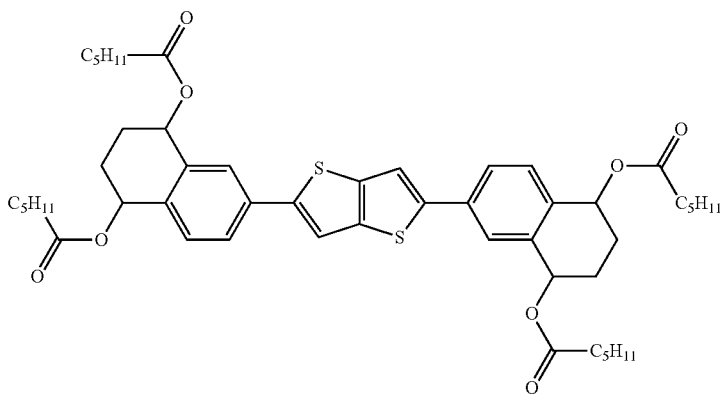
Precursor compound No. 17
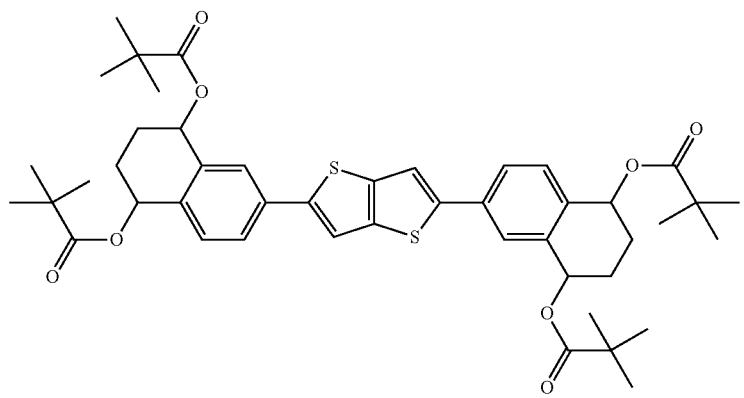 [SMILES: CC(C)(C)C(=O)OC1CCC(OC(=O)C(C)(C)C)c2cc(-c3cc4sc(-c5ccc6c(c5)C(OC(=O)C(C)(C)C)CCC6OC(=O)C(C)(C)C)cc4s3)ccc21]
Precursor compound No. 18
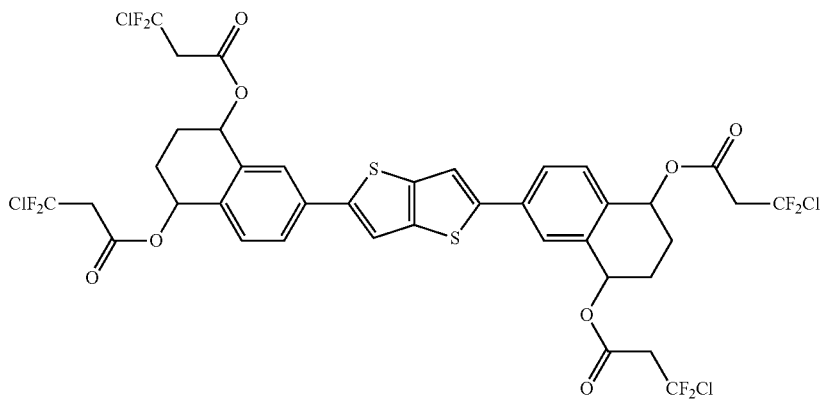
Precursor compound No. 19
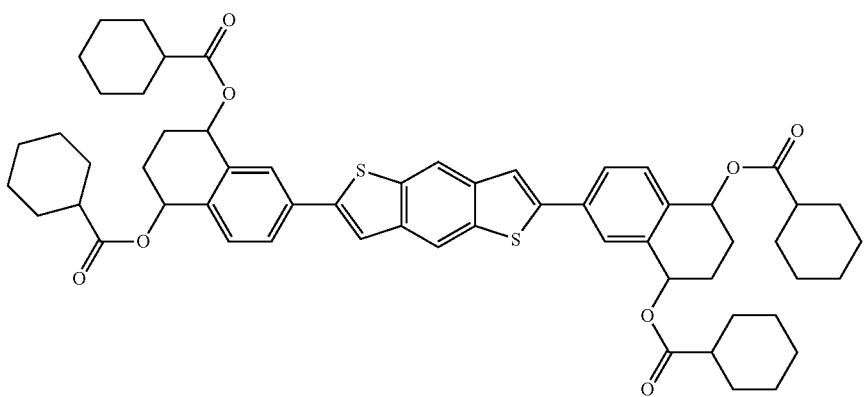 [SMILES: O=C(OC1CCC(OC(=O)C2CCCCC2)c2cc(-c3cc4cc5sc(-c6ccc7c(c6)C(OC(=O)C6CCCCC6)CCC7OC(=O)C6CCCCC6)cc5cc4s3)ccc21)C1CCCCC1]
Precursor compound No. 20

TABLE 2-1-continued
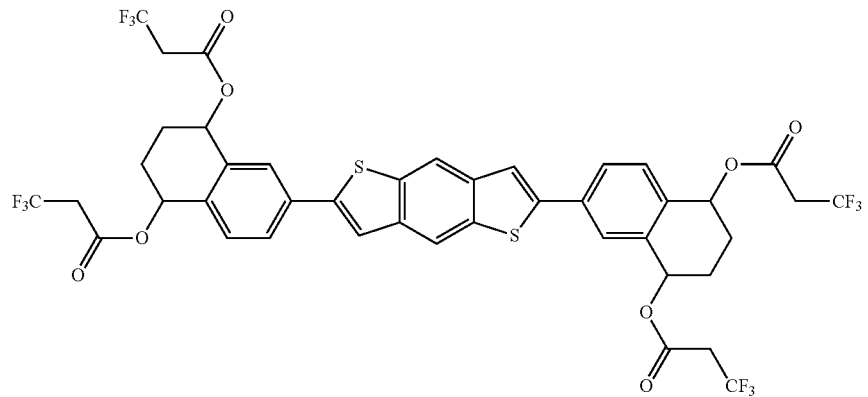 [SMILES: O=C(CC(F)(F)F)OC1CCC(OC(=O)CC(F)(F)F)c2cc(-c3cc4cc5sc(-c6ccc7c(c6)C(OC(=O)CC(F)(F)F)CCC7OC(=O)CC(F)(F)F)cc5cc4s3)ccc21]
Precursor compound No. 21
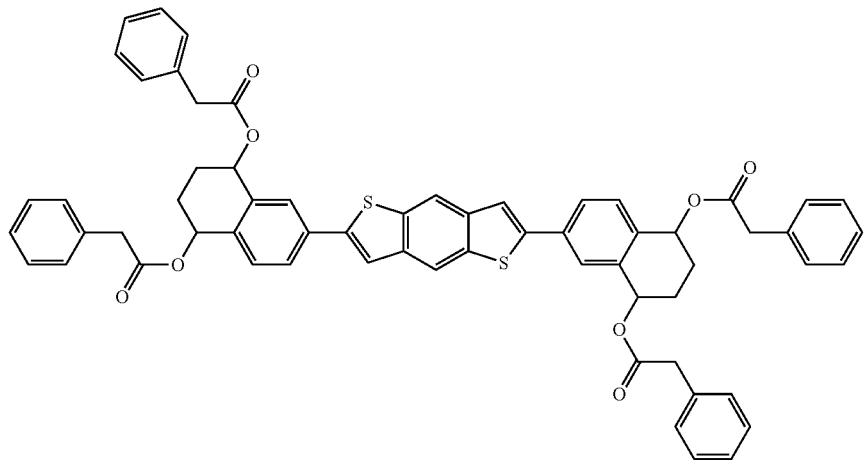 [SMILES: O=C(Cc1ccccc1)OC1CCC(OC(=O)Cc2ccccc2)c2cc(-c3cc4cc5sc(-c6ccc7c(c6)C(OC(=O)Cc6ccccc6)CCC7OC(=O)Cc6ccccc6)cc5cc4s3)ccc21]
Precursor compound No. 22
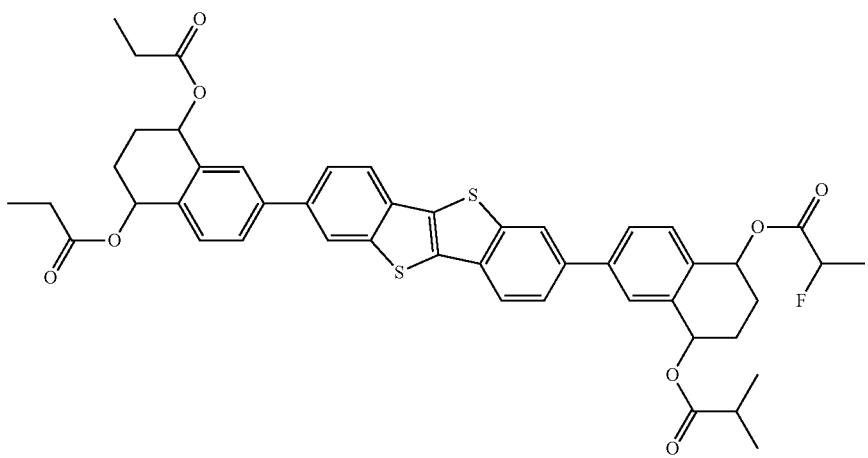 [SMILES: CCC(=O)OC1CCC(OC(=O)CC)c2cc(-c3ccc4c(c3)sc3c5ccc(-c6ccc7c(c6)C(OC(=O)C(C)C)CCC7OC(=O)C(C)F)cc5sc43)ccc21]
Precursor compound No. 23

TABLE 2-1-continued
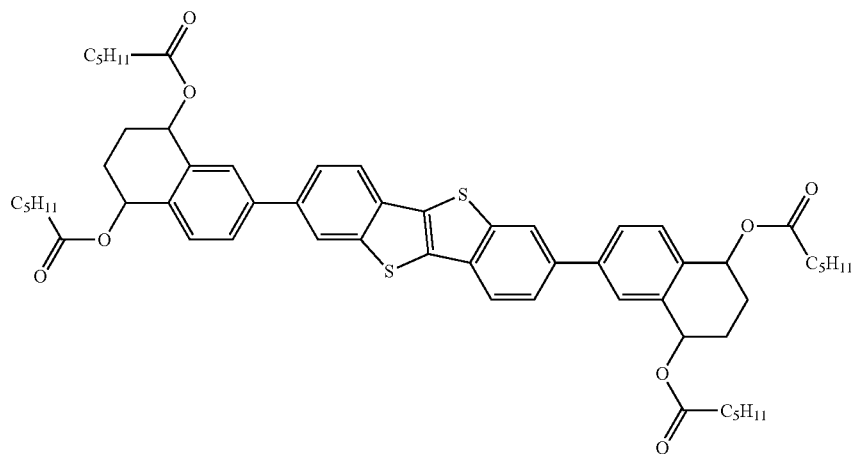
Precursor compound No. 24
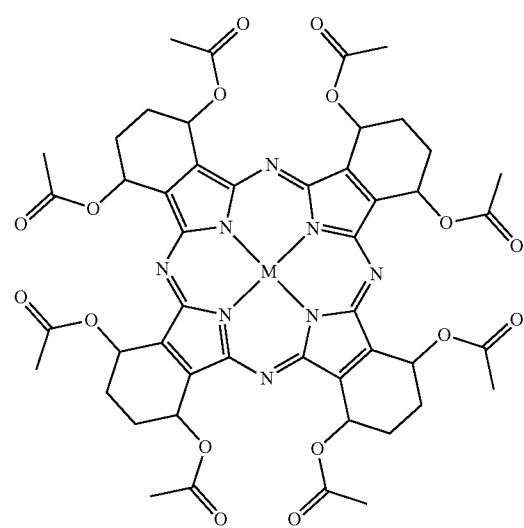
Precursor compound No. 25
M = H$_2$
M = Cu TABLE 2-1-continued
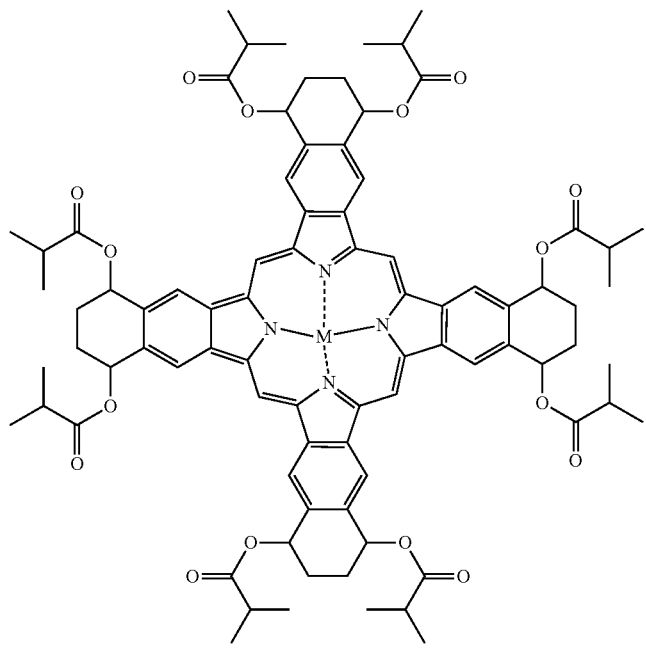
Precursor compound No. 26
M = H$_2$
M = Cu
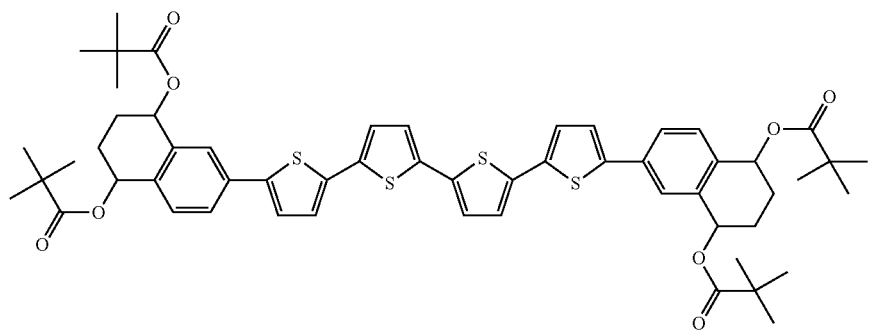 [SMILES: CC(C)(C)C(=O)OC1CCC(OC(=O)C(C)(C)C)c2cc(-c3ccc(-c4ccc(-c5ccc(-c6ccc(-c7ccc8c(c7)C(OC(=O)C(C)(C)C)CCC8OC(=O)C(C)(C)C)s6)s5)s4)s3)ccc21]
Precursor compound No. 27
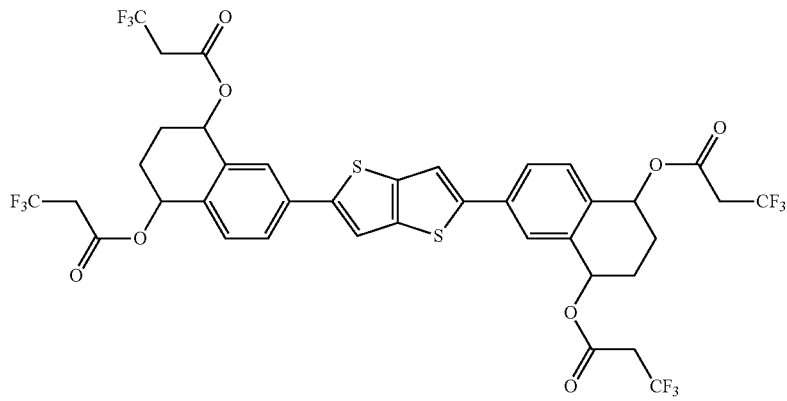 [SMILES: O=C(CC(F)(F)F)OC1CCC(OC(=O)CC(F)(F)F)c2cc(-c3cc4sc(-c5ccc6c(c5)C(OC(=O)CC(F)(F)F)CCC6OC(=O)CC(F)(F)F)cc4s3)ccc21]
Precursor compound No. 28

TABLE 2-2
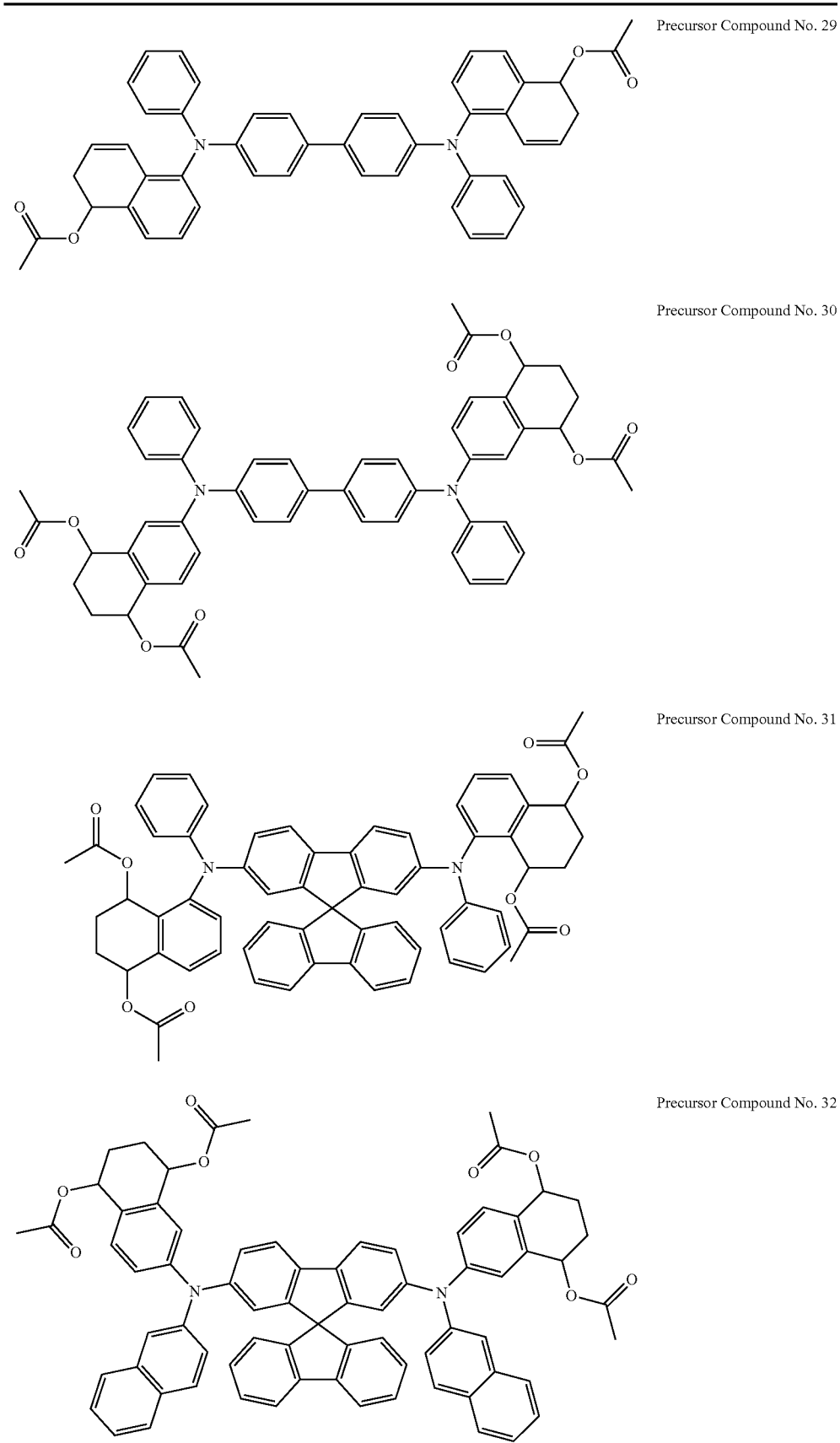
Precursor Compound No. 29
Precursor Compound No. 30
Precursor Compound No. 31
Precursor Compound No. 32

TABLE 2-2-continued
| | |
|---|---|
| 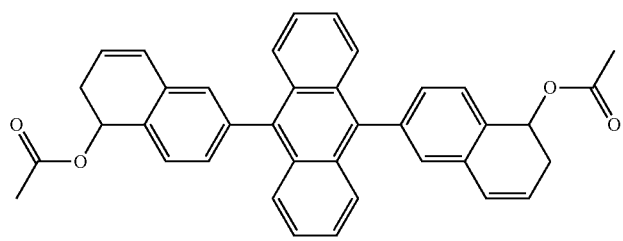 [SMILES: CC(=O)OC1CC=Cc2cc(-c3c4ccccc4c(-c4ccc5c(c4)C=CCC5OC(C)=O)c4ccccc34)ccc21] | Precursor Compound No. 33 |
| 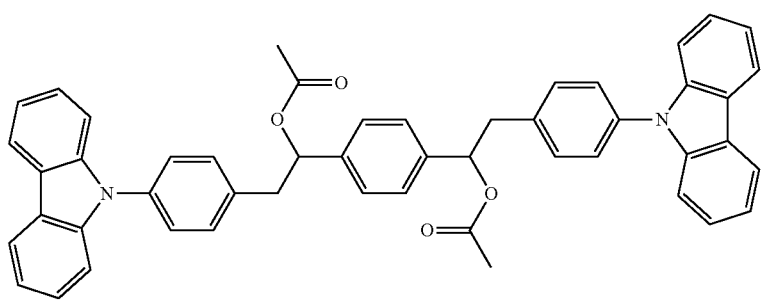 [SMILES: CC(=O)OC(Cc1ccc(-n2c3ccccc3c3ccccc32)cc1)c1ccc(C(Cc2ccc(-n3c4ccccc4c4ccccc43)cc2)OC(C)=O)cc1] | Precursor Compound No. 34 |
| 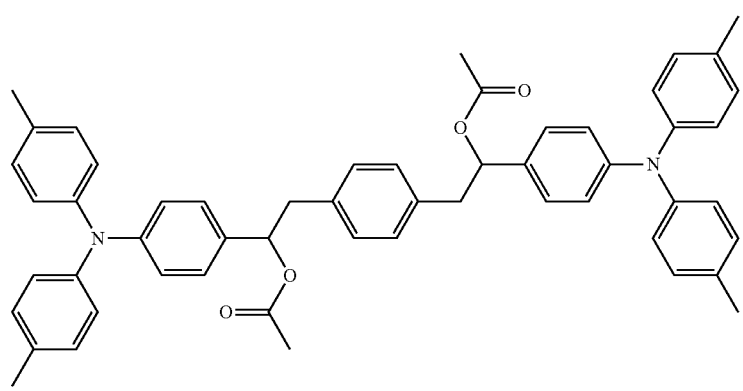 [SMILES: CC(=O)OC(Cc1ccc(CC(OC(C)=O)c2ccc(N(c3ccc(C)cc3)c3ccc(C)cc3)cc2)cc1)c1ccc(N(c2ccc(C)cc2)c2ccc(C)cc2)cc1] | Precursor Compound No. 35 |
| 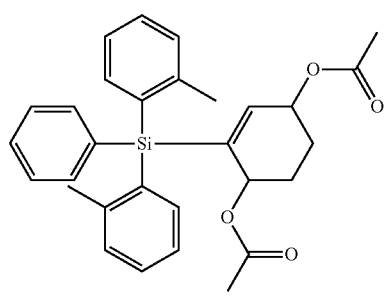 [SMILES: CC(=O)OC1C=C([Si](c2ccccc2)(c2ccccc2C)c2ccccc2C)C(OC(C)=O)CC1] | Precursor Compound No. 36 |

TABLE 2-3
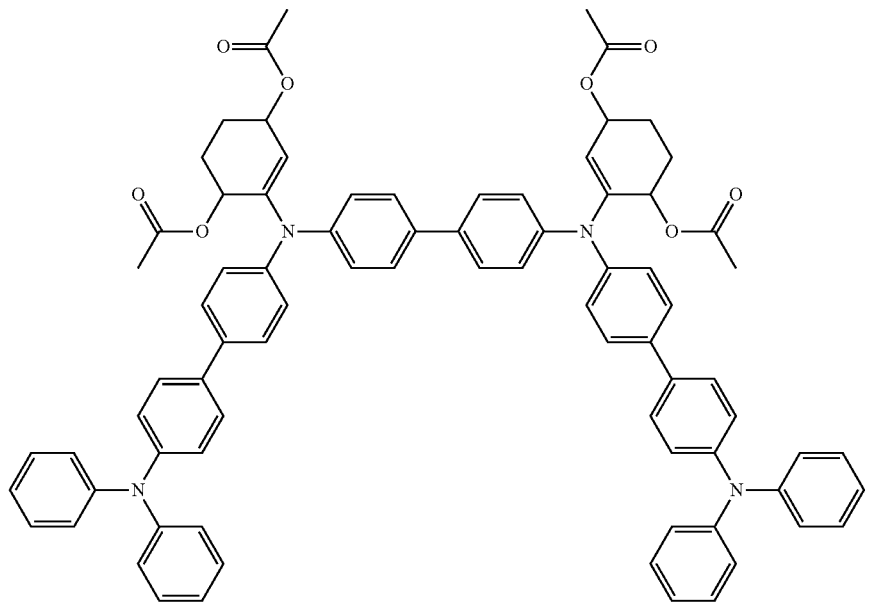 [SMILES: CC(=O)OC1C=C(N(c2ccc(-c3ccc(N(C4=CC(OC(C)=O)CCC4OC(C)=O)c4ccc(-c5ccc(N(c6ccccc6)c6ccccc6)cc5)cc4)cc3)cc2)c2ccc(-c3ccc(N(c4ccccc4)c4ccccc4)cc3)cc2)C(OC(C)=O)CC1]
Precursor Compound No. 37
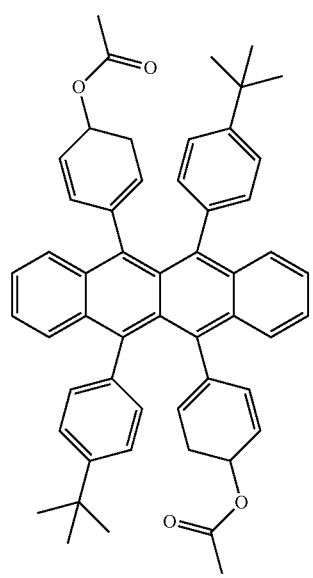 [SMILES: CC(=O)OC1C=CC(c2c3ccccc3c(-c3ccc(C(C)(C)C)cc3)c3c(C4=CCC(OC(C)=O)C=C4)c4ccccc4c(-c4ccc(C(C)(C)C)cc4)c23)=CC1]
Precursor Compound No. 38

TABLE 2-3-continued
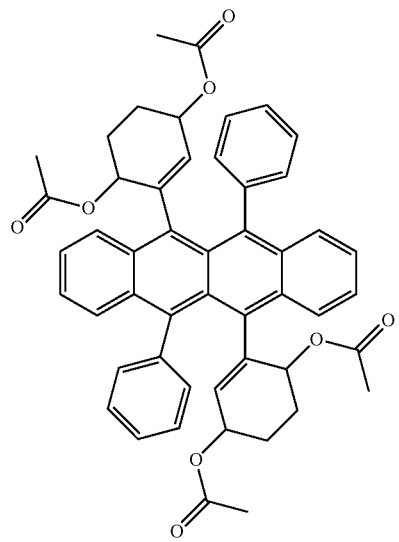 [SMILES: CC(=O)OC1C=C(c2c3ccccc3c(-c3ccccc3)c3c(C4=CC(OC(C)=O)CCC4OC(C)=O)c4ccccc4c(-c4ccccc4)c23)C(OC(C)=O)CC1]
Precursor Compound No. 39
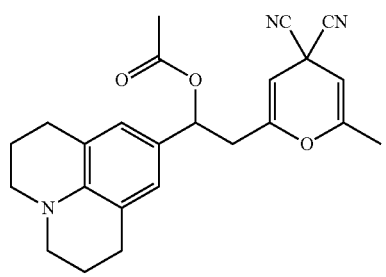 [SMILES: CC(=O)OC(CC1=CC(C#N)(C#N)C=C(C)O1)c1cc2c3c(c1)CCCN3CCC2]
Precursor Compound No. 40
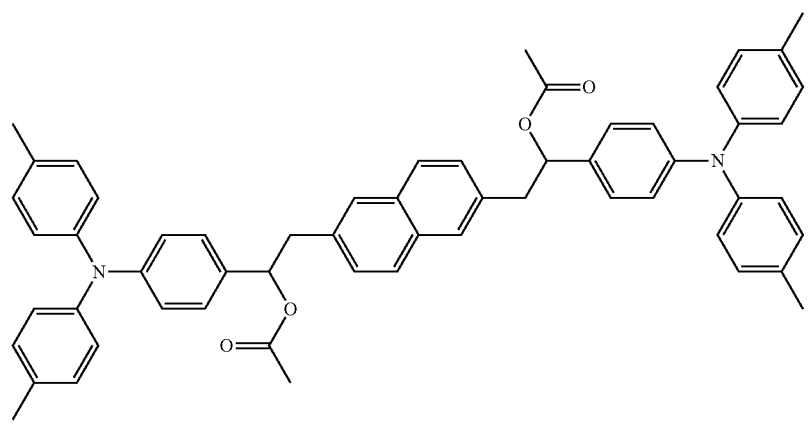 [SMILES: CC(=O)OC(Cc1ccc2cc(CC(OC(C)=O)c3ccc(N(c4ccc(C)cc4)c4ccc(C)cc4)cc3)ccc2c1)c1ccc(N(c2ccc(C)cc2)c2ccc(C)cc2)cc1]
Precursor Compound No. 41
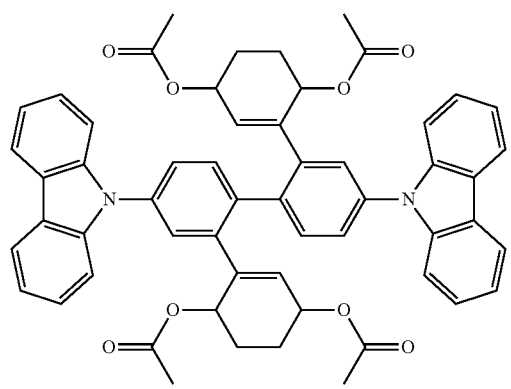 [SMILES: CC(=O)OC1C=C(c2cc(-n3c4ccccc4c4ccccc43)ccc2-c2ccc(-n3c4ccccc4c4ccccc43)cc2C2=CC(OC(C)=O)CCC2OC(C)=O)C(OC(C)=O)CC1]
Precursor Compound No. 42

TABLE 2-3-continued
Precursor Compound No. 43
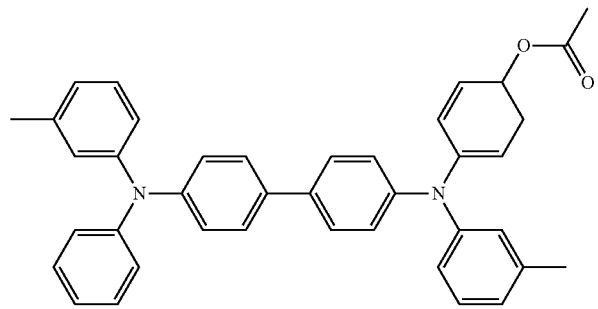 [SMILES: CC(=O)OC1C=CC(N(c2ccc(-c3ccc(N(c4ccccc4)c4cccc(C)c4)cc3)cc2)c2cccc(C)c2)=CC1]
Precursor Compound No. 44
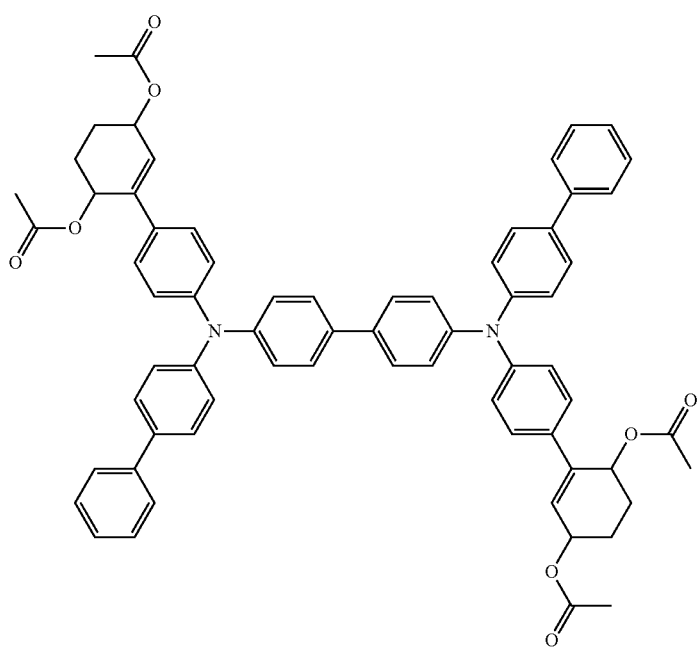 [SMILES: CC(=O)OC1C=C(c2ccc(N(c3ccc(-c4ccccc4)cc3)c3ccc(-c4ccc(N(c5ccc(C6=CC(OC(C)=O)CCC6OC(C)=O)cc5)c5ccc(-c6ccccc6)cc5)cc4)cc3)cc2)C(OC(C)=O)CC1]
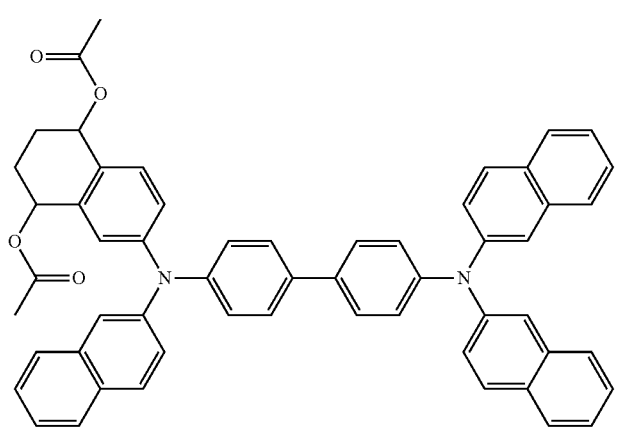 [SMILES: CC(=O)OC1CCC(OC(C)=O)c2cc(N(c3ccc(-c4ccc(N(c5ccc6ccccc6c5)c5ccc6ccccc6c5)cc4)cc3)c3ccc4ccccc4c3)ccc21]

TABLE 2-3-continued
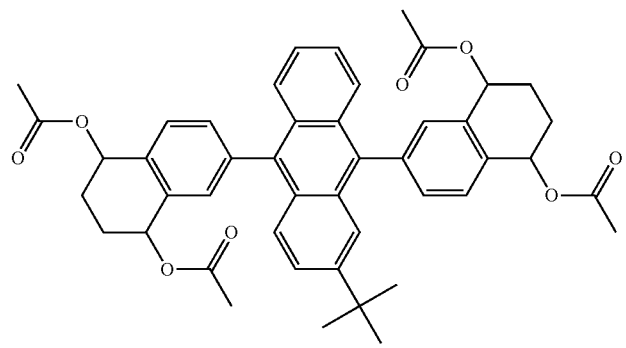 [SMILES: CC(=O)OC1CCC(OC(C)=O)c2cc(-c3c4ccccc4c(-c4ccc5c(c4)C(OC(C)=O)CCC5OC(C)=O)c4cc(C(C)(C)C)ccc34)ccc21]
Precursor Compound No. 45
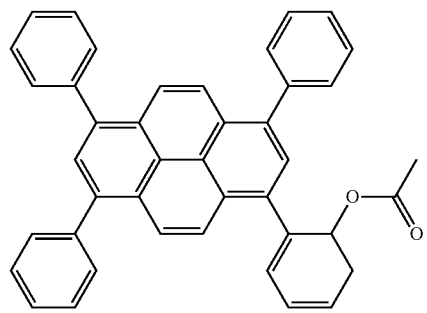 [SMILES: CC(=O)OC1CC=CC=C1c1cc(-c2ccccc2)c2ccc3c(-c4ccccc4)cc(-c4ccccc4)c4ccc1c2c43]
Precursor Compound No. 46
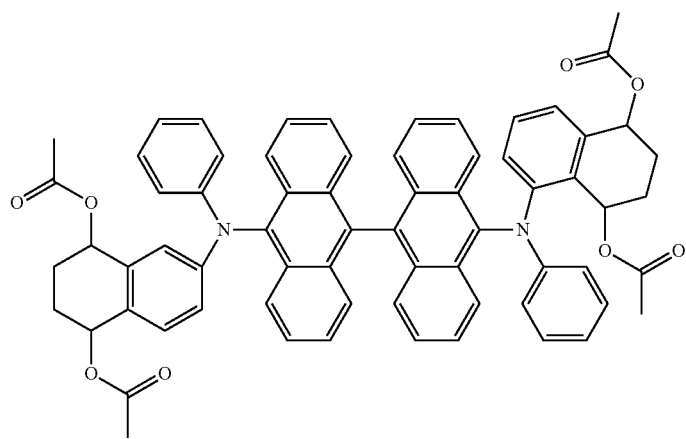 [SMILES: CC(=O)OC1CCC(OC(C)=O)c2cc(N(c3ccccc3)c3c4ccccc4c(-c4c5ccccc5c(N(c5ccccc5)c5cccc6c5C(OC(C)=O)CCC6OC(C)=O)c5ccccc45)c4ccccc34)ccc21]
Precursor Compound No. 47
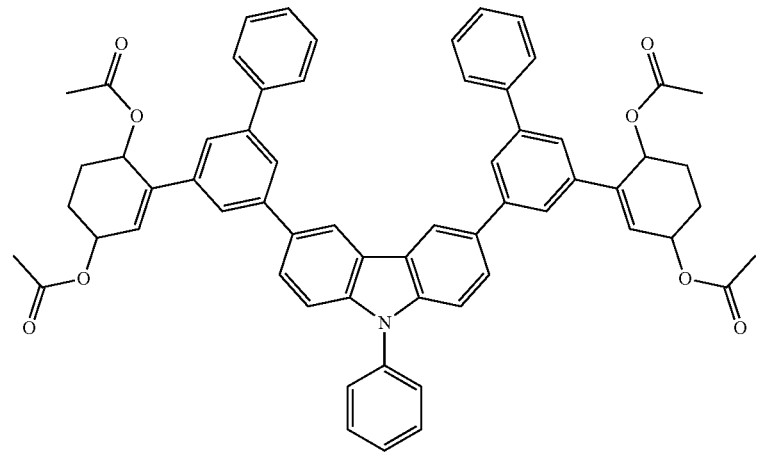 [SMILES: CC(=O)OC1C=C(c2cc(-c3ccccc3)cc(-c3ccc4c(c3)c3cc(-c5cc(C6=CC(OC(C)=O)CCC6OC(C)=O)cc(-c6ccccc6)c5)ccc3n4-c3ccccc3)c2)C(OC(C)=O)CC1]
Precursor Compound No. 48

TABLE 2-4
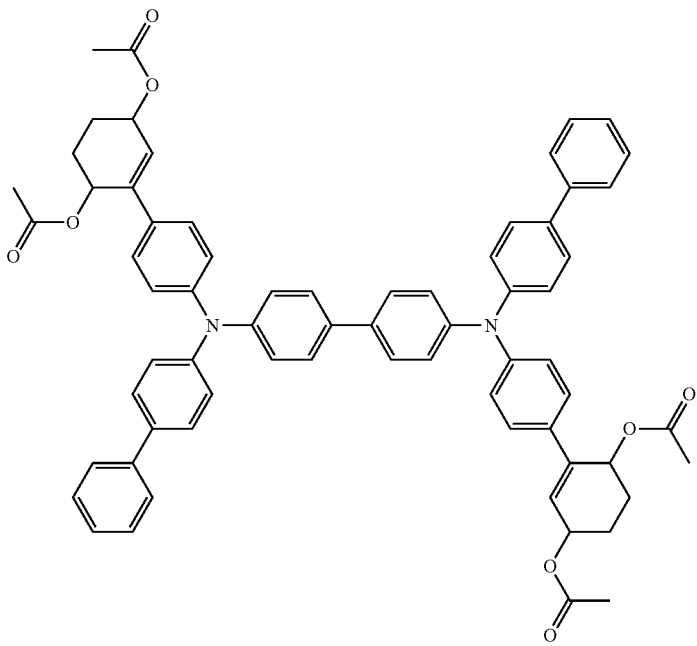 [SMILES: CC(=O)OC1C=C(c2ccc(N(c3ccc(-c4ccccc4)cc3)c3ccc(-c4ccc(N(c5ccc(C6=CC(OC(C)=O)CCC6OC(C)=O)cc5)c5ccc(-c6ccccc6)cc5)cc4)cc3)cc2)C(OC(C)=O)CC1]
Precursor compound No. 49
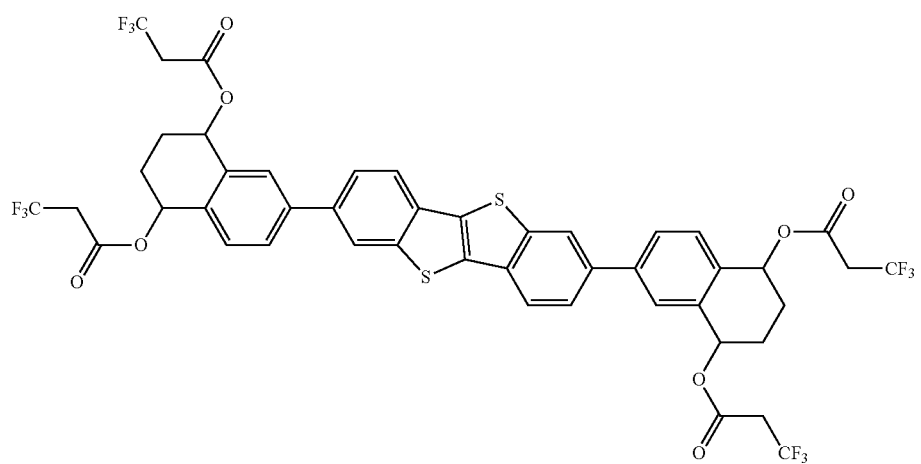 [SMILES: O=C(CC(F)(F)F)OC1CCC(OC(=O)CC(F)(F)F)c2cc(-c3ccc4c(c3)sc3c5ccc(-c6ccc7c(c6)C(OC(=O)CC(F)(F)F)CCC7OC(=O)CC(F)(F)F)cc5sc43)ccc21]
Precursor compound No. 50
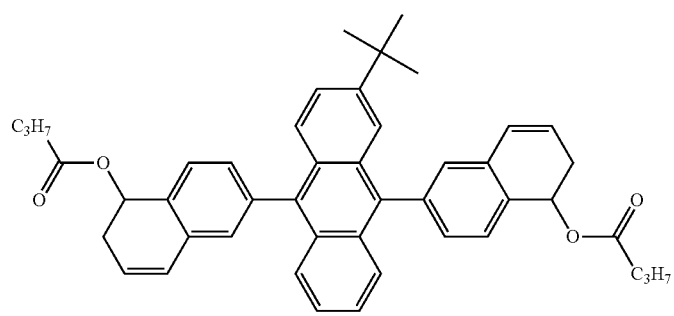
Precursor compound No. 51

TABLE 2-4-continued

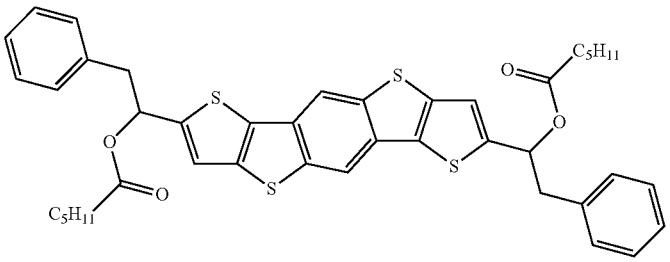

Precursor compound No. 52

By applying external energy to the π-electron conjugated compound precursor A-(B)m, the π-electron conjugated compound precursor A-(B)m is allowed to cause the below-described elimination reaction, so that the specific substituent can be eliminated to give the π-electron conjugated compound A-(C)m and also a luminescent organic film containing this compound can be obtained.

The following compounds (π-electron conjugated compound Nos. 1 to 36) are exemplified as specific examples of the π-electron conjugated compound A-(C)m formed from the above-exemplified π-electron conjugated compound precursor A-(B)m. The π-electron conjugated compounds in the present invention are not limited thereto.

TABLE 3-1

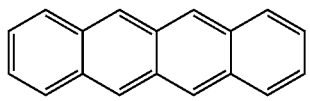 [SMILES: c1ccc2cc3cc4ccccc4cc3cc2c1]

π-Electron conjugated compound No. 1

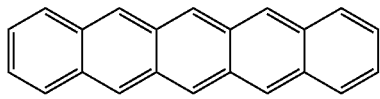 [SMILES: c1ccc2cc3cc4cc5ccccc5cc4cc3cc2c1]

π-Electron conjugated compound No. 2

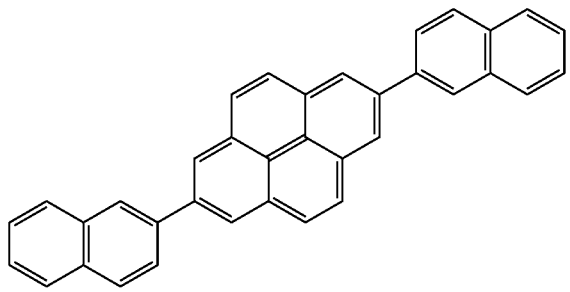 [SMILES: c1ccc2cc(-c3cc4ccc5cc(-c6ccc7ccccc7c6)cc6ccc(c3)c4c56)ccc2c1]

π-Electron conjugated compound No. 3

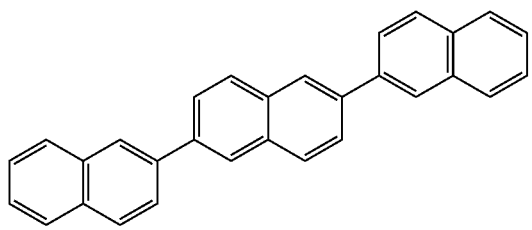 [SMILES: c1ccc2cc(-c3ccc4cc(-c5ccc6ccccc6c5)ccc4c3)ccc2c1]

π-Electron conjugated compound No. 4

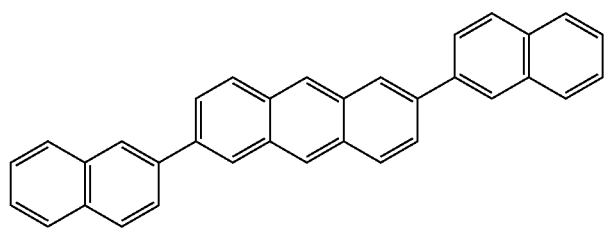 [SMILES: c1ccc2cc(-c3ccc4cc5cc(-c6ccc7ccccc7c6)ccc5cc4c3)ccc2c1]

π-Electron conjugated compound No. 5

TABLE 3-1-continued
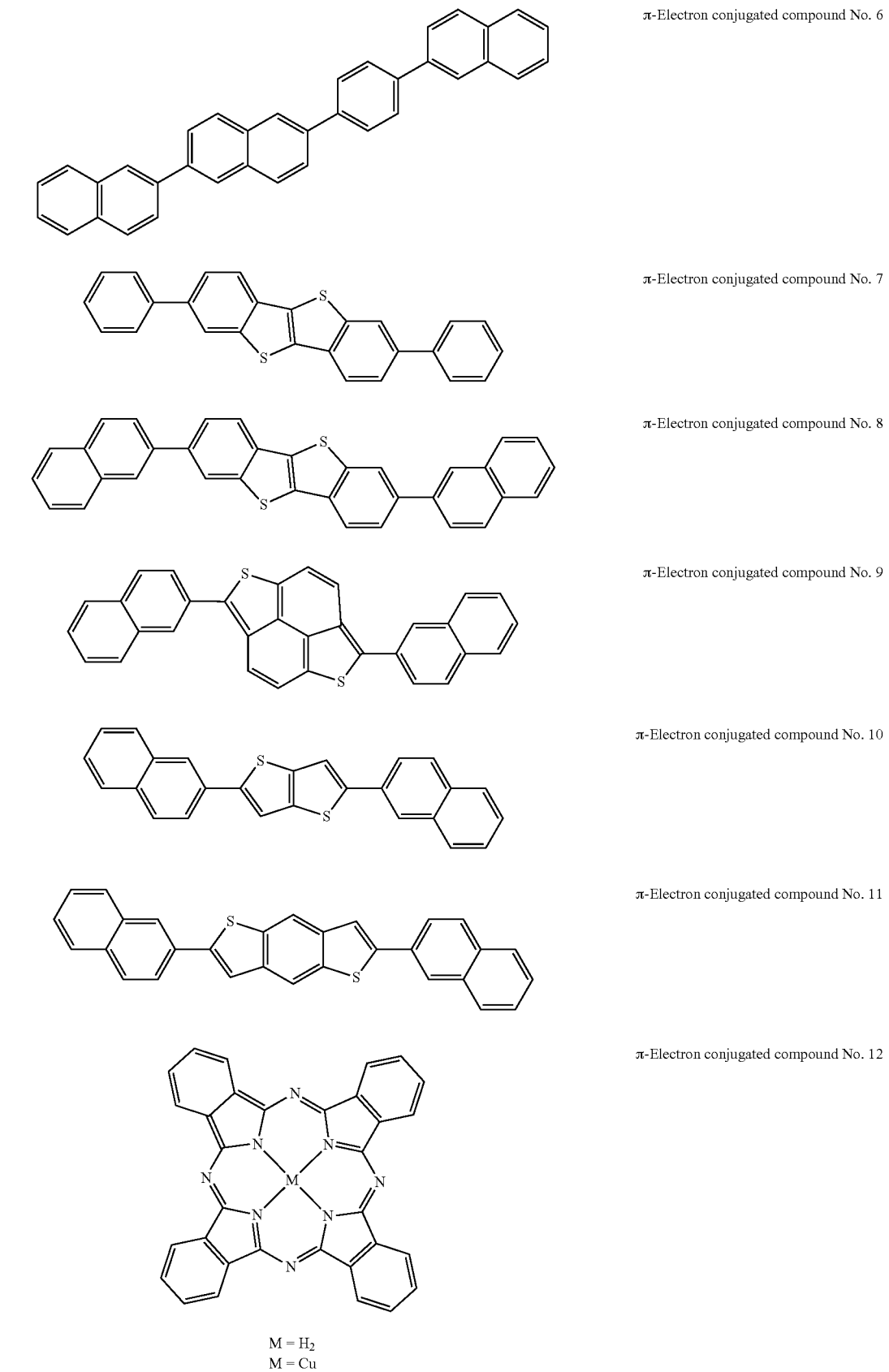
π-Electron conjugated compound No. 6
π-Electron conjugated compound No. 7
π-Electron conjugated compound No. 8
π-Electron conjugated compound No. 9
π-Electron conjugated compound No. 10
π-Electron conjugated compound No. 11
π-Electron conjugated compound No. 12
$M = H_2$
$M = Cu$ TABLE 3-1-continued
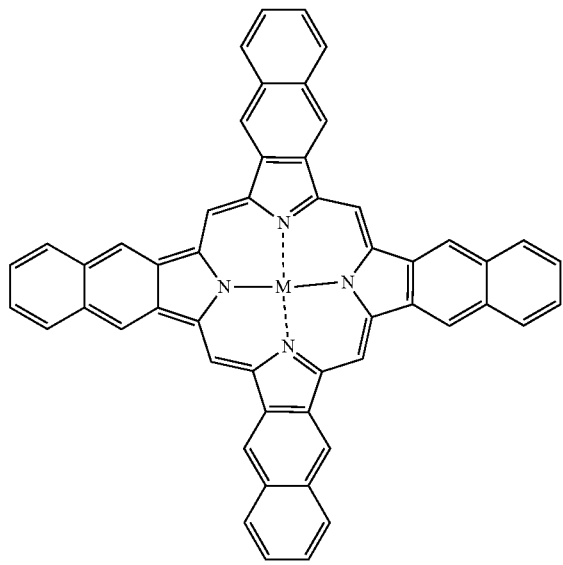
M = H₂
M = Cu
π-Electron conjugated compound No. 13
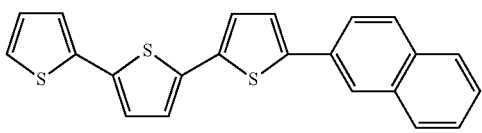 [SMILES: c1csc(-c2ccc(-c3ccc(-c4ccc5ccccc5c4)s3)s2)c1]
π-Electron conjugated compound No. 14
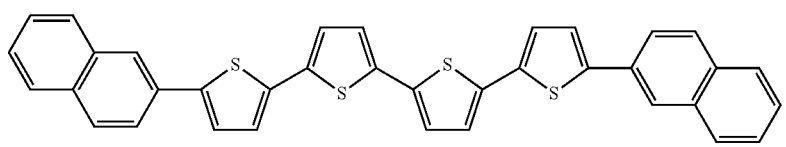 [SMILES: c1ccc2cc(-c3ccc(-c4ccc(-c5ccc(-c6ccc(-c7ccc8ccccc8c7)s6)s5)s4)s3)ccc2c1]
π-Electron conjugated compound No. 15
TABLE 3-2
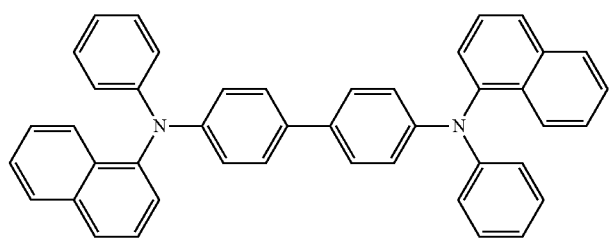 [SMILES: c1ccc(N(c2ccc(-c3ccc(N(c4ccccc4)c4cccc5ccccc45)cc3)cc2)c2cccc3ccccc23)cc1]
π-Electron conjugated compound No. 16
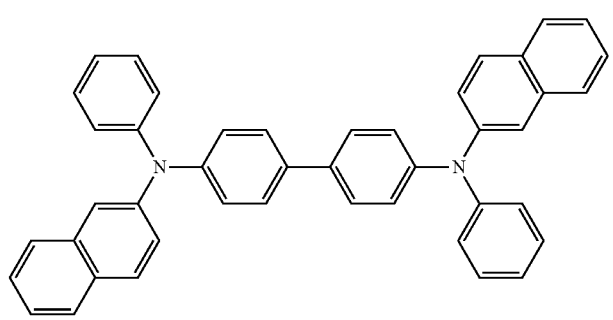 [SMILES: c1ccc(N(c2ccc(-c3ccc(N(c4ccccc4)c4ccc5ccccc5c4)cc3)cc2)c2ccc3ccccc3c2)cc1]
π-Electron conjugated compound No. 17

TABLE 3-2-continued
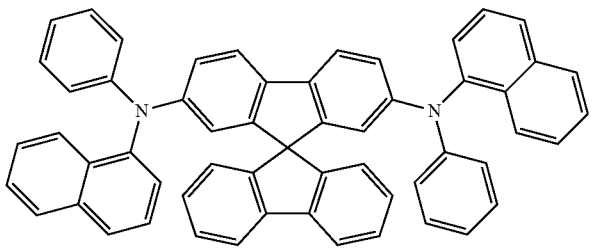 [SMILES: c1ccc(N(c2ccc3c(c2)C2(c4ccccc4-c4ccccc42)c2cc(N(c4ccccc4)c4cccc5ccccc45)ccc2-3)c2cccc3ccccc23)cc1]
π-Electron conjugated compound No. 18
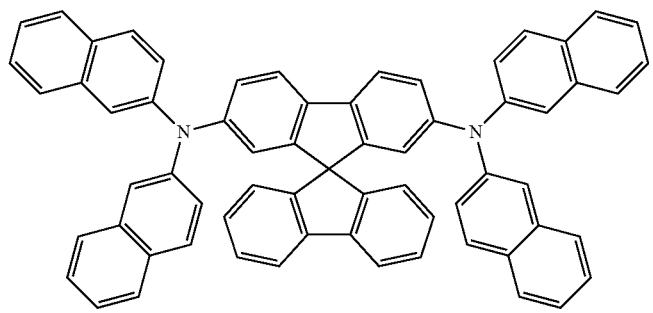 [SMILES: c1ccc2c(c1)-c1ccccc1C21c2cc(N(c3ccc4ccccc4c3)c3ccc4ccccc4c3)ccc2-c2ccc(N(c3ccc4ccccc4c3)c3ccc4ccccc4c3)cc21]
π-Electron conjugated compound No. 19
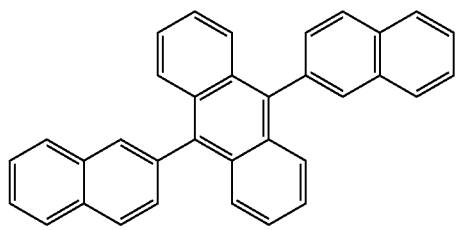 [SMILES: c1ccc2cc(-c3c4ccccc4c(-c4ccc5ccccc5c4)c4ccccc34)ccc2c1]
π-Electron conjugated compound No. 20
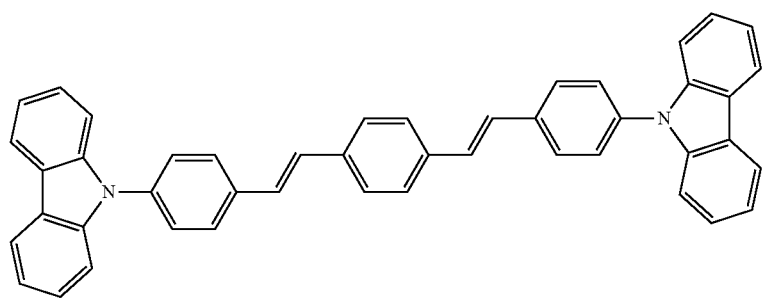 [SMILES: C(=C\c1ccc(-n2c3ccccc3c3ccccc32)cc1)/c1ccc(/C=C/c2ccc(-n3c4ccccc4c4ccccc43)cc2)cc1]
π-Electron conjugated compound No. 21
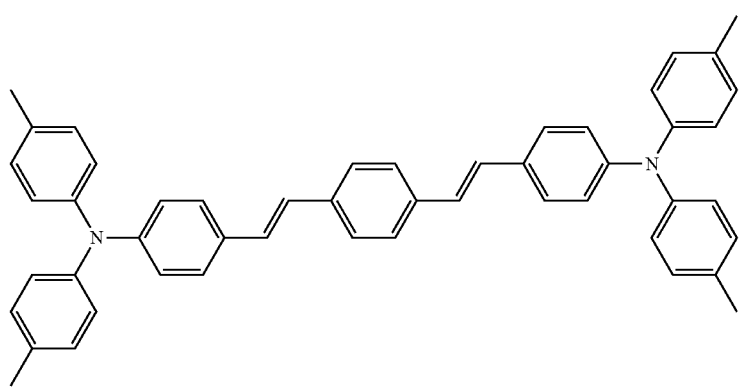 [SMILES: Cc1ccc(N(c2ccc(C)cc2)c2ccc(/C=C/c3ccc(/C=C/c4ccc(N(c5ccc(C)cc5)c5ccc(C)cc5)cc4)cc3)cc2)cc1]
π-Electron conjugated compound No. 22

TABLE 3-2-continued
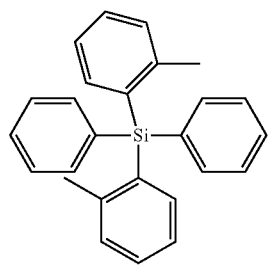 [SMILES: Cc1ccccc1[Si](c1ccccc1)(c1ccccc1)c1ccccc1C]
π-Electron conjugated compound No. 23
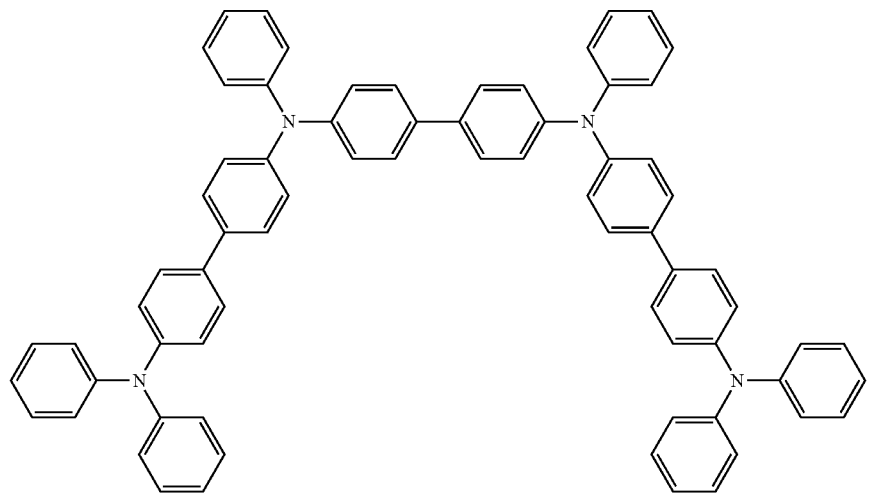 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1]
π-Electron conjugated compound No. 24
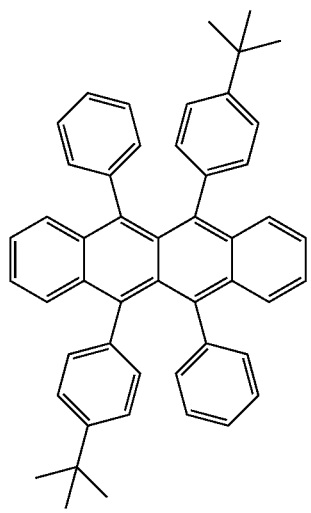 [SMILES: CC(C)(C)c1ccc(-c2c3ccccc3c(-c3ccccc3)c3c(-c4ccc(C(C)(C)C)cc4)c4ccccc4c(-c4ccccc4)c23)cc1]
π-Electron conjugated compound No. 25
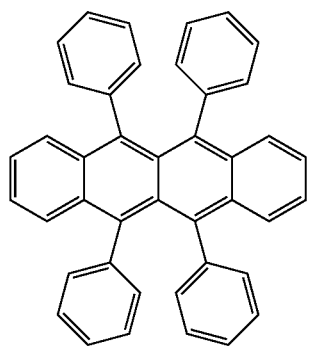 [SMILES: c1ccc(-c2c3ccccc3c(-c3ccccc3)c3c(-c4ccccc4)c4ccccc4c(-c4ccccc4)c23)cc1]
π-Electron conjugated compound No. 26

TABLE 3-2-continued
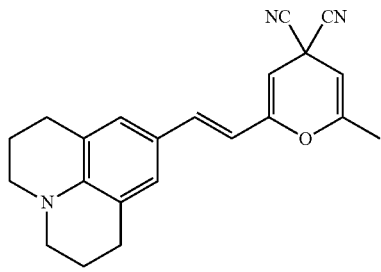 [SMILES: CC1=CC(C#N)(C#N)C=C(/C=C/c2cc3c4c(c2)CCCN4CCC3)O1]
π-Electron conjugated compound No. 27
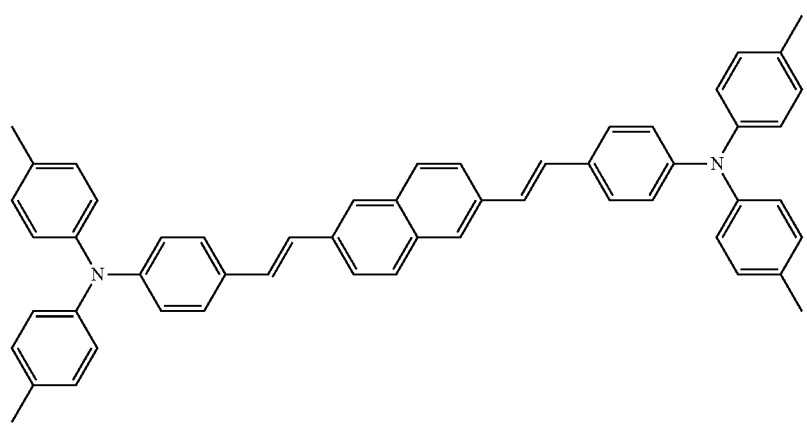 [SMILES: Cc1ccc(N(c2ccc(C)cc2)c2ccc(/C=C/c3ccc4cc(/C=C/c5ccc(N(c6ccc(C)cc6)c6ccc(C)cc6)cc5)ccc4c3)cc2)cc1]
π-Electron conjugated compound No. 28
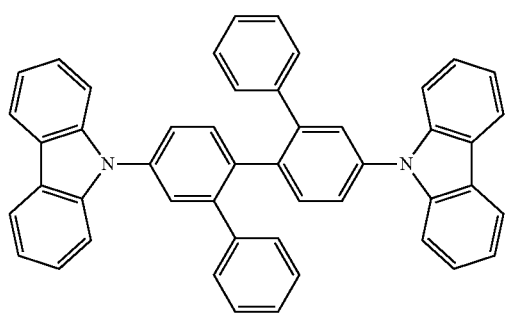 [SMILES: c1ccc(-c2cc(-n3c4ccccc4c4ccccc43)ccc2-c2ccc(-n3c4ccccc4c4ccccc43)cc2-c2ccccc2)cc1]
π-Electron conjugated compound No. 29
TABLE 3-3
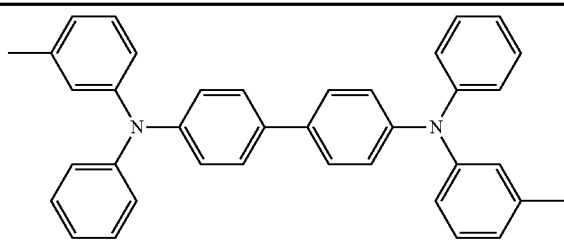
π-Electron conjugated compound No. 30

TABLE 3-3-continued
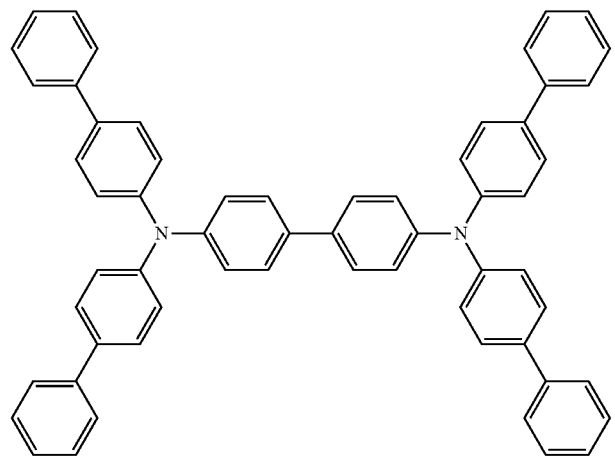 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]
π-Electron conjugated compound No. 31
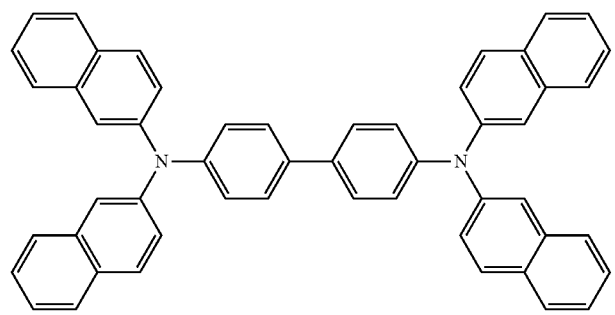 [SMILES: c1ccc2cc(N(c3ccc(-c4ccc(N(c5ccc6ccccc6c5)c5ccc6ccccc6c5)cc4)cc3)c3ccc4ccccc4c3)ccc2c1]
π-Electron conjugated compound No. 32
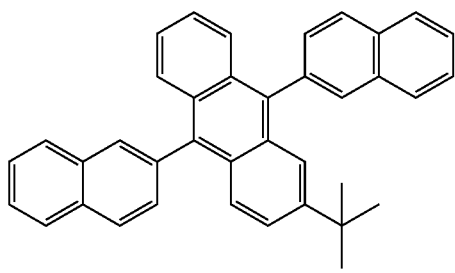 [SMILES: CC(C)(C)c1ccc2c(-c3ccc4ccccc4c3)c3ccccc3c(-c3ccc4ccccc4c3)c2c1]
π-Electron conjugated compound No. 33
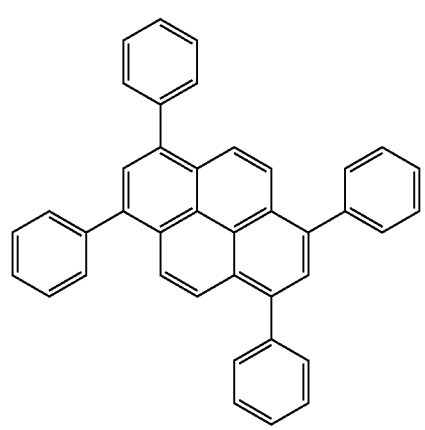 [SMILES: c1ccc(-c2cc(-c3ccccc3)c3ccc4c(-c5ccccc5)cc(-c5ccccc5)c5ccc2c3c54)cc1]
π-Electron conjugated compound No. 34

TABLE 3-3-continued
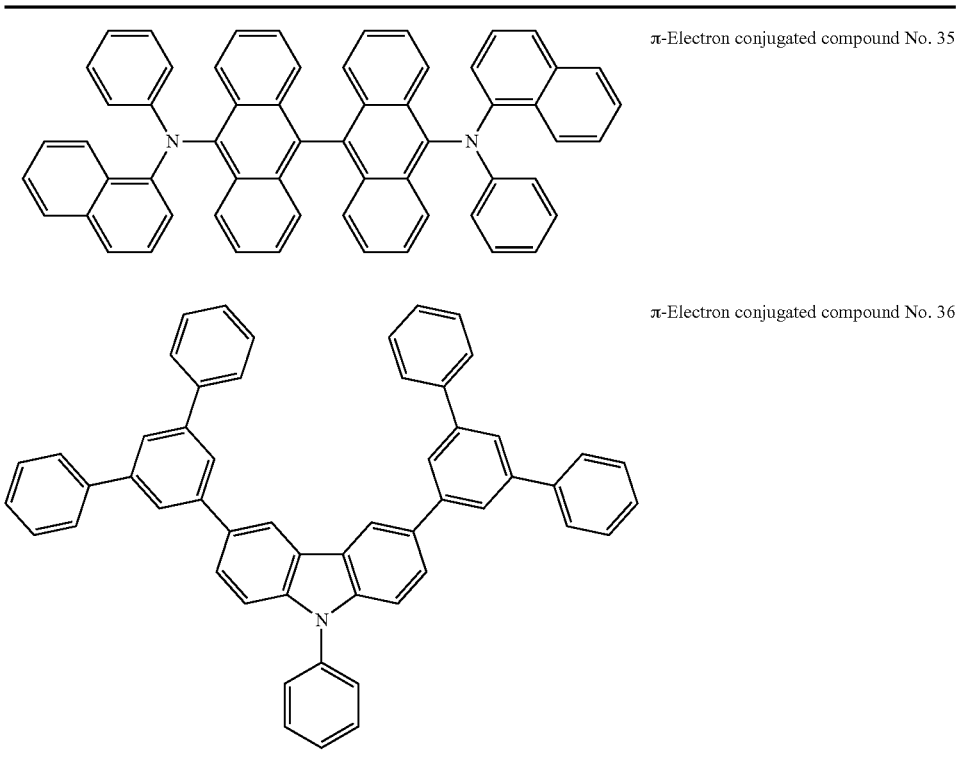
π-Electron conjugated compound No. 35
π-Electron conjugated compound No. 36
TABLE 3-4
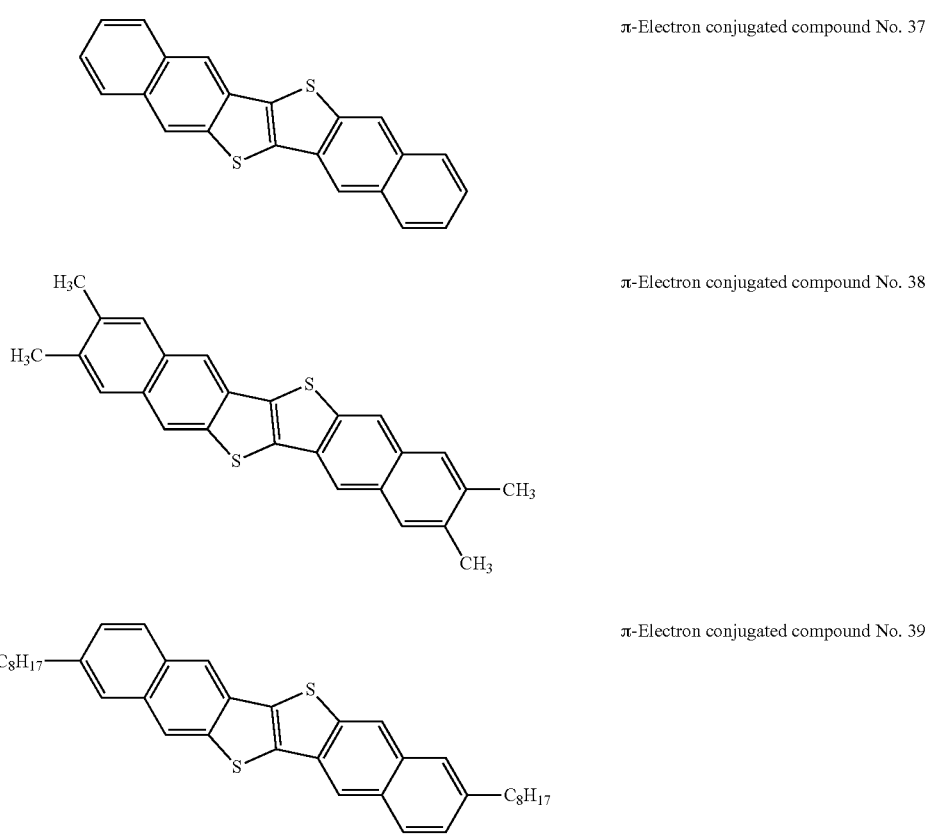
π-Electron conjugated compound No. 37
π-Electron conjugated compound No. 38
π-Electron conjugated compound No. 39

TABLE 3-4-continued

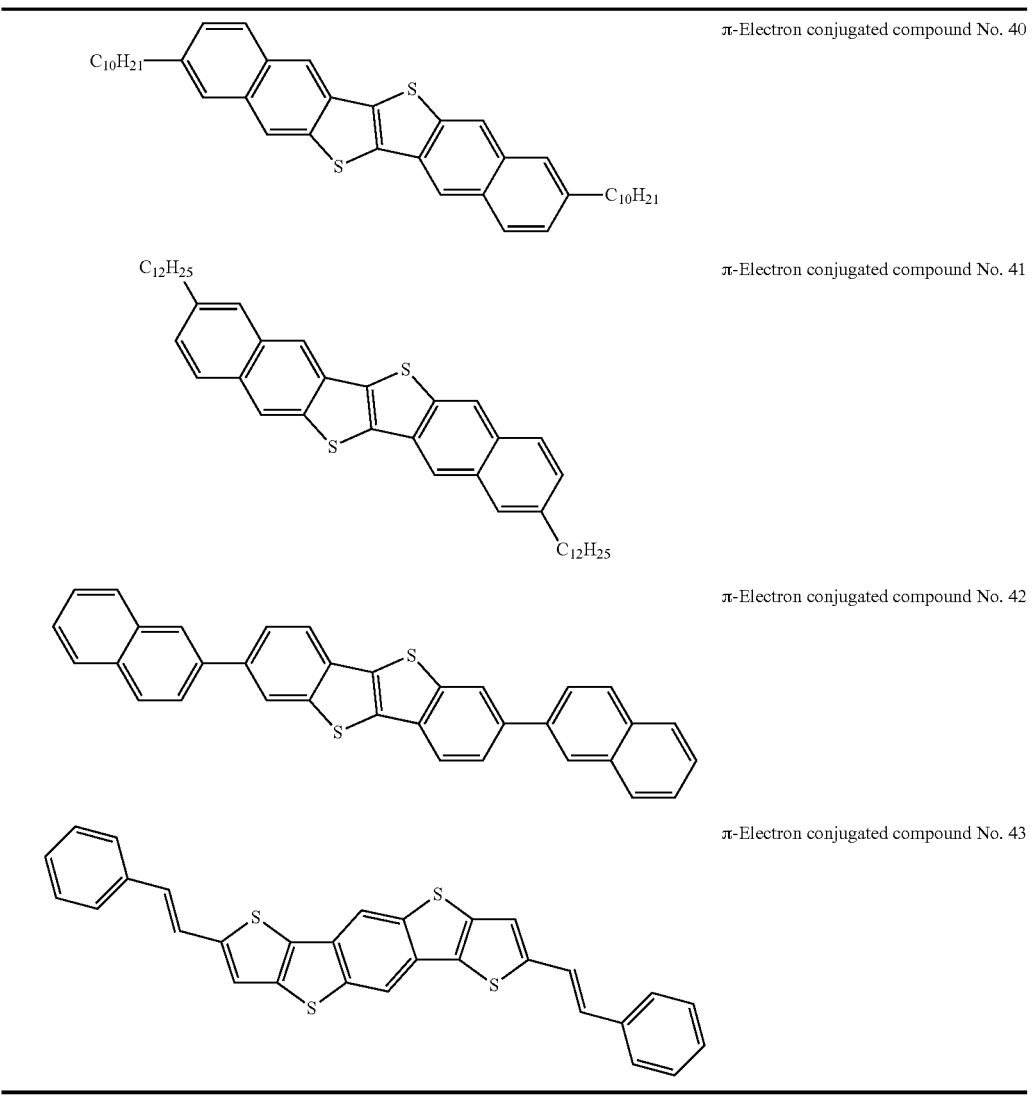

π-Electron conjugated compound No. 40

π-Electron conjugated compound No. 41

π-Electron conjugated compound No. 42

π-Electron conjugated compound No. 43

For further clarification, the following Table 3-5 shows a correspondence between the π-electron conjugated compound precursors A-(B)m exemplified in Tables 2-1, 2-2, 2-3 and 2-4 and the π-electron conjugated compounds A-(C)m (only those shown in Tables 3-1, 3-2, 3-3 and 3-4) which are obtained by applying external energy to the π-electron conjugated compound precursors A-(B)m. However, the π-electron conjugated compound precursors and the π-electron conjugated compounds in the present invention are not limited thereto.

TABLE 3-5

| Precursor compounds | π-Electron conjugated compounds obtained |
| --- | --- |
| Precursor compound 1 | π-Electron conjugated compound 2 |
| Precursor compound 2 | 1 |
| Precursor compound 3 | 2 |
| Precursor compound 4 | 2 |
| Precursor compound 5 | 3 |
| Precursor compound 6 | 4 |
| Precursor compound 7 | 6 |
| Precursor compound 8 | 5 |
| Precursor compound 9 | 8 |

TABLE 3-5-continued

| Precursor compounds | π-Electron conjugated compounds obtained |
| --- | --- |
| Precursor compound 10 | 8 |
| Precursor compound 11 | 37 |
| Precursor compound 12 | 38 |
| Precursor compound 13 | 39 |
| Precursor compound 14 | 40 |
| Precursor compound 15 | 41 |
| Precursor compound 16 | 9 |
| Precursor compound 17 | 10 |
| Precursor compound 18 | 10 |
| Precursor compound 19 | 10 |
| Precursor compound 20 | 11 |
| Precursor compound 21 | 11 |
| Precursor compound 22 | 11 |
| Precursor compound 23 | 8 |
| Precursor compound 24 | 8 |
| Precursor compound 25 | 12 |
| Precursor compound 26 | 13 |
| Precursor compound 27 | 15 |
| Precursor compound 28 | 10 |
| Precursor compound 29 | 16 |
| Precursor compound 30 | 17 |
| Precursor compound 31 | 18 |
| Precursor compound 32 | 19 |

TABLE 3-5-continued

| Precursor compounds | π-Electron conjugated compounds obtained |
|---|---|
| Precursor compound 33 | 20 |
| Precursor compound 34 | 21 |
| Precursor compound 35 | 22 |
| Precursor compound 36 | 23 |
| Precursor compound 37 | 24 |
| Precursor compound 38 | 25 |
| Precursor compound 39 | 26 |
| Precursor compound 40 | 27 |
| Precursor compound 41 | 28 |
| Precursor compound 42 | 29 |
| Precursor compound 43 | 30 |
| Precursor compound 44 | 32 |
| Precursor compound 45 | 33 |
| Precursor compound 46 | 34 |
| Precursor compound 47 | 35 |
| Precursor compound 48 | 36 |
| Precursor compound 49 | 31 |
| Precursor compound 50 | 8 |
| Precursor compound 51 | 33 |
| Precursor compound 52 | 43 |

—Luminescent Dye—

The luminescent dye is a guest π-electron conjugated compound in a luminescent organic film containing host-guest-type π-electron conjugated compounds. The luminescent dye is represented by General Formula A'-(C')m' and shows light emission at the longer wavelength side than in the above π-electron conjugated compound A-(C)m (host π-electron conjugated compound). The luminescent dyes may be used alone or in combination.

Also, the luminescent dye may be contained in the solution as a luminescent dye precursor A'-(B')m'. In this case, by applying external stimulus to the luminescent dye precursor A'-(B')m', the leaving substituent of the luminescent dye precursor A'-(B')m' is eliminated, so that the luminescent dye precursor A'-(B')m' is converted to a luminescent dye A'-(C')m' and an eliminated compound X'—Y' as shown in the following reaction formula (I'):

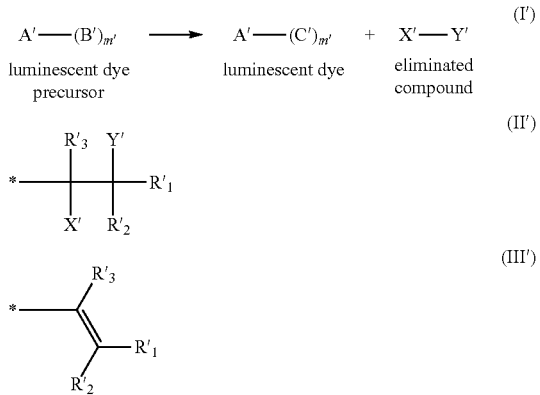

where in the reaction formula (I'), A' is a π-electron conjugated substituent, B' is a solvent-soluble substituent containing at least a structure represented by the above General Formula (II'), m' is a natural number, C' is a partial structure containing at least a structure represented by General Formula (III'), the solvent-soluble substituent B' in the luminescent dye precursor A'-(B')m' is linked via a covalent bond with an atom on the π-electron conjugated substituent A' or ring-fused with a carbon atom on the π-electron conjugated substituent A', and when m' is 2 or more, the solvent-soluble substituents B' which are 2 or more may be identical or different and may be linked together to form a ring; and in the General Formulas (II') and (III'), one of X' and Y' is a hydrogen atom and the other is the leaving substituent, $R'_1$, $R'_2$ and $R'_3$, which may be identical or different, are each a hydrogen atom or a substituent and may form a ring together or may form a ring via a covalent bond with the π-electron conjugated substituent A', and when m' is 2 or more, the leaving substituents of the solvent-soluble substituents B' which are 2 or more may be identical or different and may be linked together to form a ring.

Here, the A', B', $R'_1$, $R'_2$ and $R'_3$ are, for example, substituents similar to those which are A, B, $R_1$, $R_2$ and $R_3$ in the reaction formula (I) and General Formulas (II) and (III).

—Other Ingredients—

Examples of the other ingredients optionally contained in the solution include an organic solvent, an organic polymer, an inorganic material and a surfactant, Examples of the organic solvent include aromatic solvents which may have an alkoxy group and/or a halogen atom, such as benzene, toluene, xylene, ethylbenzene, diethylbenzene, anisole, chlorobenzene, dichlorobenzene and chlorotoluene; halogenated hydrocarbon solvents such as dichloromethane, dichloroethane, chloroform, carbon tetrachloride, tetrachloroethane and trichloroethane; ether solvents such as dibutyl ether, tetrahydrofuran and dioxane; linear or branched alcohol solvents such as methanol, ethanol, propanol, butanol, pentanol, hexanol, octanol, nonanol, cyclohexanol, methyl cellsolve, ethyl cellsolve, ethylene glycol and benzyl alcohol; and alkyl-substituted aromatic solvents which have 4 or more carbon atoms and may have a linear or branched alkyl group, such as butylbenzene, cyclohexyl benzene, tetralin and dodecylbenzene.

Examples of the organic polymer include polystyrenes, polyethylenes, polypropylenes, polyesters and polyurethanes. Further examples include organic semiconductor materials such as polythiophenes, polyphenylenes, polyphenylenevinylenes, polycarbazoles and polyfluorenes.

Examples of the inorganic material include inorganic fillers.

Subsequent to the description for various compounds in the method of the present invention for producing a luminescent organic film, detail description will be given to the coating step and the eliminating and converting step.

Examples of the substrate (support) to be coated with the solution include plastics, metals, silicone wafers and glass.

The method for coating the solution is not particularly limited and may be appropriately selected depending on the intended purpose. Examples thereof include known film forming methods such as a spin coating method, a casting method, a dipping method, an inkjetting method, a doctor blade method, a screen printing method, vacuum vapor deposition and sputtering. Any of these film forming methods can form an organic film containing the above π-electron conjugated compound precursor A-(B)m and the above luminescent dye (hereinafter the organic film may be referred to as "precursor-containing film"), the precursor-containing film is free of cracks and excellent in, for example, strength, toughness and durability.

In the precursor-containing film formed, external stimulus make the above leaving substituent eliminated from the π-electron conjugated compound precursor A-(B)m, so that the π-electron conjugated compound precursor A-(B)m is converted to the above π-electron conjugated compound A-(C)m and the above eliminated compound X—Y.

Energy applied as the above external stimulus for performing the elimination reaction of the leaving substituent is, for example, heat, light or electromagnetic waves. Among them, heat energy or light energy is preferred in terms of reactivity, yield or easiness of post treatments, with heat energy being particularly preferred. The above energy may be applied in the presence of an acid or a base.

The above elimination reaction generally depends on the structure of the above leaving functional group, but often requires heating as the external stimulus.

The heating method is not particularly limited and may be appropriately selected depending on the intended purpose. Examples thereof include a method for performing heating on the support, a method for performing heating in an oven, a method for performing irradiation with microwave, a method for performing heating by converting light to heat using a laser, and a method using a photothermal conversion layer.

The temperature in the above heating may be room temperature (about 25° C.) to 500° C. In consideration of thermal stability of the materials and the boiling point of the eliminated compound as to the lower limit of the temperature, while in consideration of energy efficiency, percentage of the presence of unconverted molecules, and the sublimation and decomposition of the compound after conversion as to the upper limit of the temperature, the temperature is preferably 40° C. to 500° C. Moreover, in consideration of thermal stability of the precursor during synthesis, the temperature is more preferably 60° C. to 500° C., particularly preferably 80° C. to 400° C.

As to the period for which the heating is performed, the higher the temperature is, the shorter the reaction time becomes, while the lower the temperature is, the longer the time required for elimination reaction becomes. The period for which the heating is performed depends on the reactivity and amount of the π-electron conjugated compound precursor but is generally 0.5 min to 120 min, preferably 1 min to 60 min, more preferably 1 min to 30 min.

In the case where light is used as the external stimulus, infrared lamp or irradiation of light having a wavelength absorbed by the compound (for example, exposure to light having a wavelength of 405 nm or shorter) may be used. On this occasion, a semiconductor laser may be used. Examples of the light include near-infrared region laser beams (generally, laser beams having a wavelength of around 780 nm), visible laser beams (generally, laser beams having a wavelength in the range of 630 nm to 680 nm), laser beams having a wavelength of 390 nm to 440 nm, and semiconductor laser beams having a wavelength of 440 nm or shorter. Among them, preferred are laser beams having a wavelength of 390 nm to 440 nm and semiconductor laser beams having an emission wavelength of 440 nm or shorter. More preferred are bluish-violet semiconductor laser beams having an emission wavelength of 390 nm to 440 nm (preferably from 390 nm to 415 nm) and bluish-violet SHG laser beams having a center emission wavelength of 425 nm which is a half wavelength of the infrared semiconductor laser beams having a center emission wavelength of 850 nm by using an optical waveguide element.

The acid or base serves as a catalyst in the elimination reaction and enables conversion to be performed at low temperatures. No particular limitation is imposed on the manner in which the acid or base is used. Examples thereof include: a manner in which the acid or base is directly added to the reaction system; a manner in which the acid or base is dissolved in any solvent to prepare a solution and the thus-prepared solution is added to the reaction system; a manner in which the acid or base is vaporized and heating treatment is performed in an atmosphere containing the vaporized acid or base; and a manner in which a photoacid generator or a photobase generator is added to the reaction system, followed by irradiation with light, to thereby obtain an acid or a base in the reaction system.

Examples of the acid include hydrochloric acid, nitric acid, sulfuric acid, acetic acid, trifluoroacetic acid, trifluoromethanesulfonic acid, formic acid, phosphoric acid and 2-butyl octanoic acid.

Examples of the base include: hydroxides such as sodium hydroxide and potassium hydroxide; carbonates such as sodium hydrogen carbonate, sodium carbonate and potassium carbonate; amines such as triethylamine and pyridine; and amidines such as diazabicycloundecene and diazabicyclononene.

Examples of the photoacid generator include: ionic photoacid generators such as sulfonium salts and iodonium salts; and nonionic photoacid generators such as imide sulfonate, oxime sulfonate, disulfonyl diazomethane and nitrobenzyl sulfonate.

The π-electron conjugated compound precursor A-(B)m is preferably used in the production of a luminescent organic film containing a host π-electron conjugated compound and a guest π-electron conjugated compound (luminescent dye). Since the luminescent organic film contains the host π-electron conjugated compound as a main ingredient, the effects of the present invention can be obtained when the host π-electron conjugated compound is formed from the π-electron conjugated compound precursor A-(B)m. Also, in the case where the amount of the guest π-electron conjugated compound doped is 1% by mass or more, the effects of the present invention can be obtained to a greater extent when the guest π-electron conjugated compound (luminescent dye) is contained in the solution as the luminescent dye precursor A'-(B')m'.

Here, the doping concentration of the luminescent dye in the luminescent organic film (i.e., the concentration of the luminescent dye with which the luminescent organic film is doped) is determined by the amount of the luminescent dye relative to the π-electron conjugated compound precursor A-(B)m in the solution.

That is, when a solution containing the π-electron conjugated compound precursor A-(B)m and the luminescent organic dye mixed together at a predetermined mixing ratio is subjected to the eliminating and converting step, it is possible to form a luminescent organic film containing the host-guest-type π-electron conjugated compounds at a controlled doping concentration. The above luminescent organic dyes may be used alone or in combination.

Alternatively, the luminescent dye may be contained in the solution as the luminescent dye precursor A'-(B')m'. In this case, the doping concentration of the luminescent dye A'-(C')m' in the luminescent organic film (i.e., the concentration of the luminescent dye A'-(C')m' with which the luminescent organic film is doped) is determined by the amount of the luminescent dye precursor A'-(B')m' relative to the π-electron conjugated compound precursor A-(B)m in the solution.

That is, the mixing ratio of the π-electron conjugated compound precursor A-(B)m and the luminescent dye precursor A'-(B')m' controls the mixing ratio of the π-electron conjugated compound A-(C)m and the luminescent organic dye A'-(C')m' which are formed in the eliminating and converting step. Thus, after the eliminating and converting step, it is possible to form a luminescent organic film containing the host-guest-type π-electron conjugated compounds at a controlled doping concentration.

Here, when the luminescent organic dye A'-(C')m' formed after the eliminating and converting step emits fluorescent or phosphorescent light by the action of external stimulus (light, current, heat or pressure) (i.e., when the luminescent organic dye A'-(C')m' is a luminescent π-electron conjugated compound), the organic film containing the π-electron conjugated compound serves as a luminescent organic film.

When the solution containing the π-electron conjugated compound precursor and at least one kind of a luminescent dye at a controlled doping concentration is used to form a precursor film by a coating method such as printing and external stimulus such as heat or light is applied to the formed precursor film, it is possible to obtain a luminescent organic film where the π-electron conjugated compound (host material), which is a poorly-soluble converted molecule, is uniformly doped with the luminescent dye (guest molecule) at a strictly controlled doping concentration. This is a remarkably excellent effect exerted by the present invention.

The π-electron conjugated compound A-(C)m (host material) formed through elimination/conversion reaction from the π-electron conjugated compound precursor A-(B)m is not particularly limited and may be appropriately selected depending on the intended purpose so long as it shows light emission at the shorter wavelength side than in the luminescent dye (guest material). For example, it may be a compound having an olefin structure with a π-electron conjugated plane. However, a molecule forming an olefin structure after elimination/conversion reaction generally has an extended conjugation structure and shows light emission at longer wavelengths. Thus, it is preferable to suitably use the π-electron conjugated compound A-(C)m containing a ring structure with a π-electron conjugated plane.

—Eliminated Compound—

The eliminated compound X—Y is, for example, a carboxylic acid corresponding to the leaving substituent; e.g., a carboxylic acid that is obtained by cleaving the —O— bonding site in the acyloxy group which is the leaving substituent and replacing the end of the resultant product with hydrogen. Examples of the above carboxylic acid include formic acid, acetic acid, propionic acid, butyric acid, valeric acid, isovaleric acid, pivalic acid, caproic acid, lauric acid, stearic acid, trifluoroacetic acid, 3,3,3-trifluoropropionic acid, pentafluoropropionic acid, cyclopropanoic acid, cyclobutanoic acid, cyclohexanoic acid, benzoic acid, p-methoxybenzoic acid and pentafluorobenzoic acid.

The eliminated compound X—Y can be in any of three states of solid, liquid and gas. In view of removal of the eliminated component to the outside of the reaction system, the eliminated compound is preferably liquid or gas. More preferably, the eliminated compound is gas at normal temperature or forms into gas at a temperature for performing elimination reaction.

The boiling point of the eliminated compound in an atmospheric pressure (1,013 hPa) is preferably 500° C. or lower. From the viewpoints of easiness of removal of the eliminated compound to the outside of the reaction system, and the temperature of decomposition or sublimation of the π-electron conjugated compound to be generated, the boiling point thereof is more preferably 400° C. or lower, particularly preferably 300° C. or lower.

Taking as one example the π-electron conjugated compound precursor A-(B)m where X is an acyloxy group containing a substituent $R_6$, Y is a hydrogen atom and $R_6$ is a substituted or unsubstituted alkyl group, conversion of the π-electron conjugated compound precursor A-(B)m to the π-electron conjugated compound A-(C)m and the eliminated compound X—Y is shown in the following reaction formula (XII), which should not be construed as limiting the present invention thereto.

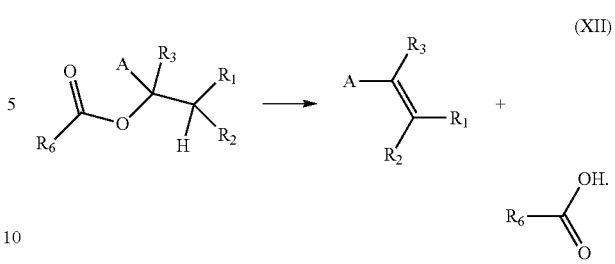

In this example, elimination/conversion reaction proceeds as shown in the reaction formula (XII) by application of external energy. Specifically, a carboxylic acid containing an alkyl chain is eliminated, so that the π-electron conjugated compound precursor A-(B)m is converted to have a structure containing an olefin structure. When the heating temperature is higher than the boiling point of the carboxylic acid, the carboxylic acid becomes gas.

Roughly described is a mechanism with which the eliminated compound is eliminated from the π-electron conjugated compound precursor A-(B)m in the above reaction formula (XII).

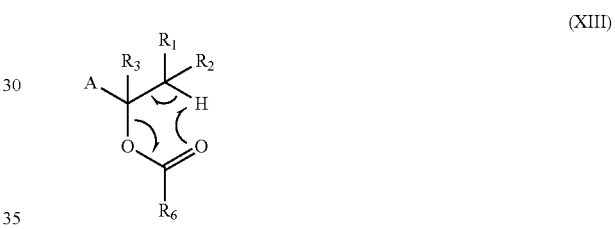

As shown in the above General Formula (XIII), the π-electron conjugated compound precursor A-(B)m is in a transition state of a six-membered ring structure. In this transition state, the hydrogen atom on the β-carbon and the oxygen atom of the carbonyl group are 1,5-transposed to cause concerted elimination reaction, so that a carboxylic acid is removed and as a result the π-electron conjugated compound precursor A-(B)m is converted to have an olefin structure as shown in the reaction formula (XII).

Here, not only an oxygen atom but also a chalcogen atom such as selenium, tellurium or polonium which belongs to the same Group 16 can abstract the hydrogen atom on the β-carbon to cause similar elimination and conversion.

(Luminescent Organic Film)

A luminescent organic film of the present invention is a luminescent organic film produced by the above-described method of the present invention for producing a luminescent organic film.

The luminescent organic film contains at least the above-described π-electron conjugated compound A-(C)m and at least one kind of the above-described luminescent dye; and, if necessary, further contains other ingredients. The π-electron conjugated compound A-(C)m preferably shows light emission at the shorter wavelength side than in the luminescent dyes.

The luminescent organic film can suitably be used as various materials for functional elements such as photoelectric conversion elements, thin-film transistor elements and luminescent elements.

(Electronic Device)

An electronic device of the present invention contains at least the luminescent organic film of the present invention; and, if necessary, further contains other members.

The luminescent organic film of the present invention can suitably be used in electronic devices, for example. Examples of the electronic devices include devices having two or more electrodes in which current and voltage between the electrodes are controlled by, for example, electricity, light, magnetism or chemical materials; and apparatuses for generating light, electrical field or magnetic field by application of voltage or current. Moreover, examples thereof include elements for controlling current or voltage by application of voltage or current, elements for controlling voltage or current by application of magnetic field, and elements for controlling voltage or current by action of a chemical material. For this control, rectification, switching, amplification or oscillation are used, for example.

As electronic devices currently realized using an inorganic semiconductor such as silicon, resistors, rectifiers (diodes), switching elements (transistors and thyristors), amplifying elements (transistors), memory elements, chemical sensors, and combinations or integrated devices of these elements are exemplified. Additionally, solar batteries in which electromotive force generated by light, photodiodes for generating photocurrent, and photoelements such as phototransistors are also exemplified.

As a suitable electronic device to which the luminescent organic thin film of the present invention is applied, an organic electroluminescence element (organic EL element or OLED) is exemplified. Hereinafter, the organic EL element will be described in detail.

The organic electroluminescence element in the present invention is suitably formed as follows: the above-described π-electron conjugated compound precursor A-(B)m alone or in combination with other organic compounds is formed into a thin film by, for example, the solution coating method, and the resultant thin film is preferably provided thereon with other functional layers and held between an anode and a cathode.

The organic EL element of the present invention is an organic electroluminescence element containing one or more organic layers between a pair of electrodes where at least one of the organic layers is a luminescent organic film containing a guest material and a host material which are obtained from a solution containing the π-electron conjugated compound precursor A-(B)m and at least one kind of the luminescent dye. However, the structure of the organic EL element is not particularly limited. FIGS. 1A to 1E are schematic views of preferable embodiments of layer structures which the organic EL elements of the present invention have.

An organic EL element (8) illustrated in FIG. 1A includes a substrate (1); and an anode (2), a luminescent layer (4) and a cathode (7) which are laminated on the substrate (1). Each of the anode (2) and the cathode (7) is connected to one end of a conductive wire, the other end of which is connected to a power source.

Figure 1B:
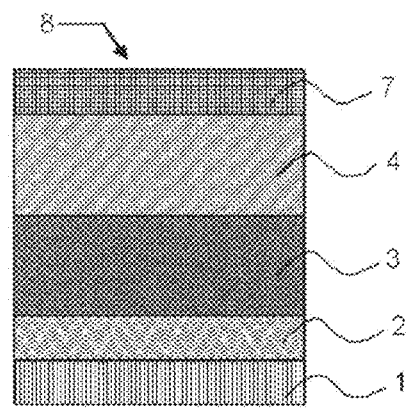

An organic EL element (8) illustrated in FIG. 1B is the same as that of FIG. 1A except that a hole transport layer (3) is provided between an anode (2) and a luminescent layer (4).

Figure 1C:
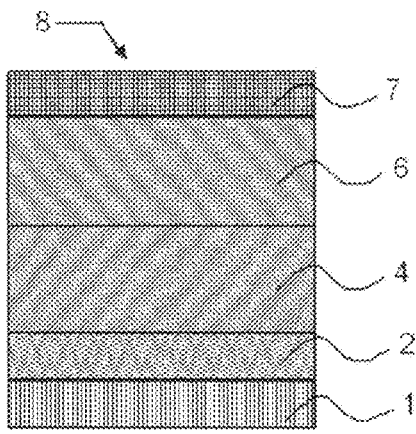

An organic EL element (8) illustrated in FIG. 1C is the same as that of FIG. 1A except that an electron transport layer (6) is provided between a luminescent layer (4) and a cathode (7).

Figure 1D:
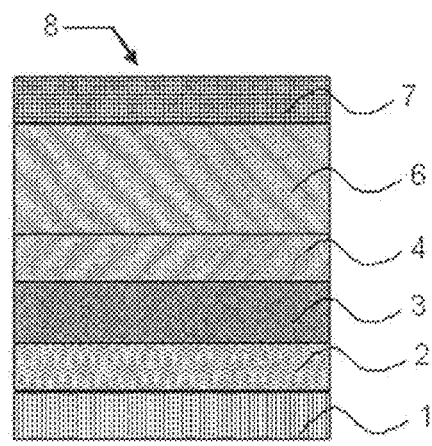

An organic EL element (8) illustrated in FIG. 1D includes a substrate (1); and an anode (2), a hole transport layer (3), a luminescent layer (4), an electron transport layer (6) and a cathode (7) which are laminated on the substrate (1).

Figure 1E:
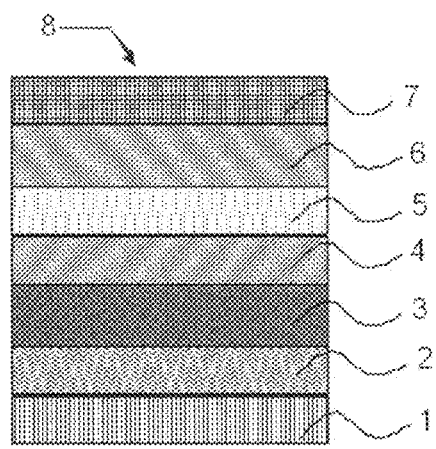

An organic EL element (8) illustrated in FIG. 1E includes a substrate (1); and an anode (2), a hole transport layer (3), a luminescent layer (4), an exciton barrier layer (5), an electron transport layer (6) and a cathode (7) which are laminated on the substrate (1).

The substrate of the organic EL elements illustrated in FIGS. 1A to 1E may be one generally used for organic EL elements. Preferred examples thereof include, but not limited to, glass substrates, silicon substrates and plastic substrates excellent in, for example, surface smoothness and water proofness.

The anode (2) is not particularly limited and may be appropriately selected depending on the intended purpose. The anode has a role of injecting holes to an organic layer such as a hole transport layer and preferably has a high work function. Examples of materials usable for the anode include: metals, alloys and compounds having high work functions such as nickel, gold, platinum, palladium, alloys thereof, tin oxide ($SnO_2$), zinc oxide ($ZnO_2$) containing acceptor impurities, and copper iodide; and electroconductive polymers such as poly(3-methylthiophene) and polypyrroles. The anode (2) may also be formed of a transparent electroconductive material. For example, a transparent electrode formed of indium tin oxide (ITO) is suitably used in consideration of, for example, electroconductivity, light transparency and etching processability. Indium-zinc oxide (IZO: $In_2O_3$—ZnO) may also be used. Furthermore, the anode (2) may have a structure where the above transparent electroconductive material deposited on a reflective electrode such as a silver electrode. The film thickness of the anode (2) depends on a type of the material used but is generally 10 nm to 1 μm, preferably 50 nm to 200 nm.

The cathode (7) is not particularly limited and may be appropriately selected depending on the intended purpose. The cathode (7) has a role of injecting electrons to an organic layer and preferably has a low work function. As the cathode (7) is suitably used a magnesium-silver alloy electrode, a magnesium-indium alloy electrode, an aluminum electrode, or a combination of a thin interface layer and an aluminum layer. The film thickness of the cathode (7) depends on a type of the material used but is generally 10 nm to 1 μm, preferably 50 nm to 200 nm.

The organic EL element of the present invention contains a luminescent organic film, as at least one of the layers between the anode (2) and the cathode (7), which contains a guest material (luminescent dyes) and a host material (π-electron conjugated compound A-(C)m) which are obtained from a solution containing the π-electron conjugated compound precursor A-(B)m and at least one kind of the luminescent dye. It is preferable that the luminescent layer (4) is the luminescent organic film of the present invention, but the present invention is not limited thereto and other layers may contain the luminescent organic film of the present invention to thereby show light emission derived from the fluorescent or phosphorescent material therein.

The π-electron conjugated compound precursor A-(B)m used as a precursor of the host material is not particularly limited and examples thereof include anthracene derivatives, carbazole derivatives and triphenylamine derivatives.

When the host material is a stilbene derivative having an elefin site, the resultant element generally has poor durability. Moreover, the conjugation structure is extended and as a result the triplet level becomes low. Thus, the stilbene derivative is not suitable as a host material for an efficient phosphorescent material. Among them, anthracene derivatives, carbazole derivatives are preferably used.

The luminescent dyes used as the guest material is not particularly limited and may be appropriately selected depending on the intended purpose. Examples thereof include fluorescent materials and phosphorescent materials.

Examples of the fluorescent materials include anthracene derivatives, perylene derivatives, rubrene derivatives, coumarin derivatives, stilbene derivatives, tristyrylarylene derivatives and distyrylarylene derivatives. Among them, preferred are anthracene derivatives and distyrylarylene derivatives, examples of which include diphenylaminovinylarylene.

As the phosphorescent materials are suitably used iridium complexes, examples of which include: tris-(2-phenylpyridine)iridium (Ir(ppy)$_3$) able to emit green light; bis(2-(2-benzo-4,5-athienylpyridinato-N,C3)iridiumacetylacetonate (Btp2Iracac) able to emit red light; and bis(3,5-difluoro-2-(2-pyridyl)phenyl-(2-carboxypyridyl)iridium III able to emit blue light.

The hole transport material is not particularly limited and may be appropriately selected depending on the intended purpose from those generally used for organic EL elements. Suitable examples thereof include aromatic amines such as triarylamine derivatives. Specific examples include N,N'-di(1-naphthyl)-N,N'-diphenylbenzidine (α-NPD), 4,4',4"-tris[3-methylphenyl(phenyl)-amino]triphenylamine (m-MTDATA), 4,4',4"-tris[2-naphthyl(phenyl)amino]triphenylamine (2-TNATA), 4,4',4"-tris(carbazol-9-yl)-triphenylamine (TCTA) and 2,2',7,7'-tetrakis(N,N-diphenylamino)-9,9'-spirobifluorene (spiro-TAD). These hole transport materials may be used alone or in combination.

The electron transport material is not is not particularly limited and may be appropriately selected depending on the intended purpose from those generally used for organic EL elements. Examples thereof include tris(8-hydroxyquinolinato)aluminum(III) (Alq3), oxadiazole derivative (2-(4'-t-butylphenyl)-5-(4"-biphenylyl)-1,3,4-oxadiazole (tBu-PBD) and dimerized or starburst oxadiazole derivatives. These compounds may be used alone or in combination.

In addition to the luminescent layer, the carrier transport layers and the carrier injection layers may be doped with the luminescent dyes. For example, when the hole transport layer is doped with rubrene which is one example of the luminescent dyes, light emission derived from rubrene is observed, so that the resultant element is improved in luminescent efficiency. Also, doping the carrier transport layers and the carrier injection layers with the luminescent dyes can provide advantageous effects such as extension of the service life of the element and improvement in durability of the element.

The organic EL elements schematically illustrated in FIGS. 1A to 1E can be produced by a known production method which is not particularly limited. Examples of the production method suitably usable include a vacuum vapor deposition method (heat vapor deposition method), coating by a spin cast method (spin coating method) and a solvent cast method.

The usage of the organic EL element of the present invention is not particularly limited. Since it has high luminescent efficiency, the organic EL element can be suitably used as displays and indoor illumination and also suitably used as organic semiconductor laser elements. Besides, the organic EL element of the present invention is expected to find various applications.

EXAMPLES

Hereinafter, the present invention will be described in detail by way of Examples, which should not be construed as limiting the scope of the present invention thereto.

[Synthesis of Compound F]

First, compounds used in Examples will be specifically described in detail in terms of how they were obtained (i.e., exemplary synthesis methods).

Compound (F) was synthesized according to the following reaction formula (scheme).

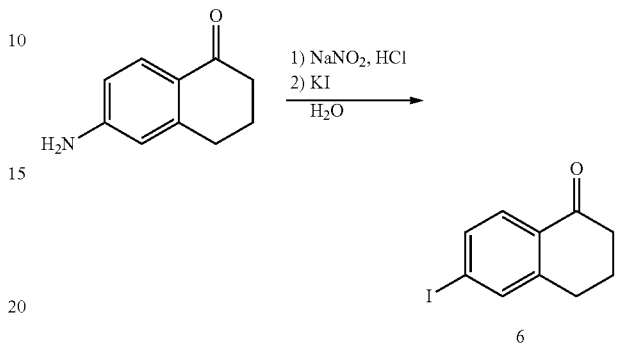

The starting material 6-amino-3,4-dihydro-1(2H)-naphthalenone in the above reaction formula was purchased from SIGMA Aldrich Co., Ltd. and was directly used without any treatment.

A 500 mL beaker was charged with the 6-amino-3,4-dihydro-1(2H)-naphthalenone (20 g, 119.0 mmol) and 15% by mass HCl (96 mL). While the resultant mixture was being maintained at 5° C. or lower with ice cooling, an aqueous sodium nitrite solution (9.9 g, 143.0 mmol+42 mL of water) was gradually added dropwise thereto. After completion of the dropwise addition, the mixture was stirred at the same temperature for 30 min. Then, an aqueous potassium iodide solution (23.7 g, 143.0 mmol+77 mL of water) was added to the mixture at one time. The beaker was taken out from the ice bath and the mixture was stirred for 2.5 hours. Thereafter, the mixture was heated at 60° C. for 0.5 hours until generation of nitrogen was terminated. After cooled to room temperature, the reaction solution was extracted three times with diethyl ether. The organic layer was washed with a 5% by mass aqueous sodium thiosulfate solution (100 mL×3) and further washed with saturated brine (100 mL×2).

Moreover, the combined organic layer was dried with sodium sulfate, followed by filtration. The filtrate was concentrated to obtain red oil.

The obtained red oil was purified through silica gel column chromatography (solvent: ethyl acetate/hexane=9/1 by volume) to obtain a pale orange solid. Furthermore, the obtained solid was recrystallized from 2-propanol to obtain Compound 6 as pale orange crystals (yield amount: 11.4 g, yield rate: 35.2%).

Analysis results of Compound 6 are shown below.

$^1$H NMR (500 MHz, CDCl$_3$, TMS, δ): 2.13 (quint, 2H, J=5.7 Hz), 2.64 (t, 2H, J=6.3 Hz), 2.92 (t, 2H, J=6.0 Hz), 7.66 (d, 1H, J=8.0 Hz), 7.67 (s, 1H), 7.72 (d, 1H, J=8.0 Hz)

Melting point: 74.0° C.-75.0° C.

Mass spectrometry (GC-MS): m/z=272 (M$^+$) (found value); 272.082 (calculated value of molecular weight)

From the above analysis results, it was confirmed that a structure of the synthesized product did not contradict that of Compound 6.

(Synthesis of Compound 7)

Compound 7 was synthesized according to the following reaction formula (scheme).

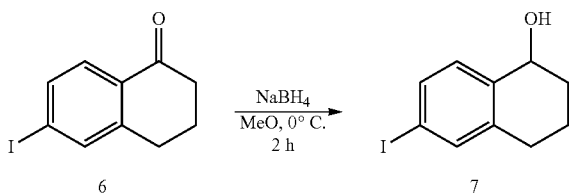 [SMILES: O=C1CCCc2cc(I)ccc21 ; "NaBH4" ; "MeO, 0° C.2 h" ; OC1CCCc2cc(I)ccc21]

A 200 mL round-bottom flask was charged with Compound 6 (4.1 g, 15 mmol) and methanol (100 mL). Sodium borohydride (850 mg, 22.5 mmol) was gradually added to the resultant mixture at 0° C. with ice cooling, followed by stirring for 3 hours at 0° C. Subsequently, excessive sodium borohydride was neutralized with dilute hydrochloric acid, and saturated brine was added to the mixture, which was then extracted with ethyl acetate (50 mL) five times. The extraction liquid was washed with ammonium chloride (100 mL) once and with brine (100 mL) twice. Thereafter, sodium sulfate was added thereto for drying, followed by filtration. The filtrate was concentrated to obtain Compound 7 as a pale red solid (yield amount: 3.93 g, yield rate: 95.5%).

Compound 7 was directly used in the next reaction without any further purification.

Analysis results of Compound 7 are shown below.
$^1$H NMR (500 MHz, CDCl$_3$, TMS, δ): 1.71 (d, 1H, J=5.8 Hz), 1.84-2.02 (m, 4H), 2.65-2.71 (m, 1H), 2.75-2.81 (m, 1H), 4.72 (d, 1H, J=4.6 Hz), 7.17 (d, 1H, J=8.0 Hz), 7.47 (s, 1H), 7.52 (d, t 1H, J$_1$=8.0 Hz, J$_2$=1.2 Hz)

Mass spectrometry (GC-MS): m/z=274 (M$^+$) (found value); 274.098 (calculated value of molecular weight)

Melting point: 82.0° C.-84.0° C.

From the above analysis results, it was confirmed that a structure of the synthesized product did not contradict that of Compound 7.

<Synthesis of Compound 8>

Compound 8 was synthesized according to the following reaction formula (scheme).

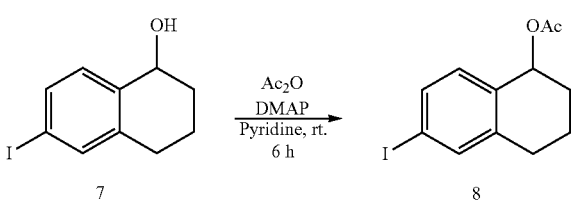 [SMILES: OC1CCCc2cc(I)ccc21 ; "Ac2ODMAP" ; "Pyridine, rt.6 h" ; CC(=O)OC1CCCc2cc(I)ccc21]

A 50 mL round-bottom flask was charged with Compound 7 (3.70 g, 13.5 mmol) and N,N-dimethylaminopyridine (hereinafter referred to as "DMAP," 10 mg). After the flask had been purged with argon gas, anhydrous pyridine (8.1 mL) and acetic anhydride (6.2 mL) were added thereto, followed by stirring at room temperature for 6 hours. Water (50 mL) was added to the reaction solution, which was then extracted with ethyl acetate (20 mL) five times. The combined organic layer was washed with dilute hydrochloric acid (100 mL) three times, then with a sodium hydrogen carbonate solution (100 mL) twice and finally with saturated brine (100 mL) twice. The mixture was dried with magnesium sulfate, followed by filtration.

The filtrate was concentrated to obtain Compound 8 as a brown liquid (yield amount: 4.28 g, yield rate: 100%), which was directly used in the next reaction without any further purification.

Analysis results of Compound 8 are shown below.
$^1$H NMR (500 MHz, CDCl$_3$, TMS, δ): 1.76-1.83 (m, 1H), 1.89-2.10 (m, 1H), 2.07 (s, 3H), 2.67-2.73 (m, 1H), 2.79-2.84 (m, 1H), 5.93 (t, 1H, J=5.2 Hz), 7.01 (d, 1H, J=8.6 Hz), 7.49 (d, 1H, J=2.3 Hz), 7.52 (s, 1H)

Mass spectrometry (GC-MS): m/z=316 (M$^+$) (found value); 316.135 (calculated value of molecular weight)

From the above analysis results, it was confirmed that a structure of the synthesized product did not contradict that of Compound 8.

<Synthesis of Compound 9>

Compound 9 was synthesized according to the following reaction formula (scheme).

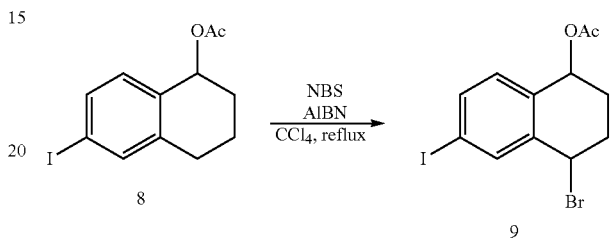

A 100 mL round-bottom flask was charged with Compound 8 (4.27 g, 13.5 mmol), azobisisobutylonitrile (hereinafter referred to as "AIBN," 25 mg), carbon tetrachloride (100 mL) and N-bromosuccinimide (hereinafter referred to as "NBS," 2.64 g, 14.8 mmol). After the flask had been purged with argon gas, the mixture was gradually heated to 80° C., stirred for 1 hour at the same temperature and then cooled to room temperature. The precipitates that had formed were removed through filtration. The filtrate was concentrated under reduce pressure to obtain a pale yellow solid, which was purified through silica gel column chromatography (solvent: ethyl acetate/hexane=8/2 by mass) to obtain Compound 9 as pale red oil (yield amount: 4.9 g, yield rate: 92.0%). Compound 9 was obtained as a 10:7 (by mass) mixture of cis form and trans form.

Analysis results of Compound 9 are shown below.
Precise mass spectrometry (LC-TofMS): m/z=393.9028 (100.0%), 395.9082 (found value); 393.9065 (100.0%), 395.9045 (97.3%) (theoretical value)

From the above analysis results, it was confirmed that a structure of the synthesized product did not contradict that of Compound 9.

<Synthesis of Compound 10>

Compound 10 was synthesized according to the following reaction formula (scheme).

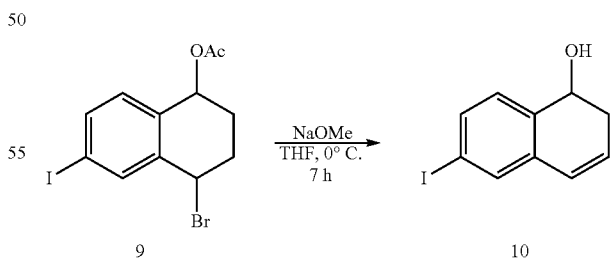

A 500 mL round-bottom flask was charged with Compound 9 (4.2 g, 10.6 mmol) and then purged with argon gas, followed by addition of tetrahydrofuran (hereinafter referred to as "THF," 300 mL). Subsequently, a sodium methoxide-methanol solution (25% by mass, 24 mL) was added to the resultant mixture at 0° C. with ice cooling, followed by stirring at the same temperature for 6 hours. Water (300 mL) was added to the mixture, which was extracted with ethyl acetate (100 mL) four times, washed with saturated brine (100 mL) twice, dried with sodium sulfate and filtrated. The filtrate was concentrated to obtain a brown liquid. The obtained brown liquid was purified with a silica gel column to obtain Compound 10 as colorless crystals (yield amount: 1.2 g, yield rate: 41.0%).

Analysis results of Compound 10 are shown below.

$^1$H NMR (500 MHz, CDCl$_3$, TMS, δ): 1.70 (d, 1H, J=3.4 Hz), 2.58-2.61 (m, 2H), 4.76 (q, 1H, J=6.3 Hz), 6.04 (q, 1H, J=5.2 Hz), 6.47 (d, 1H, J=9.8 Hz), 7.13 (d, 1H, J=8.1 Hz), 7.47 (d, 1H, J=1.7 Hz), 7.57 (J$_1$=8.1 Hz J$_2$=1.7 Hz)

Mass spectrometry (GC-MS): m/z=272 (M$^+$), 254 (M$^+$-H$_2$O) (found value); 272.082 (calculated value of molecular weight)

From the above analysis results, it was confirmed that a structure of the synthesized product did not contradict that of Compound 10.

<Synthesis of Compound (11-2)>

Compound (11-2) was synthesized according to the following reaction formula (scheme).

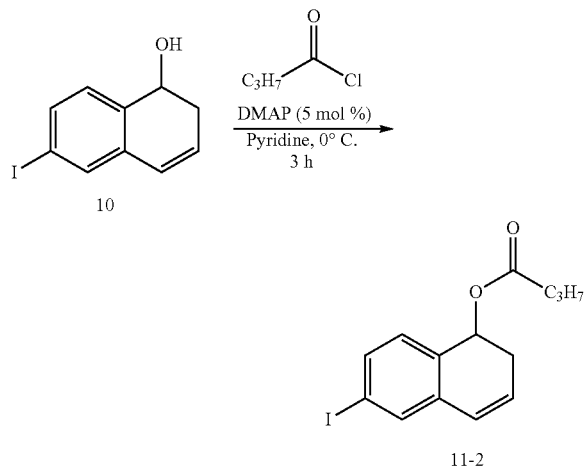

A 50 mL round-bottom flask was charged with Compound 10 (1.09 g, 4.0 mmol) and DMAP (24.5 mg, 0.200 mmol), and then was purged with argon gas, followed by addition of pyridine (20 mL). n-Butyryl chloride (0.46 mL, 4.4 mmol) was added thereto at 0° C. with ice cooling and the resultant mixture was stirred at the same temperature for 3 hours. Water was added to the reaction solution, which was extracted with ethyl acetate (50 mL) three times. The organic layer was washed with a saturated sodium hydrogen carbonate solution and saturated brine, dried with magnesium sulfate and filtrated. The filtrate was concentrated to obtain a brown liquid. The obtained brown liquid was purified with a silica gel column to obtain Compound (11-2) as a colorless liquid (yield amount: 0.83 g, yield rate: 60.5%).

Analysis results of Compound (11-2) are shown below.

$^1$H NMR (500 MHz, CDCl$_3$, TMS, δ): 0.893 (t, 3H, J=7.5 Hz), 1.57-1.64 (m, 21), 2.23 (td, 2H, J1=7.4 Hz, J2=2.3 Hz), 2.58-2.62 (m, 2H), 5.96 (t, 1H, J=5.2 Hz), 6.03 (quint. J=5.2 Hz), 6.48 (d, 1H, J=9.9 Hz), 7.10 (d, 1H, J=8.0 Hz), 7.48 (d, 1H, J=1.7H), 7.54 (dd, 1H, J1=8.0 Hz, J2=1.7 Hz)

Mass spectrometry (GC-MS): m/z=342 (M$^+$), 254 (M$^+$-C$_3$H$_7$COOH) (found value); 342.172 (calculated value of molecular weight)

From the above analysis results, it was confirmed that a structure of the synthesized product did not contradict that of Compound (11-2).

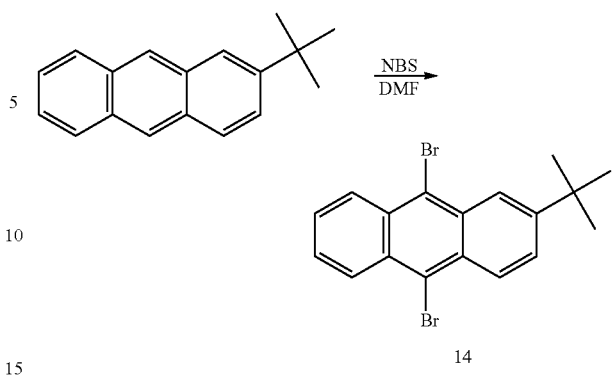

A round-bottom flask was charged with 2-tert-butylanthracene (product of Tokyo Chemical Industry Co., Ltd., 2.34 g, 10 mmol), N,N-dimethylformamide (hereinafter referred to as "DMF," 150 mL) and NBS (4.27 g, 24 mmol), followed by stirring at room temperature for 16 hours. An aqueous sodium nitrite solution was added to the resultant mixture and yellow precipitates formed were separated through filtration. The obtained precipitates were washed sequentially with hot water and ethanol, and then dried in vacuum to obtain a crude product. The obtained crude product was recrystallized from toluene/ethanol, to thereby Compound 14 as light yellow crystals (yield amount: 2.15 g, yield rate: 55%).

$^1$H NMR (500 MHz, CDCl$_3$, TMS, δ): 1.49 (s, 9H), 7.59-7.63 (m, 2H), 7.73 (dd, 4H, J1=9.2 Hz, J2=2.3 Hz), 8.49 (d, 1H, J=1.7 Hz), 8.52 (d, 1H, J=9.2 Hz), 8.56-8.60 (m, 2H)

Mass spectrometry (GC-MS): m/z=392 (100.0%), 390 (51.4%), 394 (48.6%); 392.128 (calculated value of molecular weight)

From the above analysis results, it was confirmed that a structure of the synthesized product did not contradict that of Compound 14.

<Synthesis of Compound 15>

Compound 15 was synthesized according to the following reaction formula (scheme).

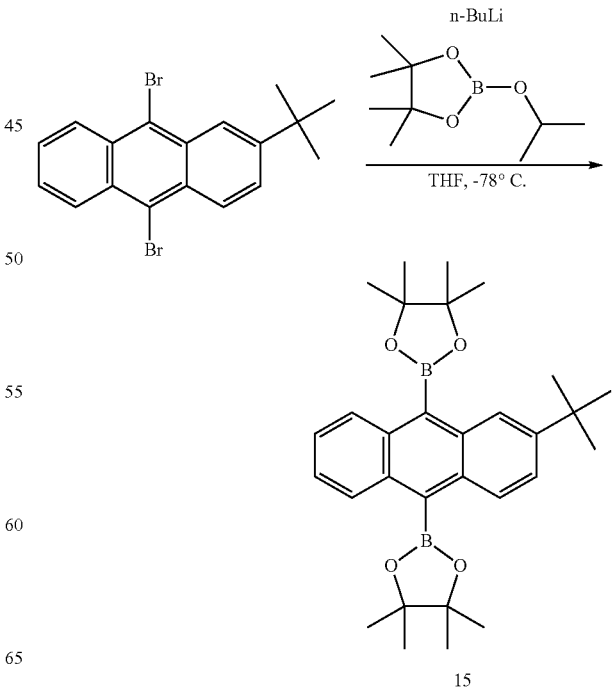

A thoroughly dried flask was charged with 2-tert-butyl-9,10-dibromoanthracene (1.24 g, 3.16 mmol) and was purged with argon gas. Thereafter, THF (50 mL) was added to the flask, which was then cooled to −78° C. in an acetone-dry ice bath. A 1.6 M hexane solution (20 mL) of n-butyllithium was added to the mixture and stirred at the same temperature for 2 hours. Subsequently, 2-isopropoxy-4,4,5,5-tetramethyl-1,3,2-dioxaborolane (18 mL) was added thereto at one time, and the mixture was increased in temperature from −78° C. to room temperature for 1 hour. Then, a saturated aqueous ammonium chloride solution and ethyl acetate were added to the mixture to separate an organic layer. The aqueous layer was extracted with ethyl acetate three times. The combined organic layer was washed sequentially with water and saturated brine, and sodium nitrate was added thereto for drying. The dessicant was separated from the organic layer through filtration and the organic layer was concentrated. The residue was purified through flash chromatography (stationary phase: silica gel, mobile phase: hexane/ethyl acetate=9/1 by volume) to thereby obtain a compound of interest as a pale yellow solid (yield amount: 400 mg, yield rate: 26%).

$^1$H NMR (500 MHz, CDCl$_3$, TMS, δ): 1.43 (s, 9H), 7.41-7.43 (m, 2H), 7.56 (dd, 1H, J1=9.2 Hz, J2=1.7 Hz), 8.21 (d, 1H, J=1.7 Hz), 8.28-8.35 (m, 3H)

Mass spectrometry (GC-MS): m/z=486 (M$^+$) (found value); 486.258 (calculated value of molecular weight)

From the above analysis results, it was confirmed that a structure of the synthesized product did not contradict that of Compound 15.

A round-bottom flask was charged with 2-tert-butyl-9,10-anthracene diboronic acid bispinacol ester (565 mg, 1.16 mmol), Compound 11-2 (794 mg, 2.2 mmol), potassium phosphate (1.4 g, 6.6 mmol), bis(dibenzylideneacetone)palladium (hereinafter referred to as Pd(dba)$_2$) (127 mg) and tri-tert-butylphosphine (120 mg). The flask was purged with argon gas. Thereafter, DMF (15 mL) was added to the flask, which was then stirred for 24 hours at room temperature. A saturated aqueous ammonium chloride solution was added thereto, followed by stirring for 30 min. Ethyl acetate was added to the mixture to separate an organic layer. The aqueous layer was extracted with ethyl acetate four times. The combined organic layer was washed sequentially with a saturated aqueous sodium hydrogen carbonate solution, water and saturated brine, and was dried with magnesium nitrate. The dessicant was separated from the organic layer through filtration and the organic layer was concentrated. The residue was separated and purified with a silica gel column (developing solvent: toluene) to thereby obtain Compound (F) as a pale yellow solid (yield amount: 405 mg, yield rate: 56.4%).

$^1$H NMR (500 MHz, CDCl$_3$, TMS, δ): 0.93-0.992. (m, 6H), 1.26 (t, 9H, J=3.7 Hz), 1.65-1.75 (m, 4H), 2.34-2.39 (m, 4H), 2.71-2.83 (m, 4H), 6.08-6.12 (m, 2H), 6.21-6.27 (m, 2H), 6.63 (t, 2H, J=9.2 Hz), 7.24-7.25 (m, 2H), 7.29-7.36 (m, 4H), 7.44 (td, 1H, J1=5.3 Hz, J2=2.3 Hz), 7.57-7.75 (m, 6H)

Mass spectrometry (GC-MS): m/z=663 (M$^+$), 487 (M$^+$-2C$_5$H$_{11}$COOH) (found values); 662.855 (M$^+$), 486.645 (M$^+$-2C$_3$H$_7$COOH) (calculated values of molecular weight)

From the above analysis results, it was confirmed that a structure of the synthesized product did not contradict that of Compound (F).

Example 1

Host-Guest-Type Luminescent Organic Thin Film

Next, description will be given to Examples.

A π-electron conjugated compound precursor (A) having the following structure was added in an amount of 1% by mass to chloroform which is a commonly-used organic solvent, so that the π-electron conjugated compound precursor (A) was dissolved therein without forming precipitates. That is, it was found that the π-electron conjugated compound precursor (A) has high dissolvability to a commonly-used organic solvent.

Next, a π-electron conjugated compound precursor (B) having the following structure was added to the above-prepared solution in an amount of 6% by mass relative to the amount of the π-electron conjugated compound precursor (A). Also in this case, no precipitates were observed in the solution, indicating that the π-electron conjugated compound precursor (B) also has high dissolvability to a commonly-used organic solvent.

The thus-prepared solution was coated on a quartz substrate by a spin coating method, to thereby obtain a π-electron conjugated compound precursor film. The obtained π-electron conjugated compound precursor film was heated at 230° C. for 1 hour, so that the π-electron conjugated compound precursors (A) and (B) were converted respectively to π-electron conjugated compounds (C) and (D) having the following structures, to thereby obtain a host-guest-type luminescent organic film. The obtained host-guest-type luminescent organic film was measured for absolute fluorescence quantum yield using an integrating sphere (product of Hamamatsu Photonics K.K., an absolute PL quantum yield measurement device, a 10 mm×10 mm quartz substrate). As a result, this luminescent organic film was found to have an absolute fluorescence quantum yield of 28%.

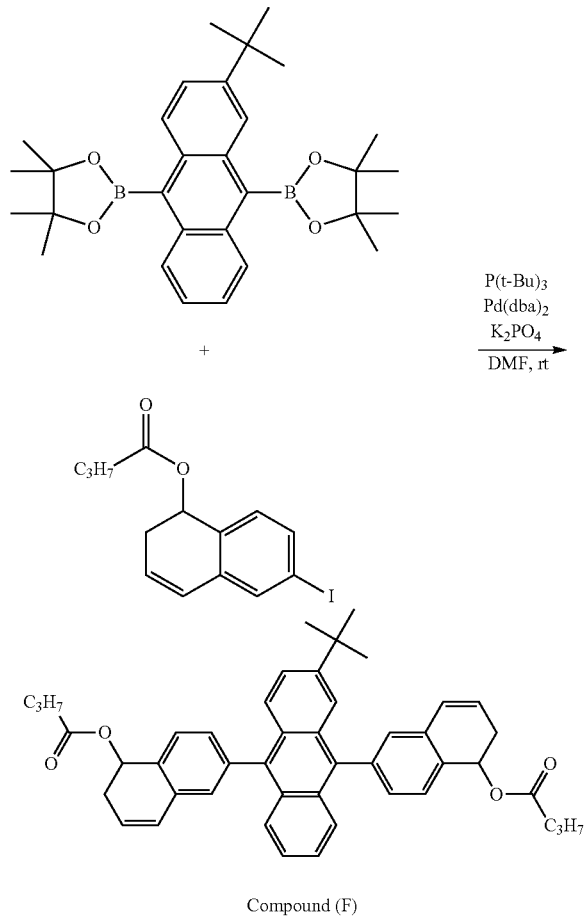

Compound (F)

Figure 2:
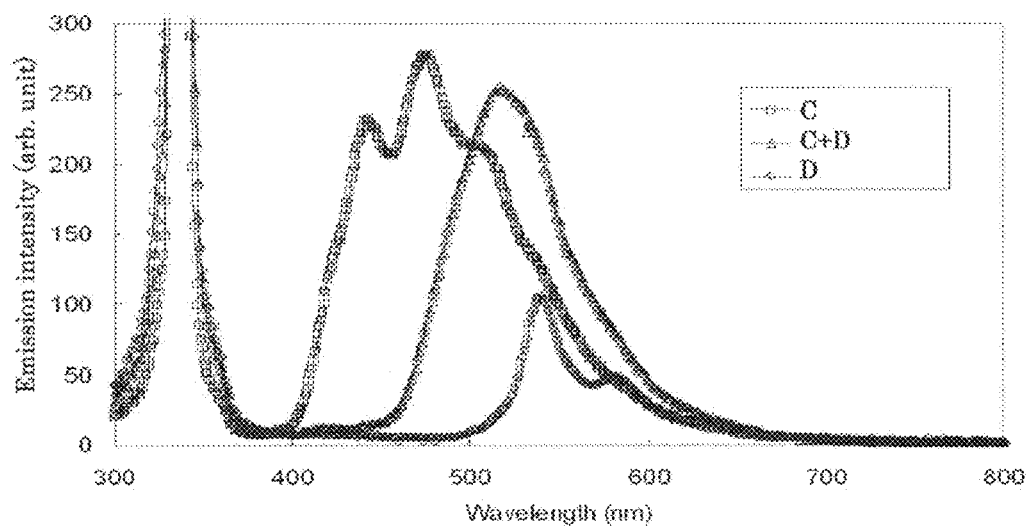
FIG. 2 shows a light emission spectrum of the luminescent organic thin film of Example 1 formed of π-electron conjugated compounds (C) and (D) and light emission spectra of those formed of the π-electron conjugated compound (C) or (D) alone.

FIG. 2 shows a light emission spectrum of the obtained luminescent organic film and light emission spectra of those formed of the π-electron conjugated compound (C) or (D) alone. In the host-guest-type luminescent organic film obtained from the π-electron conjugated compound precursor film, it was observed that light emission was derived predominantly from the π-electron conjugated compound (D) serving as the guest material rather than the π-electron conjugated compound (C) serving as the host material.

This is a result which demonstrates that the π-electron conjugated compound (C) formed from the π-electron conjugated compound precursor (A) via the elimination and conversion treatment functions as the host material.

The thus-prepared solution was coated on a quartz substrate by a spin coating method, to thereby obtain a π-electron conjugated compound precursor film. The obtained π-electron conjugated compound precursor film was heated at 230° C. for 1 hour, so that the π-electron conjugated compound precursor (B) was converted to the π-electron conjugated compound (D) having the above structure, to thereby obtain a host-guest-type luminescent organic film where the π-electron conjugated compound (D) was doped with rubrene. The obtained host-guest-type luminescent organic film was measured for absolute fluorescence quantum yield using an integrating sphere. As a result, this luminescent organic film was found to have an absolute fluorescence quantum yield of 69%.

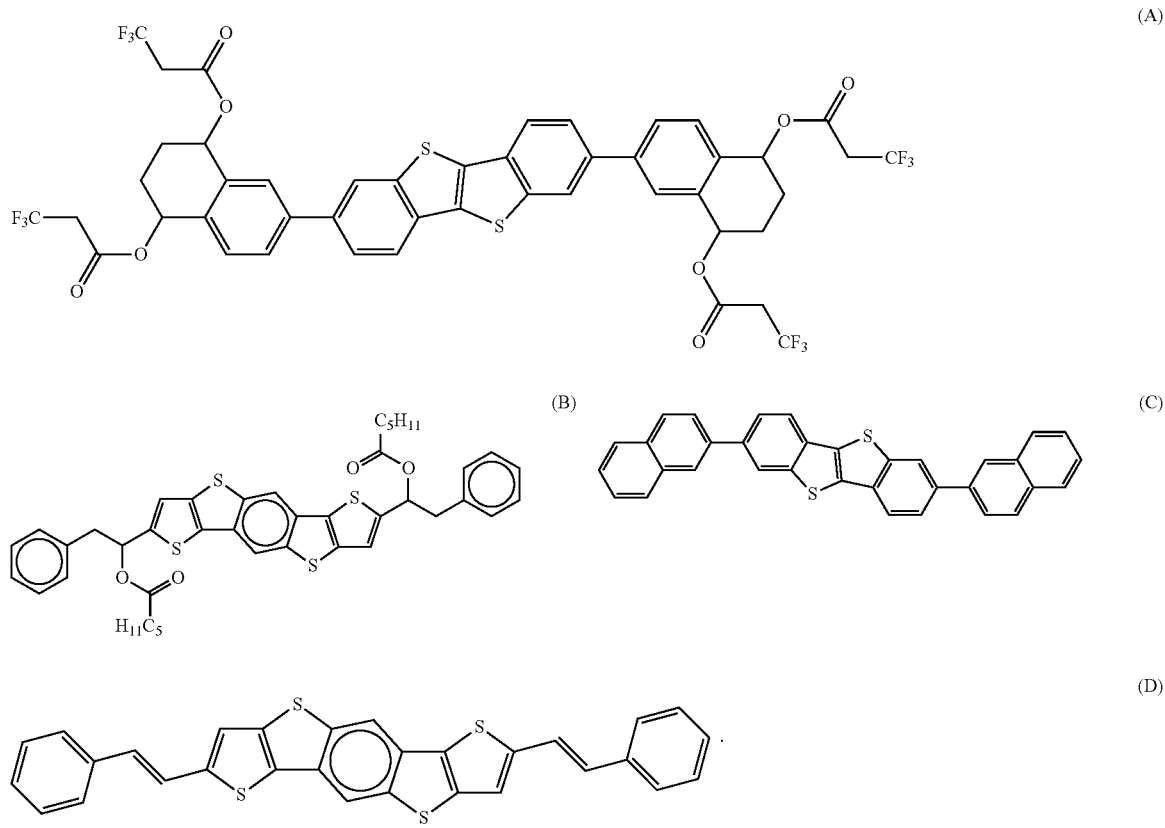

Example 2

Host-Guest-Type Luminescent Organic Thin Film

The π-electron conjugated compound precursor (B) having the above structure was added in an amount of 1% by mass to chloroform which is a commonly-used organic solvent, so that the π-electron conjugated compound precursor (B) was dissolved therein without forming precipitates. That is, it was found that the π-electron conjugated compound precursor (B) has high dissolvability to a commonly-used organic solvent.

Next, rubrene (Compound (E) having the following structure) was added as a luminescent dye to the above-prepared solution in an amount of 5% by mass relative to the amount of the π-electron conjugated compound precursor (B). Also in this case, no precipitates were observed in the solution.

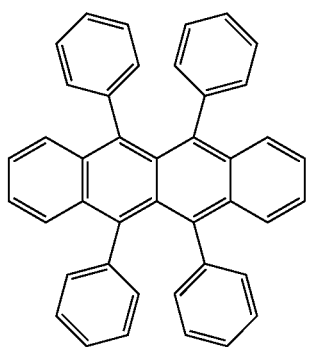

Figure 3:
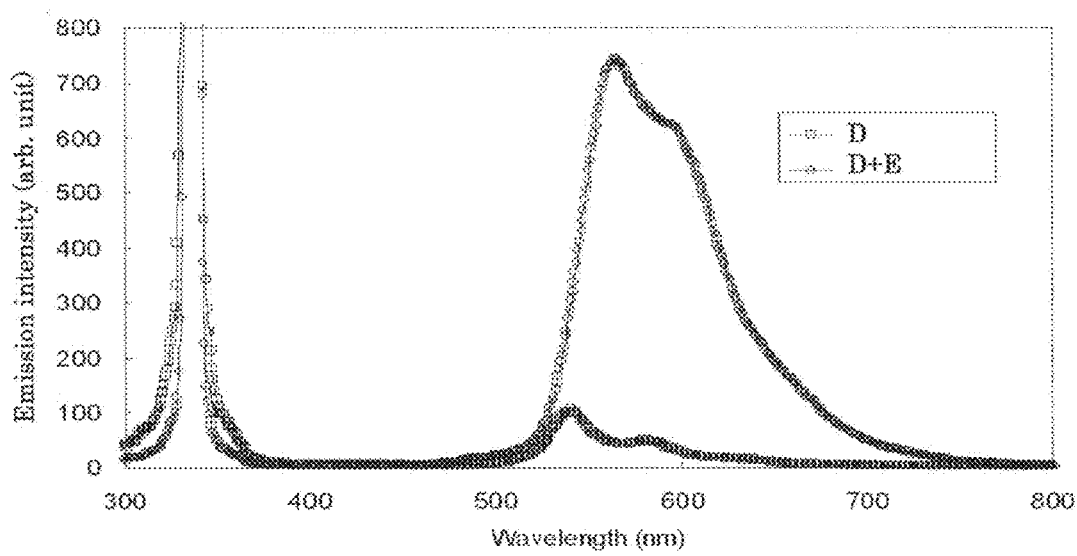
FIG. 3 shows a light emission spectrum of the luminescent organic thin film of Example 2 formed of π-electron conjugated compounds (D) and (E) and a light emission spectrum of that formed of the π-electron conjugated compound (D) alone.

FIG. 3 shows a light emission spectrum of the obtained luminescent organic film and a light emission spectrum of that formed of the π-electron conjugated compound (C) alone. In the host-guest-type luminescent organic film obtained from the π-electron conjugated compound precursor film, it was observed that light emission was derived predominantly from rubrene serving as the guest material rather than the π-electron conjugated compound (D) serving as the host material. This is a result which demonstrates that the π-electron conjugated compound (D) formed from the π-electron conjugated compound precursor (B) via the elimination and conversion treatment functions as the host material.

Example 3

Host-Guest-Type Luminescent Organic Thin Film

A π-electron conjugated compound precursor (F) having the following structure was added in an amount of 2% by mass to chloroform which is a commonly-used organic solvent, so that the π-electron conjugated compound precursor (F) was dissolved therein without forming precipitates. That is, it was found that the π-electron conjugated compound precursor (F) has high dissolvability to a commonly-used organic solvent.

Next, rubrene (E) was added as a luminescent dye to the above-prepared solution in an amount of 5% by mass relative to the amount of the π-electron conjugated compound precursor (F). Also in this case, no precipitates were observed in the solution.

The thus-prepared solution was coated on a quartz substrate by a spin coating method, to thereby obtain a π-electron conjugated compound precursor film. The obtained π-electron conjugated compound precursor film was heated at 160° C. for 30 min, so that the π-electron conjugated compound precursor (F) was converted to a π-electron conjugated compound (G) having the following structure, to thereby obtain a host-guest-type luminescent organic film where the π-electron conjugated compound (G) was doped with rubrene (E). The obtained host-guest-type luminescent organic film was measured for absolute fluorescence quantum yield using an integrating sphere. As a result, this luminescent organic film was found to have an absolute fluorescence quantum yield of 82%. In addition, when this luminescent organic film was observed for light emission with a fluorescent microscope, it could be confirmed that it emitted light evenly and uniformly.

Figure 4:
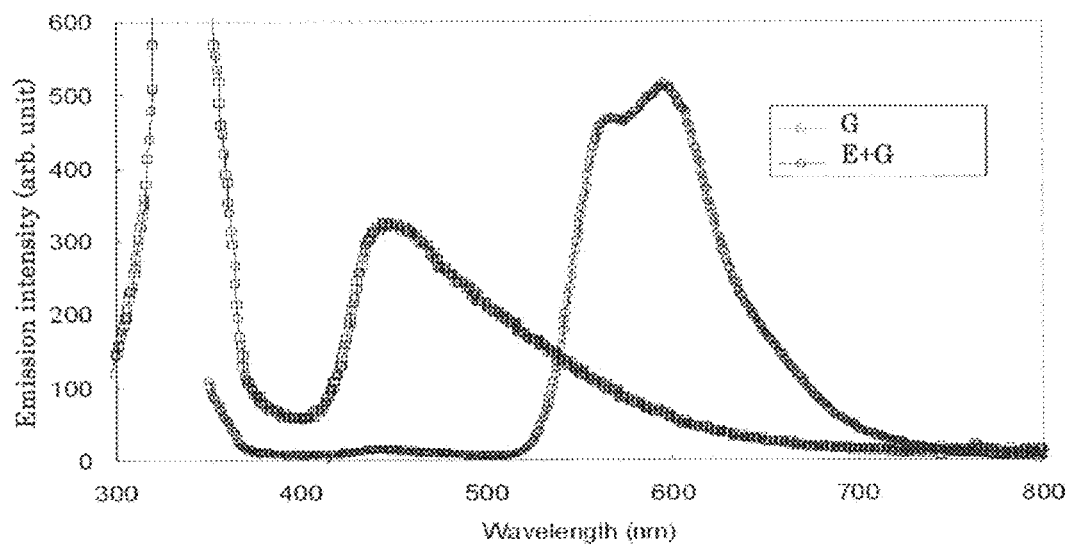
FIG. 4 shows a light emission spectrum of the luminescent organic thin film of Example 3 formed of π-electron conjugated compounds (E) and (G) and a light emission spectrum of that formed of the π-electron conjugated compound (G) alone.

FIG. 4 shows a light emission spectrum of the obtained luminescent organic film and a light emission spectrum of that formed of the host π-electron conjugated compound (G) alone. In the host-guest-type luminescent organic film obtained from the π-electron conjugated compound precursor film, it was observed that light emission was derived predominantly from rubrene (E) serving as the guest material rather than the π-electron conjugated compound (G) serving as the host material. This is a result which demonstrates that the π-electron conjugated compound (G) formed from the π-electron conjugated compound precursor (F) via the elimination and conversion treatment functions as the host material.

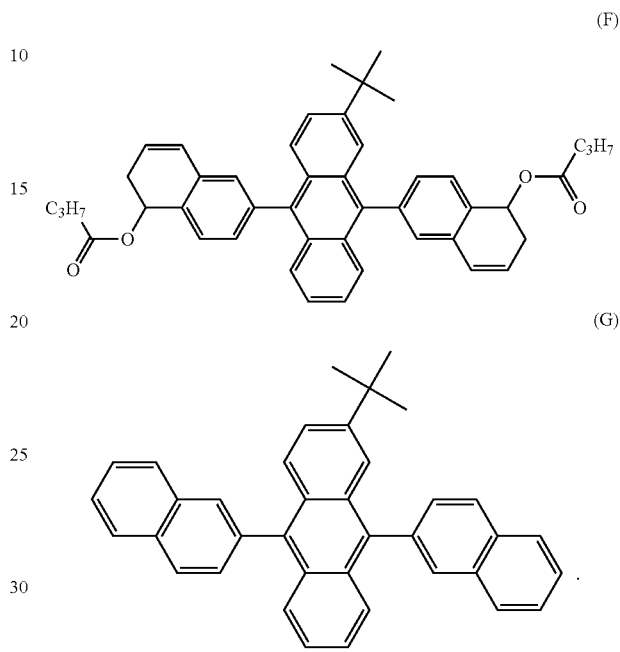

Example 4

Host-Guest-Type Luminescent Organic Thin Film

The π-electron conjugated compound precursor (F) having the above structure was added in an amount of 2% by mass to chloroform which is a commonly-used organic solvent, so that the π-electron conjugated compound precursor (F) was dissolved therein without forming precipitates. That is, it was found that the π-electron conjugated compound precursor (F) has high dissolvability to a commonly-used organic solvent.

Next, a styrylbenzene derivative (H) having the following structure was added as a luminescent dye to the above-prepared solution in an amount of 5% by mass relative to the amount of the π-electron conjugated compound precursor (F). Also in this case, no precipitates were observed in the solution.

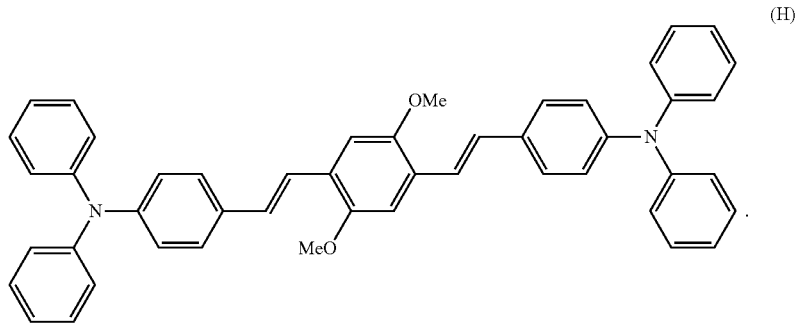 [SMILES: COc1cc(/C=C/c2ccc(N(c3ccccc3)c3ccccc3)cc2)c(OC)cc1/C=C/c1ccc(N(c2ccccc2)c2ccccc2)cc1]

The thus-prepared solution was coated on a quartz substrate by a spin coating method, to thereby obtain a π-electron conjugated compound precursor film. The obtained π-electron conjugated compound precursor film was heated at 160° C. for 30 min, so that the π-electron conjugated compound precursor (F) was converted to the π-electron conjugated compound (G), to thereby obtain a host-guest-type luminescent organic film where the π-electron conjugated compound (G) was doped with the styrylbenzene derivative (H) having the above structure. The obtained host-guest-type luminescent organic film was measured for absolute fluorescence quantum yield using an integrating sphere. As a result, this luminescent organic film was found to have an absolute fluorescence quantum yield of 78%.

Figure 5:
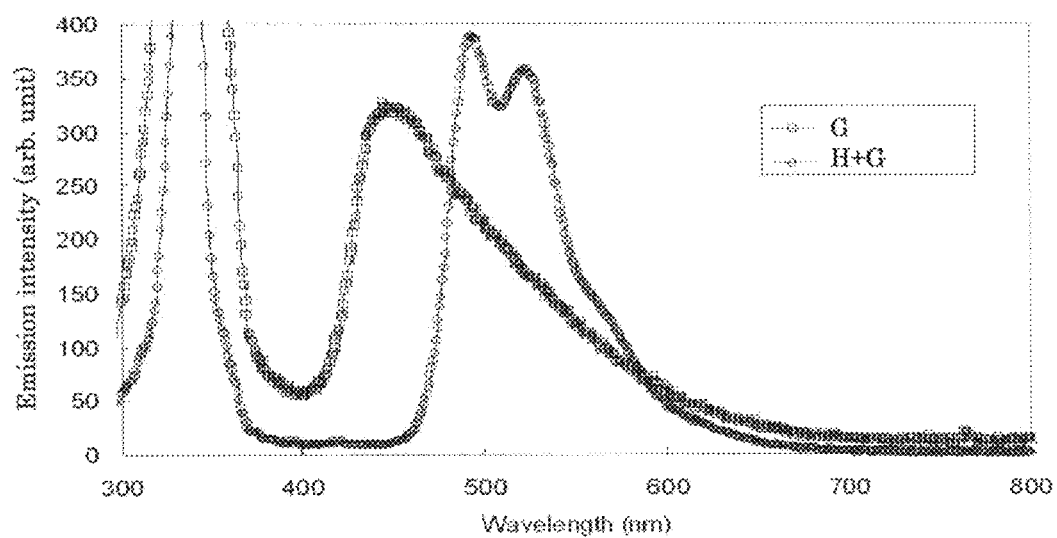
FIG. 5 shows a light emission spectrum of the luminescent organic thin film of Example 4 formed of π-electron conjugated compounds (H) and (G) and a light emission spectrum of that formed of the π-electron conjugated compound (G) alone.

FIG. 5 shows a light emission spectrum of the obtained luminescent organic film and a light emission spectrum of that formed of the host π-electron conjugated compound (G) alone. In the host-guest-type luminescent organic film obtained from the π-electron conjugated compound precursor film, it was observed that light emission was derived predominantly from the styrylbenzene derivative (H) serving as the guest material rather than the π-electron conjugated compound (G) serving as the host material. This is a result which demonstrates that the π-electron conjugated compound (G) formed from the π-electron conjugated compound precursor (F) via the elimination and conversion treatment functions as the host material.

Example 5

Host-Guest-Type Luminescent Organic Thin Film

The π-electron conjugated compound precursor (F) having the above structure was added in an amount of 2% by mass to chloroform which is a commonly-used organic solvent, so that the π-electron conjugated compound precursor (F) was dissolved therein without forming precipitates. That is, it was found that the π-electron conjugated compound precursor (F) has high dissolvability to a commonly-used organic solvent.

Next, the styrylbenzene derivative (H) was added as a first luminescent dye to the above-prepared solution in an amount of 10% by mass relative to the amount of the π-electron conjugated compound precursor (F). In addition, the rubrene (E) was added as a second luminescent dye to the solution in an amount of 2% by mass relative to the amount of the π-electron conjugated compound precursor (F). Also in this case, no precipitates were observed in the solution.

The thus-prepared solution was coated on a quartz substrate by a spin coating method, to thereby obtain a π-electron conjugated compound precursor film. The obtained π-electron conjugated compound precursor film was heated at 160° C. for 30 min, so that the π-electron conjugated compound precursor (F) was converted to the π-electron conjugated compound (G), to thereby obtain a host-guest-type luminescent organic film where the π-electron conjugated compound (G) was doped with the styrylbenzene derivative (H) and the rubrene (E). The obtained host-guest-type luminescent organic film was measured for absolute fluorescence quantum yield using an integrating sphere. As a result, this luminescent organic film was found to have an absolute fluorescence quantum yield of 92%.

Figure 6:
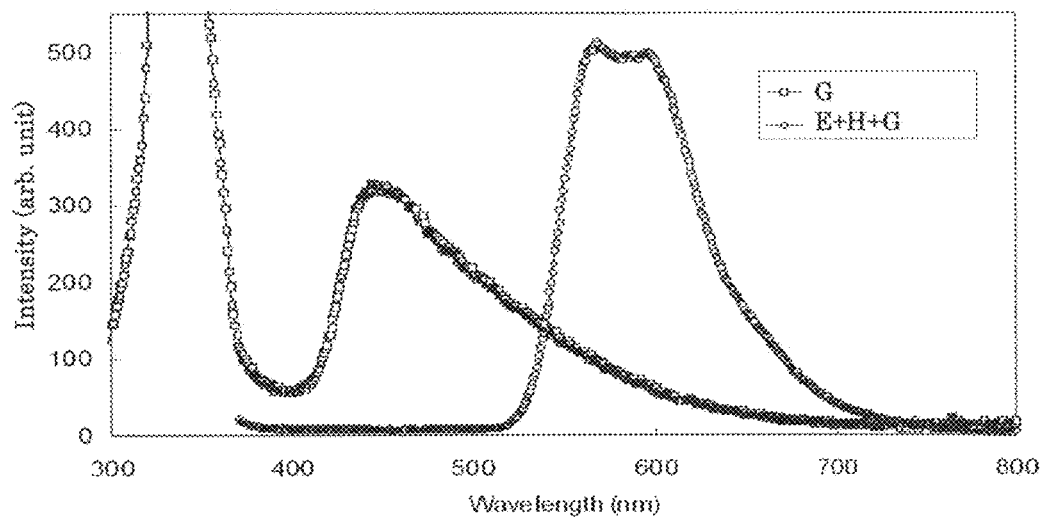
FIG. 6 shows a light emission spectrum of the luminescent organic thin film of Example 5 formed of π-electron conjugated compounds (E), (H) and (G) and a light emission spectrum of that formed of the π-electron conjugated compound (G) alone.

FIG. 6 shows a light emission spectrum of the obtained luminescent organic film and a light emission spectrum of that formed of the host π-electron conjugated compound (G) alone. In the host-guest-type luminescent organic film obtained from the π-electron conjugated compound precursor film, it was observed that light emission was derived predominantly from the second luminescent dye (E) rather than the π-electron conjugated compound (G) serving as the host material and the styrylbenzene derivative (H) serving as the first luminescent dye. This is a result which demonstrates that almost all the excitons generated are consumed for the light emission from the second luminescent dye (E) after they have been energy-transferred from the π-electron conjugated compound (G) serving as the host material to the first luminescent dye and then rapidly energy-transferred to the second luminescent dye (E). As described above, it is easy to adjust the doping concentration of the luminescent dyes in the luminescent organic film containing the π-electron conjugated compound obtained by applying external energy to the π-electron conjugated compound precursor A-(B)m film of the present invention containing luminescent dyes. Thus, it is possible to obtain a luminescent organic film having a high luminescent efficiency in a simpler manner and at a lower cost than in the conventional vacuum vapor deposition methods.

Example 6

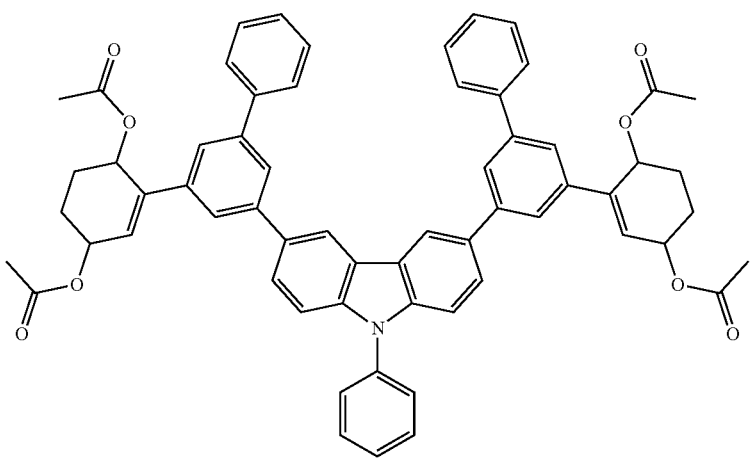

(I)

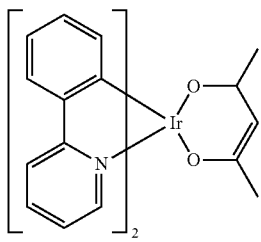

(J)

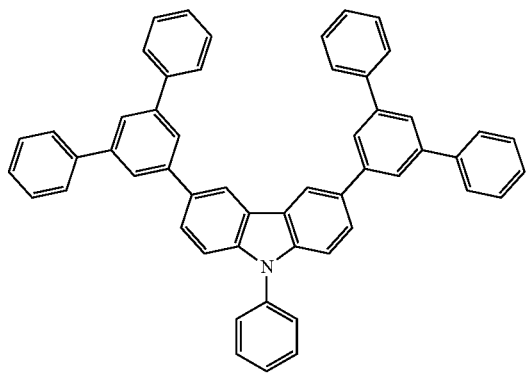

(K)

A π-electron conjugated compound precursor (I) having the above structure was added in an amount of 2% by mass to chloroform which is a commonly-used organic solvent, so that the π-electron conjugated compound precursor (I) was dissolved therein without forming precipitates. That is, it was found that the π-electron conjugated compound precursor (I) has high dissolvability to a commonly-used organic solvent. Next, acetylacetonatobis(2-phenylpyridine)iridium (hereinafter referred to as "Ir(ppy)$_2$(acac)," Compound (J) having the above structure) was added as a luminescent dye to the above-prepared solution in an amount of 2% by mass relative to the amount of the π-electron conjugated compound precursor (I). Also in this case, no precipitates were observed in the solution.

The thus-prepared solution was coated on a quartz substrate by a spin coating method, to thereby obtain a π-electron conjugated compound precursor film. The obtained π-electron conjugated compound precursor film was heated at 190° C. for 30 min, so that the π-electron conjugated compound precursor (I) was converted to a π-electron conjugated compound (K), to thereby obtain a host-guest-type luminescent organic film where the π-electron conjugated compound (K) was doped with the Ir(ppy)$_2$(acac)(J). The obtained host-guest-type luminescent organic film was measured for absolute fluorescence quantum yield using an integrating sphere. As a result, this luminescent organic film was found to have an absolute fluorescence quantum yield of 64%.

Example 7

Organic EL Element Using a Precursor Host-Guest-Type Luminescent Organic Film

<Production of Element>

A substrate of a transparent 40 mm×40 mm glass plate was provided and a surface of the substrate was washed through a known washing treatment. Next, ITO was formed into a film over the surface of the substrate by a known film-forming method, followed by patterning in stripe, to thereby form an anode (electrode). Then, the surface of the ITO was cleaned through an oxygen plasma treatment. Next, an aqueous solution containing poly(3,4-ethylenedioxythiophene) and poly (styrenesulfonate) (PEDOT and PSS) was provided and coated by a spin coating method over the substrate surface on which the anode had been formed, followed by drying at 150° C. for 5 min, to thereby form a hole injection layer of PEDOT and PSS. Separately, the π-electron conjugated compound precursor (F) having the above structure and the luminescent dye (H) were mixed together in 2-propanol to prepare a solution. The prepared solution was coated on the substrate by a spin coating method and heated at 160° C. for 30 min, so that the π-electron conjugated compound precursor (F) was converted to the π-electron conjugated compound (G), to thereby obtain a host-guest-type luminescent organic film where the π-electron conjugated compound (G) was doped with the luminescent dye (H). The doping concentration of the luminescent dye (H) in the π-electron conjugated compound precursor (F) was 5% by mass. The film thickness of the host-guest-type luminescent organic film was 20 nm. Next, the substrate was placed in the chamber of a vacuum apparatus, where an exciton barrier layer of 4,7-diphenyl-1,10-phenanthroline (BPhen) and an electron transport layer of tris(8-hydroxyquinolinato)aluminium (Alq$_3$) were formed in this order by a vacuum vapor deposition method. Next, LiF (film thickness: 0.5 nm) and MgAg (film thickness: 100 nm) were deposited in this order by a vacuum vapor deposition method using a metal mask, to thereby form a cathode (electrode) having a stripe pattern.

<Evaluation of Element>

Figure 7:
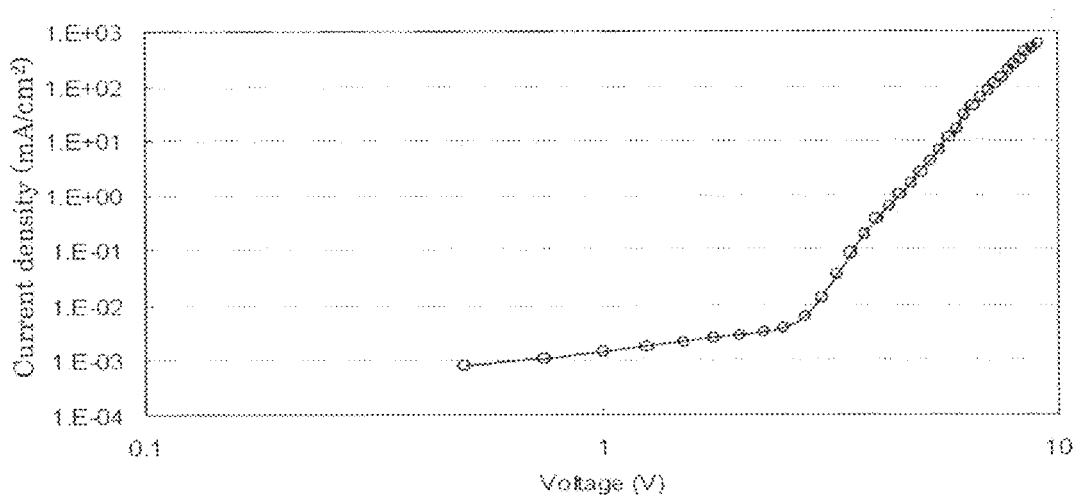
FIG. 7 is a graph of a relationship between voltage and current density of the organic EL element of Example 7 containing, as a luminescent layer, a precursor host-guest-type luminescent organic film formed of π-electron conjugated compounds (H) and (G).

FIG. 7 is a graph of evaluation results of the characteristics of the organic EL element and shows dependency of current density on voltage. The current density at an applied voltage of 7V was about 80 mA/cm$^2$.

Figure 8:
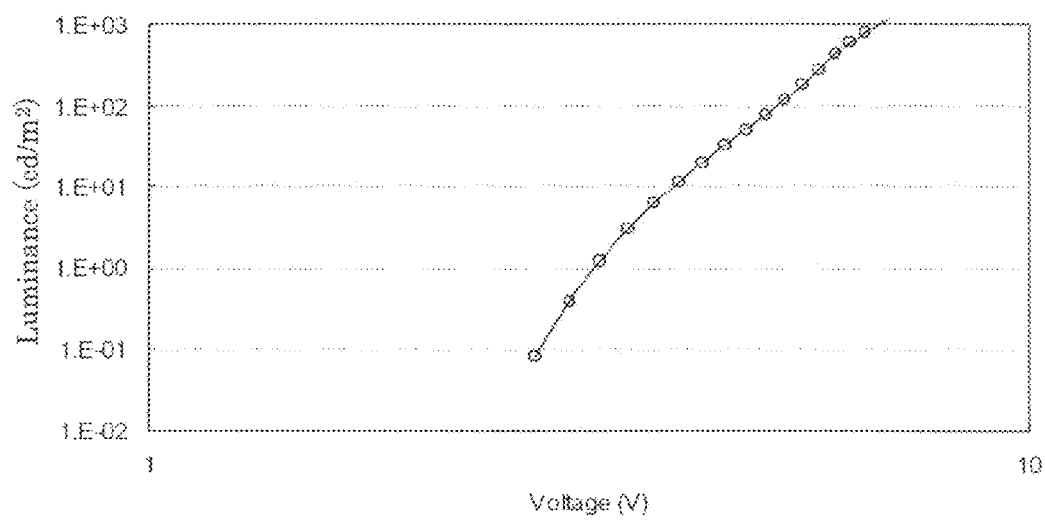
FIG. 8 is a graph of a relationship between voltage and luminance of the organic EL element of Example 7 containing, as a luminescent layer, a precursor host-guest-type luminescent organic film formed of π-electron conjugated compounds (H) and (G).

FIG. 8 is a graph of evaluation results of the characteristics of the organic EL element and shows dependency of luminance on voltage. The voltage at which the organic EL element started emitting light was 2.5 V. The maximum external quantum yield was about 1.2%.

Figure 9:
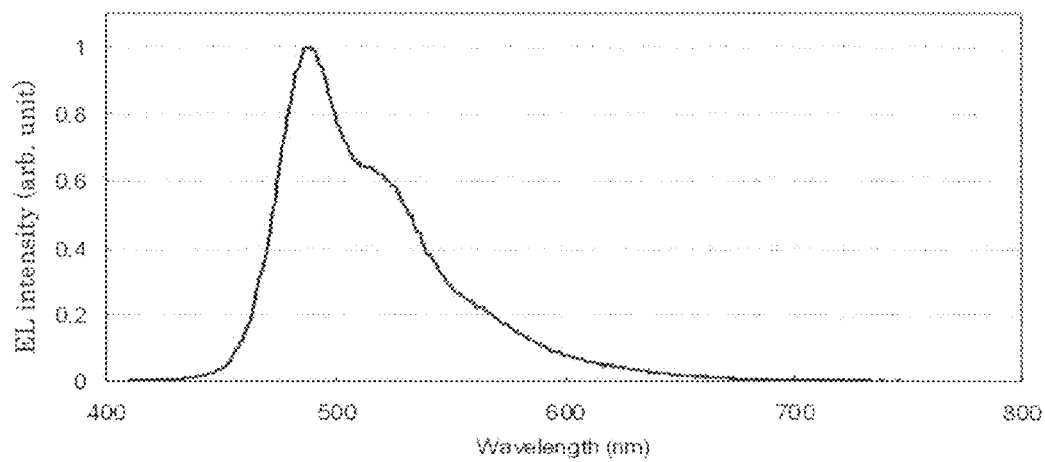
FIG. 9 is a graph of an EL spectrum at a current density of 10 mA/cm² of the organic EL element of Example 7 containing, as a luminescent layer, a precursor host-guest-type luminescent organic film formed of π-electron conjugated compounds (H) and (G).

FIG. 9 is a graph of a light emission spectrum of the organic EL element at a current density of 10 mA/cm$^2$. There was not almost observed a peak attributed to light emission by the π-electron conjugated compound (G) which is a host compound showing light emission at the short wavelength region. This is a result which demonstrates that almost all the excitons generated in the element are consumed for the light emission from the luminescent dye (H). This is also a result which demonstrates that the luminescent organic film containing the π-electron conjugated compound obtained by applying external energy to the π-electron conjugated compound precursor A-(B)m film of the present invention formed through the printing process functions as the luminescent layer of the organic EL element.

Comparative Example 1

Host-Guest-Type Luminescent Organic Thin Film

A co-vapor-deposition thin film where the π-electron conjugated compound (C) having the above structure was doped with the above π-electron conjugated compound (D) in an amount of 6% by mass was formed on a quartz substrate as follows. Specifically, the π-electron conjugated compound (C) serving as a luminescent host and the π-electron conjugated compound (D) serving as a luminescent dopant were individually placed on separate boats in a vacuum vapor deposition apparatus reduced in pressure to $10^{-5}$ Pa or lower, and vapor-deposited on the quartz substrate with adjusting the deposition rates thereof to 100:6 (π-electron conjugated compound (C) π-electron conjugated compound (D)) using a film thickness meter (product of Inficon Co.). The obtained host-guest-type luminescent organic film was measured for absolute fluorescence quantum yield using an integrating sphere. As a result, this luminescent organic film was found to have an absolute fluorescence quantum yield of 17%.

Comparative Example 2

Host-Guest-Type Luminescent Organic Film

In the same manner as in Comparative Example 1, a co-vapor-deposition thin film where the above π-electron conjugated compound (D) was doped with the rubrene (E) in an amount of 5% by mass was formed on a quartz substrate by a vacuum vapor deposition method. The obtained host-guest-type luminescent organic film was measured for absolute fluorescence quantum yield using an integrating sphere. As a result, this luminescent organic film was found to have an absolute fluorescence quantum yield of 62%.

Comparative Example 3

Host-Guest-Type Luminescent Organic Film

In the same manner as in Comparative Example 1, a co-vapor-deposition thin film where the above π-electron conjugated compound (G) was doped with the rubrene (E) in an amount of 5% by mass was formed on a quartz substrate by a vacuum vapor deposition method. The obtained host-guest-type luminescent organic film was measured for absolute fluorescence quantum yield using an integrating sphere. As a result, this luminescent organic film was found to have an absolute fluorescence quantum yield of 79%.

Comparative Example 4

Host-Guest-Type Luminescent Organic Film

In the same manner as in Comparative Example 1, a co-vapor-deposition thin film where the above π-electron conjugated compound (G) was doped with the styrylbenzene derivative (H) in an amount of 5% by mass was formed on a quartz substrate by a vacuum vapor deposition method. The obtained host-guest-type luminescent organic film was measured for absolute fluorescence quantum yield using an integrating sphere. As a result, this luminescent organic film was found to have an absolute fluorescence quantum yield of 66%.

Comparative Example 5

Host-Guest-Type Luminescent Organic Film

In the same manner as in Comparative Example 1, a co-vapor-deposition thin film where the above π-electron conjugated compound (G) was doped with the rubrene (E) in an amount of 2% by mass and with the styrylbenzene derivative (H) in an amount of 10% by mass was formed on a quartz substrate by a vacuum vapor deposition method. The obtained host-guest-type luminescent organic film was measured for absolute fluorescence quantum yield using an integrating sphere. As a result, this luminescent organic film was found to have an absolute fluorescence quantum yield of 90%.

Comparative Example 6

Host-Guest-Type Luminescent Organic Film

A co-vapor-deposition thin film where the above π-electron conjugated compound (K) was doped with the Ir(ppy)$_2$(acac) (J) in an amount of 2% by mass was formed on a quartz substrate by a vacuum vapor deposition method. The obtained host-guest-type luminescent organic film was measured for absolute fluorescence quantum yield using an integrating sphere. As a result, this luminescent organic film was found to have an absolute fluorescence quantum yield of 62%.

Comparative Example 7

Organic EL Element Using a Host-Guest-Type Luminescent Organic Film Formed Through Vapor Deposition <Production of Element>

A substrate of a transparent 40 mm×40 mm glass plate was provided and a surface of the substrate was washed through a known washing treatment. Next, ITO was formed into a film over the surface of the substrate by a known film-forming method, followed by patterning in stripe, to thereby form an anode (electrode). Then, the surface of the ITO was cleaned through an O$_2$ plasma treatment. Next, an aqueous solution containing PEDOT and PSS was provided and coated by a spin coating method over the substrate surface on which the anode had been formed, followed by drying at 150° C. for 5 min, to thereby form a hole injection layer of PEDOT and PSS. Next, the substrate was placed in the chamber of a vacuum apparatus, with which a vacuum vapor deposition method was performed to form a 20 nm-thick host-guest-type luminescent organic film where the π-electron conjugated compound (G) was doped with the luminescent dye (H).

The doping concentration of the luminescent dye (H) in the π-electron conjugated compound (G) was 5% by mass. Next, an exciton barrier layer of BPhen and an electron transport layer of Alq$_3$ were formed in this order by a vacuum vapor deposition method. Next, LiF (film thickness: 0.5 nm) and MgAg (film thickness: 100 nm) were deposited in this order by a vacuum vapor deposition method using a metal mask, to thereby form a cathode (electrode) having a stripe pattern.

<Evaluation of Element>

Figure 10:
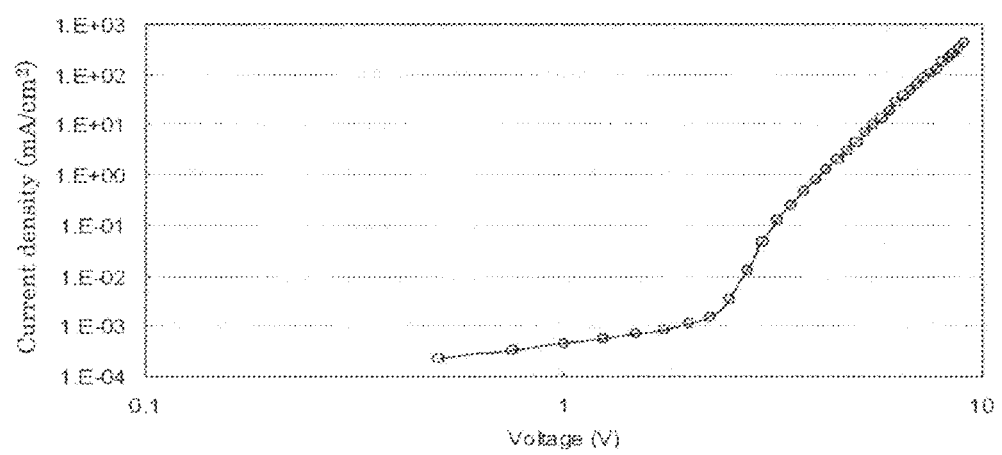
FIG. 10 is a graph of a relationship between voltage and current density of the organic EL element of Comparative Example 7 containing, as a luminescent layer, a host-guest-type luminescent organic film formed of π-electron conjugated compounds (H) and (G) by the vacuum vapor deposition method.

FIG. 10 is a graph of evaluation results of the characteristics of the organic EL element and shows dependency of current density on voltage. The current density at an applied voltage of 7 V was about 64 mA/cm$^2$.

Figure 11:
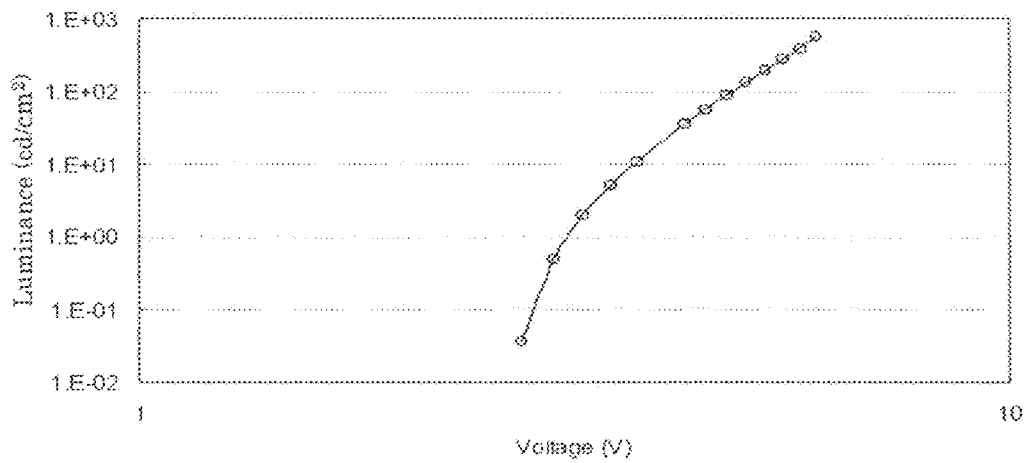
FIG. 11 is a graph of a relationship between voltage and luminance of the organic EL element of Comparative Example 7 containing, as a luminescent layer, a host-guest-type luminescent organic film formed of π-electron conjugated compounds (H) and (G) by the vacuum vapor deposition method.

FIG. 11 is a graph of evaluation results of the characteristics of the organic EL element and shows dependency of luminance on voltage. The voltage at which the organic EL element started emitting light was 2.5 V. The maximum external quantum yield was about 1.2%.

Figure 12:
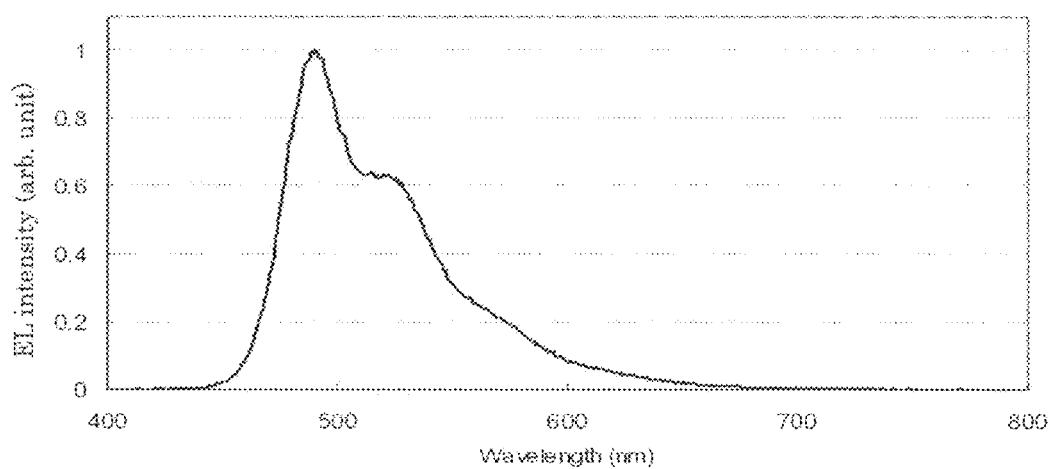
FIG. 12 is a graph of an EL spectrum at a current density of 10 mA/cm² of the organic EL element of Comparative Example 7 containing, as a luminescent layer, a host-guesttype luminescent organic film formed of π-electron conjugated compounds (H) and (G) by the vacuum vapor deposition method.

FIG. 12 is a graph of a light emission spectrum of the organic EL element at a current density of 10 mA/cm$^2$. This EL spectrum was almost the same as that of the element produced in Example 7, indicating the following:

the organic EL element produced through vapor deposition shows almost the same characteristics as that produced through the solution process in Example 7;

the luminescent organic film containing the π-electron conjugated compound obtained by applying external energy to the precursor film of the present invention formed through the printing process has light emission and semiconductor characteristics comparable or superior to those of the vapor deposition/dispersion-type thin film; and it is possible to obtain a lumnescent layer of an organic element in a simpler manner and at a lower cost than in the conventional vacuum vapor deposition methods.

Table 1 collectively shows the absolute fluorescence quantum yields of the luminescent organic films of Examples 1 to 5 and Comparative Example 1 to 5.

As is clear from the results of Examples 1 to 7 and Comparative Examples 1 to 7, the luminescent organic film controlled in doping concentration containing the π-electron conjugated compound obtained by applying external energy to the precursor film formed using the π-electron conjugated compound precursor material through the printing process shows a fluorescence quantum yield higher by at least 2% than the same π-electron conjugated compound film formed through vacuum vapor deposition. Thus, it is clear that the luminescent organic film of the present invention has excellent light emission characteristics.

TABLE 4

| | Film forming process | Absolute fluorescence quantum yield |
|---|---|---|
| Ex. 1 (Compounds A + B → Compounds C + D) | Solution coating + Elimination conversion | 28% |
| Ex. 2 (Compounds B + E → Compounds D + E) | Solution coating + Elimination conversion | 69% |
| Ex. 3 (Compounds F + E → Compounds G + E) | Solution coating + Elimination conversion | 82% |
| Ex. 4 (Compounds F + H → Compounds G + H) | Solution coating + Elimination conversion | 78% |
| Ex. 5 (Compounds F + E + H → Compounds G + E + H) | Solution coating + Elimination conversion | 92% |
| Comp. Ex. 1 (Compounds C + D) | Vacuum vapor deposition | 17% |
| Comp. Ex. 2 (Compounds D + E) | Vacuum vapor deposition | 62% |
| Comp. Ex. 3 (Compounds G + E) | Vacuum vapor deposition | 79% |
| Comp. Ex. 4 (Compounds G + H) | Vacuum vapor deposition | 66% |
| Comp. Ex. 5 (Compounds G + E + H) | Vacuum vapor deposition | 90% |

Embodiments of the present invention are as follows.

<1> A method for producing a luminescent organic film, the method including:

coating a solution containing a π-electron conjugated compound precursor A-(B)m and at least one kind of a luminescent dye, where the π-electron conjugated compound precursor A-(B)m contains a leaving substituent; and applying external stimulus to the π-electron conjugated compound precursor A-(B)m to eliminate the leaving substituent thereof, so that the π-electron conjugated compound precursor A-(B)m is converted to a π-electron conjugated compound A-(C)m and an eliminated compound X—Y as in the following reaction formula (I):

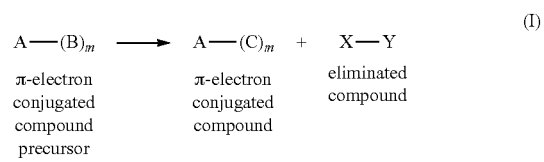

where in the reaction formula (I), A is a π-electron conjugated substituent, B is a solvent-soluble substituent containing at least a structure represented by General Formula (II), m is a natural number, C is a partial structure containing at least a structure represented by General Formula (III), the solvent-soluble substituent B in the π-electron conjugated compound precursor A-(B)m is linked via a covalent bond with an atom on the π-electron conjugated substituent A or ring-fused with a carbon atom on the π-electron conjugated substituent A, and when m is 2 or more, the solvent-soluble substituents B which are 2 or more may be identical or different and may be linked together to form a ring; and in the General Formulas (II) and (III), one of X and Y is a hydrogen atom and the other is the leaving substituent, $R_1$, $R_2$ and $R_3$, which may be identical or different, are each a hydrogen atom or a substituent and may form a ring together or may form a ring via a covalent bond with the π-electron conjugated substituent A, and when m is 2 or more, the solvent-soluble substituents B which are 2 or more may be identical or different and may be linked together to form a ring.

<2> The method of <1>, wherein the solvent-soluble substituent B of the π-electron conjugated compound precursor A-(B)m contains at least a structure represented by the following General Formula (II-1) or (II-2) or both thereof, and the partial structure C of the π-electron conjugated compound A-(C)m contains at least a structure represented by the following General Formula (III-1), (III-2) or (III-3) or any combination thereof:

-continued (III-1)

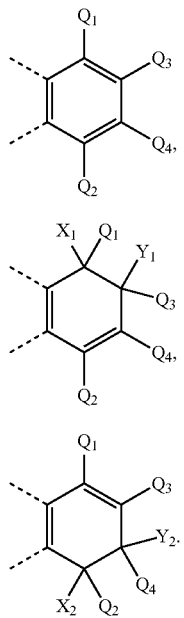

(III-2)

(III-3)

where in the General Formulas (II-1), (II-2), (III-1), (III-2) and (III-3), one of X and Y is a hydrogen atom and the other is a leaving substituent, one of $X_1$ and $Y_1$ is a hydrogen atom and the other is a leaving substituent, one of $X_2$ and $Y_2$ is a hydrogen atom and the other is a leaving substituent, the leaving substituent is a substituted or unsubstituted acyloxy group or a substituted or unsubstituted alkoxy group, and $Q_1$, $Q_2$, $Q_3$ and $Q_4$, which may be identical or different, are each a hydrogen atom or a substituent and may form a ring together or form a ring via a covalent bond with the π-electron conjugated substituent A.

<3> The method of <1> or <2>, wherein the π-electron conjugated substituent A is a substituent described in (1) or a substituent described in (2):

(1) a substituent derived from a compound selected from the group consisting of: compounds each containing an aromatic hydrocarbon ring or an aromatic heterocyclic ring or both thereof; fused polycyclic aromatic hydrocarbon ring compounds; and fused polycyclic aromatic heterocyclic ring compounds, and (2) a substituent derived from a compound where two or more of the compounds listed in (1) are linked together via a covalent bond.

<4> The method of any one of <1> to <3>, wherein the external stimulus is heating at 25° C. to 500° C.

<5> The method of any one of <1> to <4>, wherein the luminescent organic film includes the luminescent dye and the π-electron conjugated compound A-(C)m which shows light emission at a shorter wavelength side than in the luminescent dye.

<6> The method of any one of <1> to <5>, wherein a doping concentration of the luminescent dye in the luminescent organic film is determined by an amount of the luminescent dye relative to the π-electron conjugated compound precursor A-(B)m in the solution.

<7> The method of any one of <1> to <6>, wherein the luminescent dye is represented by General Formula A'-(C')m' and is contained in the solution as a luminescent dye precursor A'-(B')m' containing a leaving substituent, and wherein the leaving substituent of the luminescent dye precursor A'-(B')m' is eliminated by action of the external stimulus, so that the luminescent dye precursor A'-(B')m' is converted to the luminescent dye A'-(C')m' and an eliminated compound X'—Y" as in the following reaction formula (I'):

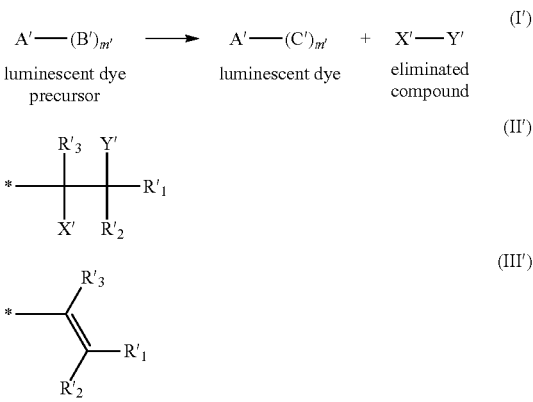

where in the reaction formula (I'), A' is π-electron conjugated substituent, B' is a solvent-soluble substituent containing at least a structure represented by General Formula (II'), m' is a natural number, C' is a partial structure containing at least a structure represented by General Formula (III'), the solvent-soluble substituent B' in the luminescent dye precursor A'-(B')m' is linked via a covalent bond with an atom on the π-electron conjugated substituent A' or ring-fused with a carbon atom on the π-electron conjugated substituent A', and when m' is 2 or more, the solvent-soluble substituents B' which are 2 or more may be identical or different and may be linked together to form a ring; and in the General Formulas (II') and (III'), one of X' and Y' is a hydrogen atom and the other is the leaving substituent, R'$_1$, R'$_2$ and R'$_3$, which may be identical or different, are each a hydrogen atom or a substituent and may form a ring together or may form a ring via a covalent bond with the π-electron conjugated substituent A', and when m' is 2 or more, the leaving substituents of the solvent-soluble substituents B' which are 2 or more may be identical or different and may be linked together to form a ring.

<8> A luminescent organic film obtained by the method of any one of <1> to <7>.

<9> An electronic device including:
the luminescent organic film of <8>.

<10> The electronic device of <9>, wherein the electronic device is an organic electroluminescence element.

This application claims priority to Japanese application No. 2011-258574, filed on Nov. 28, 2011, and to Japanese application No. 2012-194151, filed on Sep. 4, 2012, and incorporated herein by reference.

The invention claimed is:
1. A method for producing a luminescent organic film, the method comprising:
coating a solution containing a π-electron conjugated compound precursor A-(B)m and at least one kind of a luminescent dye, where the π-electron conjugated compound precursor A-(B)m contains a leaving substituent; and
applying external stimulus to the π-electron conjugated compound precursor A-(B)m to eliminate the leaving substituent thereof, so that the π-electron conjugated compound precursor A-(B)m is converted to a π-elec- tron conjugated compound A-(C)m and an eliminated compound X—Y as in the following reaction formula (I):

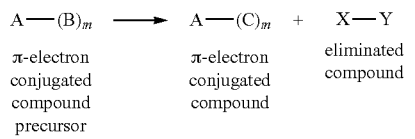

π-electron conjugated compound precursor → π-electron conjugated compound + eliminated compound

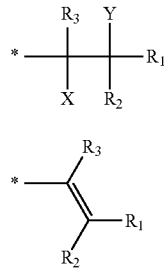

where in the reaction formula (I), A is a π-electron conjugated substituent, B is a solvent-soluble substituent containing at least a structure represented by General Formula (II), m is a natural number, C is a partial structure containing at least a structure represented by General Formula (III), the solvent-soluble substituent B in the π-electron conjugated compound precursor A-(B)m is linked via a covalent bond with an atom on the π-electron conjugated substituent A or ring-fused with a carbon atom on the π-electron conjugated substituent A, and when m is 2 or more, the solvent-soluble substituents B which are 2 or more may be identical or different and may be linked together to form a ring; and in the General Formulas (II) and (III), one of X and Y is a hydrogen atom and the other is the leaving substituent, $R_1$, $R_2$ and $R_3$, which may be identical or different, are each a hydrogen atom or a substituent and may form a ring together or may form a ring via a covalent bond with the π-electron conjugated substituent A, and when m is 2 or more, the solvent-soluble substituents B which are 2 or more may be identical or different and may be linked together to form a ring wherein the luminescent dye is represented by General Formula A'-(C')m' and is contained in the solution as a luminescent dye precursor A'-(B')m' containing a leaving substituent, and wherein the leaving substituent of the luminescent dye precursor A'-(B')m' is eliminated by action of the external stimulus, so that the luminescent dye precursor A'-(B')m' is converted to the luminescent dye A'-(C')m' and an eliminated compound X'—Y' as in the following reaction formula (I'):

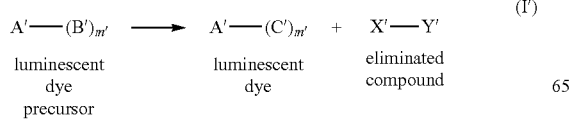

luminescent dye precursor → luminescent dye + eliminated compound

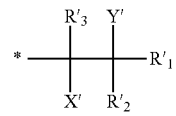

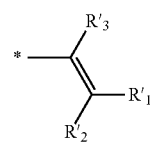

where in the reaction formula (I'), A' is a π-electron conjugated substituent, B' is a solvent-soluble substituent containing at least a structure represented by General Formula (II'), m' is a natural number, C' is a partial structure containing at least a structure represented by General Formula (III'), the solvent-soluble substituent B' in the luminescent dye precursor A'-(B')m' is linked via a covalent bond with an atom on the π-electron conjugated substituent A' or ring-fused with a carbon atom on the π-electron conjugated substituent A', and when m' is 2 or more, the solvent-soluble substituents B' which are 2 or more may be identical or different and may be linked together to form a ring; and in the General Formulas (II') and (III'), one of X' and Y' is a hydrogen atom and the other is the leaving substituent, $R'_1$, $R'_2$ and $R'_3$, which may be identical or different, are each a hydrogen atom or a substituent and may form a ring together or may form a ring via a covalent bond with the π-electron conjugated substituent A', and when m' is 2 or more, the leaving substituents of the solvent-soluble substituents B' which are 2 or more may be identical or different and may be linked together to form a ring.

2. The method of claim 1, wherein the solvent-soluble substituent B of the π-electron conjugated compound precursor A-(B)m contains at least a structure represented by the following General Formula (II-1) or (II-2) or both thereof, and the partial structure C of the π-electron conjugated compound A-(C)m contains at least a structure represented by the following General Formula (III-1), (III-2) or (III-3) or any combination thereof:

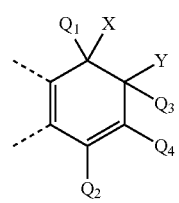

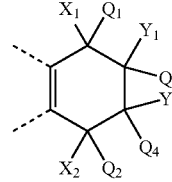

-continued

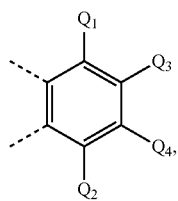

(III-1)

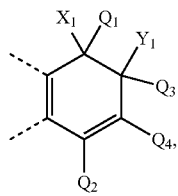

(III-2)

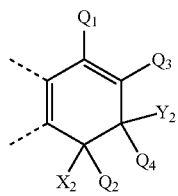

(III-3)

where in the General Formulas (II-1), (II-2), (III-1), (III-2) and (III-3), one of X and Y is a hydrogen atom and the other is a leaving substituent, one of $X_1$ and $Y_1$ is a hydrogen atom and the other is a leaving substituent, one of $X_2$ and $Y_2$ is a hydrogen atom and the other is a leaving substituent, the leaving substituent is a substituted or unsubstituted acyloxy group or a substituted or unsubstituted alkoxy group, and $Q_1, Q_2, Q_3$ and $Q_4$, which may be identical or different, are each a hydrogen atom or a substituent and may form a ring together or form a ring via a covalent bond with the π-electron conjugated substituent A.

3. The method of claim 1, wherein the π-electron conjugated substituent A is a substituent described in (1) or a substituent described in (2):

(1) a substituent derived from a compound selected from the group consisting of: compounds each containing an aromatic hydrocarbon ring or an aromatic heterocyclic ring or both thereof; fused polycyclic aromatic hydrocarbon ring compounds; and fused polycyclic aromatic heterocyclic ring compounds, and (2) a substituent derived from a compound where two or more of the compounds listed in (1) are linked together via a covalent bond.

4. The method of claim 1, wherein the external stimulus is heating at 25° C. to 500° C.

5. The method of claim 1, wherein the luminescent organic film includes the luminescent dye and the π-electron conjugated compound A-(C), wherein said π-electron conjugated compound A-(C) shows light emission at a shorter wavelength side than in the luminescent dye.

6. The method of claim 1, wherein a doping concentration of the luminescent dye in the luminescent organic film is determined by an amount of the luminescent dye relative to the π-electron conjugated compound precursor A-(B)m in the solution.

* * * * *